(12) United States Patent
Kojima et al.

(10) Patent No.: US 7,709,073 B2
(45) Date of Patent: May 4, 2010

(54) INFORMATION RECORDING MEDIUM

(75) Inventors: Rie Kojima, Kadoma (JP); Noboru Yamada, Hirakata (JP)

(73) Assignee: Panasonic Corporation, Osaka (JP)

( * ) Notice: Subject to any disclaimer, the term of this patent is extended or adjusted under 35 U.S.C. 154(b) by 976 days.

(21) Appl. No.: 10/573,174

(22) PCT Filed: May 19, 2005

(86) PCT No.: PCT/JP2005/009163

§ 371 (c)(1),
(2), (4) Date: Mar. 23, 2006

(87) PCT Pub. No.: WO2006/011285

PCT Pub. Date: Feb. 2, 2006

(65) Prior Publication Data

US 2007/0003730 A1    Jan. 4, 2007

(30) Foreign Application Priority Data

Jul. 28, 2004 (JP) ............................. 2004-219731

(51) Int. Cl.
*B32B 3/02* (2006.01)
(52) U.S. Cl. ............... 428/64.1; 428/64.4; 428/64.5; 430/270.13
(58) Field of Classification Search ........................ None
See application file for complete search history.

(56) References Cited

U.S. PATENT DOCUMENTS 6,416,837 B1 * 7/2002 Kojima et al. ............... 428/64.1
6,858,277 B1 * 2/2005 Yamada et al. ............... 428/64.1
2002/0024913 A1   2/2002 Kojima et al.
2003/0138669 A1   7/2003 Kojima et al.
2003/0186164 A1 * 10/2003 Miyamoto et al. ..... 430/270.13
2003/0190447 A1  10/2003 Kojima et al.
2005/0058941 A1   3/2005 Yamada et al.
2005/0119123 A1   6/2005 Yamada et al.
2006/0013114 A1   1/2006 Ohkubo

FOREIGN PATENT DOCUMENTS

| EP | 0 355 865 | 2/1990 |
| EP | 1 132 904 | 9/2001 |
| EP | 1 170 147 | 1/2002 |

(Continued)

OTHER PUBLICATIONS

Supplementary European Search Report (in English language) issued May 30, 2008.
Japanese Office Action issued Mar. 3, 2009 in Japanese Patent Application No. 2006-528400.

*Primary Examiner*—Elizabeth Mulvaney
(74) *Attorney, Agent, or Firm*—Wenderoth, Lind and Ponack, L.L.P.

(57) ABSTRACT

In an information recording medium on and from which information is recorded and reproduced by applying light or electric energy, a recording layer which generates reversible phase change is formed so as to include a material containing Ge, Bi, Te and an element "M" which material is expressed with $(GeTe)_x[(M_2Te_3)_y(Bi_2Te_3)_{1-y}]_{100-x}$ (mol %) wherein "M" represents at least one element selected from Al, Ga and In, and "x" and "y" satisfy $80 \leq x < 100$ and $0 < y \leq 0.9$, whereby the medium is obtained which ensures a high erasability and an excellent archival characteristic at a high linear velocity and in a wide range of linear velocities.

30 Claims, 6 Drawing Sheets

FOREIGN PATENT DOCUMENTS

| | | |
|---|---|---|
| EP | 1 172 811 | 1/2002 |
| EP | 1 351 229 | 10/2003 |
| JP | 1-251335 | 10/1989 |
| JP | 2-43088 | 2/1990 |
| JP | 2-147288 | 6/1990 |
| JP | 3-121888 | 5/1991 |
| JP | 2584741 | 2/1997 |
| JP | 2001-266409 | 9/2001 |
| JP | 2001-322357 | 11/2001 |
| JP | 2002-293025 | 10/2002 |
| JP | 2003-16687 | 1/2003 |
| JP | 2003-233931 | 8/2003 |
| JP | 2003-341241 | 12/2003 |
| JP | 2005-205762 | 8/2005 |
| JP | 2006-51803 | 2/2006 |
| WO | 00/54982 | 9/2000 |

\* cited by examiner

INFORMATION RECORDING MEDIUM

TECHNICAL FIELD

This invention relates to an information recording medium which is used for optically or electrically recording, erasing, overwriting and/or reproducing information.

BACKGROUND OF THE INVENTION

The inventors developed 4.7 GB DVD-RAM (referred as "DVD-RAM" hereinafter) which is a large capacity overwritable phase-change type information recording medium and can be used as a datafile and an image file. Further, a 2×-speed DVD-RAM and a 3×-speed DVD-RAM have been already commercialized.

One example of materials for a recording layer which is employed in a DVD-RAM is Ge—Sn—Sb—Te (see, for example, Japanese Patent Kokai (Laid-Open) Publication No. 2001-322357(A)). Ge—Sn—Sb—Te has a crystallization speed higher than that of a conventional high-crystallization-speed material such as Ge—Sb—Te (see, for example, Japanese Patent Publication No. 2584741(B)).

In order to realize the large-capacity information recording medium of 4.7 GB, it is necessary to thin the thickness of the recording layer to reduce a heat capacity and to escape heat absorbed by the recording layer in a direction of film thickness, in the design of the recording layer. Thereby, the heated recording layer is easy to be cooled rapidly and a small recording mark can be formed well (that is, an amorphous phase is easily formed), whereby a higher-density is achieved in the medium. Further, as the recording layer has been thinner, a material with a crystallization speed higher than that of Ge—Sb—Te has been required, and then Ge—Sn—Sb—Te has been developed.

Ge—Sn—Sb—Te is a material which is obtained by adding SnTe to a two-component system material GeTe—$Sb_2Te_3$. SnTe is a material whose crystallinity is very strong such that it is crystal at a room temperature even in a form of thin film. Further, since SnTe is a telluride and its crystal structure is the same as that of GeTe, that is, a rock-salt structure, SnTe is added to GeTe as if it substitutes for a part of GeTe. Therefore, Ge—Sn—Sb—Te can reveal a high crystallization speed without phase separation due to repeated recording.

As described above, the 2×-speed and 3×-speed mediums are now commercialized. The 3×-speed medium generally has 2×-speed compatibility. That is, the 3×-speed medium means a medium on or from which information can be recorded, erased and overwritten at either a double speed or a triple speed and whose reliability is ensured for either speed. A ratio of a linear recording triple speed to linear recording double speed is 1.5. Generally, the speed is changed from the double speed to the triple speed (and vice versa) by changing a rotation number of the medium. Further, in addition to a CLV mode wherein the recording speed is constant, there is currently employed a mode wherein the rotation number is constant during recording (which is referred as a "CAV" (constant angular velocity) mode) as a recording mode. When the CAV mode is employed, the linear velocity at the outermost is 2.4 times that at the innermost in the DVD-RAV with a diameter of 12 cm.

Recently, data is required to be processed at a higher speed using a medium for a datafile and a high-speed dubbing is required to be able to be conducted using a medium for an image file. Considering these requirements, development of a higher-speed DVD, that is, a DVD-RAM on which information is recorded at a higher speed is indispensable. Specifically, a 16×-speed DVD-RAM is required to be developed. The 16× speed corresponds to a linear velocity at the outermost of the medium that is rotated at a motor revolution of about 11000 rev/min by a drive. When the recording mode is the CAV mode, the linear velocity at the innermost becomes over 6× speed whereas the linear velocity at the outermost is 16× speed. Therefore, the 16×-speed medium should be a medium on or from which information is recorded, erased and overwritten at either 6× speed or 16× speed and which can ensure its reliability at either speed.

In order to adapt to 16× speed which is several times the linear velocity which has been employed conventionally, the crystallization speed of the material for the recording layer should be increased dramatically. Therefore, a Ge—Sn—Sb—Te-based material wherein the proportion of SnTe is increased, or a Ge—Bi—Te-based material wherein GeTe and $Bi_2Te_3$ are mixed (see, for example, Japanese Patent Publication No. 2574325) is proposed as an ultrahigh-crystallization-speed material.

DISCLOSURE OF INVENTION

Problems to be Solved by Invention

For the phase-change type information recording medium, information is recorded, erased and overwritten using a reversible phase change between an amorphous phase (recording) and a crystalline phase (erasing). Accordingly, the crystallization speed is adjusted by changing the composition of the recording layer so that the information is recorded at a predetermined velocity. When the linear velocity is fast, the crystallization speed is made faster, and when the linear velocity is slow, the crystallization speed is made slow. In general, as the crystallization speed is faster, information is erased more easily, but the stability of the recorded mark (amorphous phase) tends to be deteriorated and the reliability of the medium tends to be reduced. On the other hand, as the crystallization speed is slower, information is recorded more easily, but the stability of the amorphous phase is too high so that the information is difficult to be erased, which also causes the problem in reliability. Further, the linear velocity is changed within a predetermined range while information is recorded on one medium, the medium is required to be constructed so that the information is recorded and erased at both of a high linear velocity and a low linear velocity. Therefore, as the range of the linear velocity which is used for recording is wider, problem as to reliability tends to occur.

In the case where Ge—Sn—Sb—Te-based material is used which has been practically used for the 2×-speed medium and the 3×-speed medium, the concentration of SnTe should be higher in order to obtain a 16×-speed medium. In that case, the concentration of Ge is reduced because SnTe substitutes for GeTe. As a result, an optical change of the recording layer becomes small, which contributes to a problem that signal quality is reduced and a problem that the stability of amorphous phase is not ensured because the crystallization temperature is lowered. Further, the Ge—Bi—Te-based material has a crystallization speed which can sufficiently adapt to 16× speed, but it has a problem that even the stability of signals recorded at 16× speed (that is, the amorphous phase formed at 16× speed) is not ensured. As described above, the Ge—Sn—Sb—Te-based material and the Ge—Bi—Te-based material has not yet given a medium which is adapted to recordation at a high linear velocity and in a wide range of linear velocities.

The present invention solves the problems as described above, and provides a recording material which has a high crystallization speed and stability of an amorphous phase. Further, the object of the present invention is to provide, by applying this recording material, an information recording medium which has a high erasability and excellent archival characteristic at a high linear velocity and over a wide range of linear velocities irrespective of the recording wavelength.

Means to Solve the Problems

An information recording medium of the present invention is an information recording medium including a recording layer which can generate a reversible phase change, characterized in that the recording layer contains a Ge—Bi—Te-M-based material which contains Ge, Bi, Te and an element "M" and is expressed with a following formula (1):

$$Ge_a Bi_b Te_d M_{100-a-b-d} \text{ (atomic \%)} \tag{1}$$

wherein "M" represents at least one element selected from Al, Ga and In, and "a", "b" and "d" satisfy $25 \leq a \leq 60$, $0 < b \leq 18$, $35 \leq d \leq 55$, and $82 \leq a+b+d < 100$.

Herein, "atomic %" means that the formula (1) is a compositional formula of which basis (i.e. 100%) is the sum of the numbers of "Ge" atoms, "Bi" atoms, "Te" atoms and "M" atoms. In the following formulae, the indication of "atomic %" is used for showing the same meaning. Further, the formula (1) is expressed by counting only the numbers of "Ge" atoms, "Bi" atoms, "Te" atoms and "M" atoms. Therefore, the recording layer may contain another component(s) (such as oxygen, hydrogen, argon, nitrogen and carbon and so on).

The information recording medium of the present invention is a medium on and from which information is recorded and reproduced by irradiation of light or by application of an electric energy. The present invention is applied to various recording mediums such as a medium on which information is repeatedly recorded (that is, an overwritable medium) and a medium on which information is recorded only once (that is, a write-once medium). Further, in general, irradiation of light is carried out by irradiation of a laser light (that is, laser beam), and application of an electric energy is carried out by applying a voltage to a recording layer.

The information recording medium of the present invention is characterized in that the recording layer includes a material containing, in addition to Ge, Bi and Te, at least one element selected from Al, Ga and In (which element is indicated by "M" in this specification). Because the Ge—Bi—Te-based material contains the at least one element selected from Al, Ga and In at a predetermined proportion, the crystallization temperature of the Ge—Bi—Te-based material can be made higher and a stable signal can be formed.

Each element may exist as any compound in the Ge—Bi—Te-M-based material expressed with the formula (1). The reason for identifying the material with this formula is that it is difficult to determine the composition of compounds upon analyzing the composition of a layer formed into a thin film and actually only an elementary composition (that is, a ratio of each element) is often determined. In the material expressed with the formula (1), it is considered that Ge exists together with Te as GeTe, Bi exists together with Te as $Bi_2 Te_3$ and M exists together with Te as $M_2 Te_3$.

In the information recording medium of the present invention, the Ge—Bi—Te-M-based material may be a material which is expressed with a following formula (3):

$$(GeTe)_x [(M_2 Te_3)_y (Bi_2 Te_3)_{1-y}]_{100-x} \text{ (mol \%)} \tag{3}$$

wherein "M" represents at least one element selected from Al, Ga and In, and "x" and "y" satisfy $80 \leq x < 100$ and $0 < y \leq 0.9$.

The formula (3) represents preferable proportions of three compounds when the Ge—Bi—Te-M-based material is a mixture of GeTe, $M_2 Te_3$ and $Bi_2 Te_3$. Herein "mol %" means that the formula (3) is a composition formula of which basis (i.e. 100%) is the sum of the numbers of compounds. In the following formulae, the indication of "mol %" is used for showing the same meaning.

In the formula (3), "x" and "y" are appropriately selected depending on a wavelength of a laser beam used for recording and erasing. For example, the material that is contained in the recording layer of the medium on/from which information is recorded/reproduced with a laser beam having a wavelength of 650 nm-670 nm (for example, a DVD-RAM) preferably satisfies $80 \leq x \leq 91$ and $y \leq 0.5$. The material that is contained in the recording layer of the medium on/from which information is recorded/reproduced with a laser beam having a wavelength of 395 nm-415 nm (for example, a Blue-ray Disc) preferably satisfies $85 \leq x \leq 98$ and $y \leq 0.8$.

In the recording medium of the present invention, the recording layer may further contain Sn and may be one which contains a Ge—Sn—Bi—Te-M-based material which is expressed with a following formula (2):

$$Ge_a Sn_f Bi_b Te_d M_{100-a-b-d-f} \text{ (atomic \%)} \tag{2}$$

wherein "M" represents at least one element selected from Al, Ga and In, "a", "b", "d" and "f" satisfy $25 \leq a \leq 60$, $0 < b \leq 18$, $35 \leq d \leq 55$, $0 < f \leq 15$, $82 \leq a+b+d < 100$, and $82 < a+b+d+f < 100$. In the formula (2), each element may exist as any compound. The reason for identifying the material with this formula is the same as that for employing the formula (1). In the material expressed with the formula (2), it is considered that Sn exists together with Te as SnTe. Sn is a material which has a very strong crystallinity such that it has a crystallization temperature not higher than a room temperature in a form of thin film and that it is crystal at the room temperature. Therefore, addition of SnTe makes it possible to fine adjust the crystallization speed of the recording layer containing the Ge—Bi—Te-M-based material.

The Ge—Sn—Bi—Te-M-based material may be a material expressed with a following formula (4):

$$[(SnTe)_z (GeTe)_{1-z}]_x [(M_2 Te_3)_y (Bi_2 Te_3)_{1-y}]_{100-x} \text{ (mol \%)} \tag{4}$$

wherein "M" represents at least one element selected from Al, Ga and In, and x, y and z satisfy $80 \leq x < 100$, $0 < y \leq 0.9$ and $0 < z \leq 0.3$. The formula (4) represents preferable ratios of four compounds when the Ge—Sn—Bi—Te-M-based material is a mixture of GeTe, SnTe, $M_2 Te_3$ and $Bi_2 Te_3$.

Also in the formula (4), "x" is appropriately selected depending on a wavelength of a laser beam used for recording and reproduction. For example, "x" preferably satisfies $80 \leq x \leq 91$ in the material contained in the recording layer of the medium on/from which information is recorded/reproduced with a laser beam having a wavelength of 650 nm-670 nm (for example, a DVD-RAM). "x" preferably satisfies $85 \leq x \leq 98$ in the material contained in the recording layer of the medium on/from which information is recorded/reproduced with a laser beam having a wavelength of 395 nm-415 nm (for example, a Blue-ray Disc).

The information recording medium of the present invention may be provided as an information recording medium which includes two or more information layers, at least one of the information layers containing the Ge—Bi—Te-M-based material expressed with the formula (1). The recording layer containing the Ge—Bi—Te-M-based material may be one containing the Ge—Sn—Bi—Te-M-based material expressed with the formula (2) which is obtained by adding Sn to the Ge—Bi—Te-M-based material. This information recording medium allows the information to be recorded thereon at a high speed because of the recording layer containing the Ge—Bi—Te-M-based material or the Ge—Sn—Bi—Te-M-based material, and this medium has high reliability (specifically archival characteristic).

Specifically, the information recording medium of the present invention is provided as a medium which includes at least a substrate, a first dielectric layer, a recording containing the Ge—Bi—Te-M-based material or the Ge—Sn—Bi—Te-M-based material, a second dielectric layer, an optical compensation layer and a reflective layer, wherein these layers are formed in this order on the substrate. Information is recorded on and reproduced from this medium by applying light. In this specification, the "first dielectric layer" is a dielectric layer which exists at a position closer to an incident light and the "second dielectric layer" is a dielectric layer which exists at a position further from the incident light. In other words, the incident light passes through the first dielectric layer and the recording layer, and then reaches the second dielectric layer. In this specification, when the information recording medium contains two or more layers having the same function, "first" "second" or "third" . . . is given to the beginning of the name of each layer in the order of the layer which is closer to the incident laser beam.

This information recording medium is one on/from which information is recorded/reproduced by applying a laser beam having a wavelength of 650 nm to 670 nm or a laser beam having a wavelength of 395 nm to 415 nm from the substrate side. Further, in this information recording medium, a thickness of the first dielectric layer is preferably within a range of 100 nm to 180 nm and a thickness of the second dielectric layer 2 is preferably within a range of 20 nm to 60 nm.

Alternatively, the information recording medium of the present invention is provided as a medium which includes at least a substrate, a reflective layer, a second dielectric layer, a recording layer containing the Ge—Bi—Te-M-based material and a first dielectric layer, wherein these layers are formed in this order. Information is recorded on and reproduced from also this medium by applying light. This medium is, for example, a medium on/from which information is recorded/reproduced by applying a laser beam having a wavelength of 395 nm to 415 nm or a laser beam having a wavelength of 650 nm to 670 nm from the side opposite to the substrate. Further, in this information recording medium, a thickness of the first dielectric layer is preferably within a range of 10 nm to 100 nm and a thickness of the second dielectric layer is preferably within a range of 3 nm to 50 nm.

The present invention also provides a method for producing an information recording medium of the present invention, which includes a step of forming a recording layer containing the Ge—Bi—Te-M-based material by a sputtering method. The sputtering method makes it possible to form the recording layer having a desired composition by adjusting a composition of the sputtering target appropriately. Further, when the sputtering target is a target containing Ge, Bi, Te, M and Sn, a recording layer containing the Ge—Sn—Bi—Te-M-based material-based material can be formed.

The present invention further provides an apparatus for recording information on and reproducing information from an information recording medium of the present invention which includes a spindle motor which rotates the information recording medium having a recording layer, an optical head provided with a semiconductor laser which emits a laser beam, and an objective lens which focus the laser beam on the recording layer. In the recording and reproducing apparatus for the information recording medium of the present invention, the spindle motor which can rotate, for example, at 10000 rev/min, may be used, whereby information can be recorded on a medium having a 12 cm diameter at 16× speed. The optical head in the recording/reproduction apparatus of the present invention may be one which emits a laser beam having a wavelength of 650 nm to 670 nm or one which emits a laser beam having a wavelength of 395 nm to 415 nm. Alternatively, both optical heads may be provided.

Effect of Invention

The information recording medium of the present invention can achieve high erasability and excellent archival characteristic even when information is recorded on, for example, a DVD-RAM at a high speed which is selected from a wide range of linear velocities ranging from 16× speed to 6× speed. Further, the present invention can provide a large-capacity and high-speed recordable information recording medium which has high erasability at a high linear velocity and excellent archival characteristic of signals recorded at a low linear velocity irrespective of a recording density, a capacity and a recording wavelength of the medium.

EXPLANATION OF LETTERS OR NUMERALS

Figure 1:
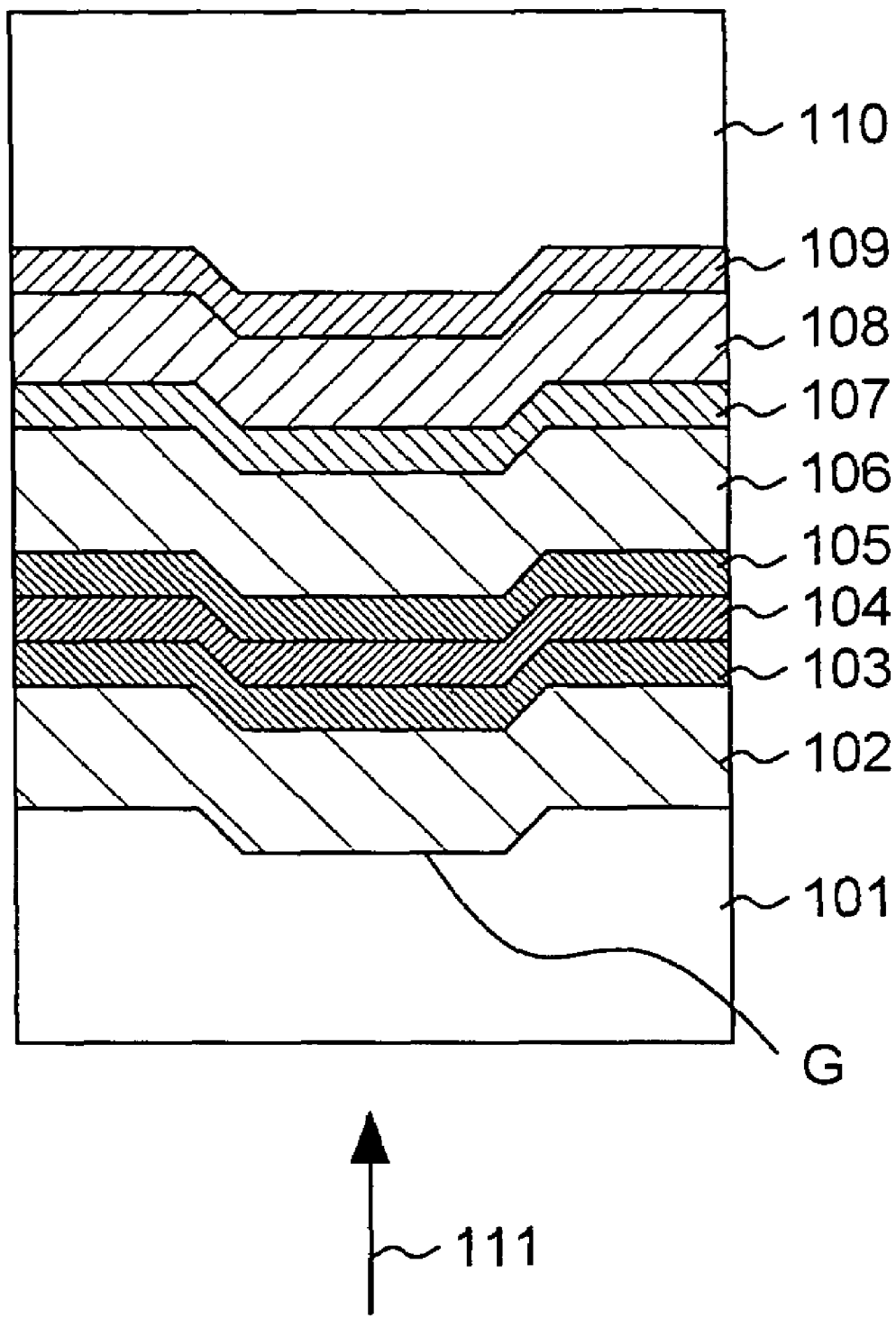
FIG. 1 is a fragmentary sectional view which shows an example of an information recording medium of the present invention.

50, 100, 200, 300, 400 information recording medium
35, 101, 208, 315, 401 substrate
102, 202, 302 first dielectric layer
106, 206, 305 second dielectric layer
307 third dielectric layer
309 fourth dielectric layer
313 fifth dielectric layer
103, 203, 303 first interface layer
105, 205, 310 second interface layer
312 third interface layer
104, 204, 403 recording layer
304 first recording layer
311 second recording layer
107 optical compensation layer
108, 207 reflective layer
306 first reflective layer
314 second reflective layer
109 adhesive layer
110 dummy substrate
308 intermediate layer 201, 301 cover layer
317 first information layer
316 second information layer
111, 209, 318 laser beam
402 lower electrode
404 upper electrode
405 pulse producing part
406 resistance measuring device
407, 408 switch
409 application part
410 judgment part
411 electrically recording/reproducing device
52, 111, 209, 318 laser beam
32 exhaust port
33 sputtering gas inlet
34 substrate holder (anode)
36 sputtering target (cathode)
37 target electrode
38 electric power supply
39 sputtering chamber
51 spindle motor
53 semiconductor laser
54 optical head
55 objective lens

DETAILED DESCRIPTION OF THE PREFERRED EMBODIMENTS

Hereafter, embodiments of the present invention are described with reference to the accompanying drawings. The following embodiments are illustrative, and the present invention is not limited to the following embodiments.

Embodiment 1

As Embodiment 1 of this invention, an example of an optical information recording medium on and from which information is recorded and reproduced by a laser beam, is described. FIG. 1 shows a partial cross section of the optical information recording medium.

The information recording medium 100 shown in FIG. 1 has a construction in which a first dielectric layer 102 is formed on one surface of a substrate 101, a first interface layer 103 is formed on a surface of the first dielectric layer 102, a recording layer 104 is formed on a surface of the first interface layer 103, a second interface layer 105 is formed on a surface of a recording layer 104, a second dielectric layer 106 is formed on a surface of the second interface layer 105, an optical compensation layer 107 is formed on a surface of the second dielectric layer 106, a reflective layer 108 is formed on a surface of the optical compensation layer 107 and a dummy substrate 110 is bonded with an adhesive layer 109.

The information recording medium of this construction can be used as a DVD-RAM on and from which information is recorded and reproduced by a laser beam with a wavelength of about 660 nm in a red region. A laser beam 111 enters from the substrate 101 side into the information recording medium 100 of this construction, and conducts the record and reproduction of information.

The information recording medium of the present invention is characterized in that the recording layer is a layer containing a particular material. Therefore, the recording layer 104 is firstly described.

The recording layer 104 generates reversible phase change and contains a material containing Ge, Bi, Te and an element "M" which material has a composition expressed with a following formula (3)

$$(GeTe)_x[(M_2Te_3)_y(Bi_2Te_3)_{1-y}]_{100-x} \text{ (mol \%)} \quad (3)$$

wherein "M" represents at least one element selected from Al, Ga and In, and "x" and "y" satisfy $80 \leq x < 100$ and $0 < y \leq 0.9$. The recording layer has a high crystallization speed and an excellent stability of an amorphous phase because it contains GeTe, $M_2Te_3$, and $Bi_2Te_3$.

GeTe is a material which has a large optical change. The recording layer with a large optical change can be obtained when it contains GeTe in an amount of 80 mol % or more. As the optical change is larger, a detected amplitude of recorded signal becomes larger. The optical change means a difference between a complex index of refraction of a crystal phase (nc−ikc) and a complex index of refraction of an amorphous phase (na−ika), $\Delta n$ and $\Delta k$. Herein, "nc" is a refractive index of the crystal phase, "kc" is an extinction coefficient of the crystal phase, "na" is a refractive index of the amorphous phase, "ka" is an extinction coefficient of the amorphous phase, $\Delta n = nc - na$ and $\Delta k = kc - ka$. Each of "nc", "kc", "na" and "ka" depends on a wavelength of light. As the wavelength is shorter, particularly $\Delta k$ becomes smaller. Since much GeTe having a large optical change is contained in the recording layer of the information recording medium of the present invention, excellent signal quality is obtained when information is recorded using a laser beam with a wavelength of 660 nm which is employed for recording on a DVD-RAM and a laser beam with a shorter wavelength of 405 nm which is employed for recording on a Blu-ray Disc. When the recording layer, however, is formed from only GeTe, the crystallization speed is reduced and overwrite cycle-ability is deteriorated. For this reason, the proportion of GeTe is required to be less than 100 mol %, and preferably less than 98 mol %.

For example, with respect to a material wherein "M" is In, x=89 and y=0.1, that is, which is expressed with $(GeTe)_{89}[(In_2Te_3)_{0.1}(Bi_2Te_3)_{0.9}]_{11}$ (mol %), nc=1.8, na=3.0, kc=3.3, and ka=2.4, and $\Delta n = -1.2$ and $\Delta k = 0.9$ at a wavelength of 405 nm. With respect to a material wherein "M" is In, x=96 and y=0.1, that is, which is expressed with $(GeTe)_{96}[(In_2Te_3)_{0.1}(Bi_2Te_3)_{0.9}]_4$ (mol %), nc=1.9, na=3.1, kc=3.6, and ka=2.3, and $\Delta n = -1.2$ and $\Delta k = 1.3$ at a wavelength of 405 nm. As shown herein, as the value of "x" is larger, that is, the proportion of GeTe is greater, $\Delta k$ is larger and the larger optical change is obtained.

$Bi_2Te_3$ is a material whose crystallinity is very strong such that it has a crystallization temperature below a room temperature in a form of thin film and it is crystal at the room temperature. The GeTe—$Bi_2Te_3$ system is a stable compound system wherein compounds of stoichiometric composition exist and phase separation does not occur, similarly to the GeTe—$Sb_2Te_3$ system. Further it can be said that GeTe—$Bi_2Te_3$ system is more easily crystallized than the GeTe—$Sb_2Te_3$ system considering the fact that a $Sb_2Te_3$ film has a crystallization temperature of about 150° C.

It is preferable that $M_2Te_3$ is at least one of $Al_2Te_3$, $Ga_2Te_3$, and $In_2Te_3$. $M_2Te_3$ is a telluride whose valence is the same as that of $Bi_2Te_3$ and has a high melting point. $M_2Te_3$ serves to raise the crystallization temperature of the system by being added to the GeTe—$Bi_2Te_3$ system. Since the valence of $M_2Te_3$ is the same as that of $Bi_2Te_3$, the addition of $M_2Te_3$ to the material can be regarded as substitution of $M_2Te_3$ for a part of $Bi_2Te_3$ in the GeTe—$Bi_2Te_3$ system. Therefore, the addition of $M_2Te_3$ to the GeTe—$Bi_2Te_3$ system can raise the crystallization temperature without causing the phase separation due to repeated recording. Further, since $M_2Te_3$ may be added without changing the proportion of GeTe, the optical change of the GeTe—$Bi_2Te_3$-$M_2Te_3$-based material is kept large. $M_2Te_3$ raises the crystallization temperature, whereby the stability of amorphous phase can be achieved which cannot be achieved in the GeTe—$Bi_2Te_3$-based material. Specifically, even when the information recording medium with signals recorded is left under a high temperature of 80° C., signals do not deteriorate. When an added amount of $M_2Te_3$ is too large, the crystallization speed of GeTe-$M_2Te_3$—$Bi_2Te_3$-based material becomes slow. Therefore, it is preferable to optimize the added amount of $M_2Te_3$ with respect to the value of "x." For this reason, "y" is equal to or less than 0.9 in the formula. Further, when $M_2Te_3$ is added even in a very small amount, it raises the crystallization temperature. Therefore, "y" may be, for example, about 0.03.

The material expressed with the formula (3) may be expressed with the following formula (1):

$$Ge_aBi_bTe_dM_{100-a-b-d} \text{ (atomic \%)} \tag{1}$$

wherein "M" represents at least one element selected from Al, Ga and In, and "a", "b" and "d" satisfy $25 \leq a \leq 60$, $0 < b \leq 18$, $35 \leq d \leq 55$, and $82 \leq a+b+d < 100$.

For example, when "M" is In, x=80 and y=0.5, the material may be expressed with $Ge_{30.8}Bi_{7.7}Te_{53.8}In_{7.7}$ (atomic %). The proportion of Ge and Bi may be increased while the proportion of Te may be reduced by just that much in order to further raise the crystallization temperature without changing the crystallization speed. In that case, the obtained material can be expressed with the formula (1), but it cannot be expressed with the formula (3). In the formula (1), the ranges of "a", "b" and "d" are determined so that such material can be covered by the formula (1). The proportion of Ge is preferably equal to or less than 60 atomic % (that is, $a \leq 60$) since when the proportion of Ge is too large, a melting point of the material becomes high to require a high laser power.

In the case where the medium is used as a DVD-RAM (recording wavelength: about 660 nm), "x" and "y" preferably satisfy $80 \leq x \leq 91$ and "y" is preferably not more than 0.5 when "x" is within this range in the formula (3). In the case where the medium is used as the Blu-ray Disc (recording wavelength: about 405 nm), it is preferable that the optical change of the material is made larger by increasing GeTe compared with the case where the medium is used as the DVD-RAM. Specifically, "x" preferably satisfies $85 \leq x \leq 98$ in the material of the recording layer of the Blu-ray Disc. When the "x" is within this range, "y" is preferably not more than 0.8. The crystallization temperature is 170° C. in the case of x=89 and y=0 (without adding $M_2Te_3$). On the other hand, when $In_2Te_3$ is added as $M_2Te_3$, the crystallization temperature becomes 180° C. in the case of y=0.1, and 190° C. in the case of y=0.2. Similarly, when $Ga_2Te_3$ is added as $M_2Te_3$, the crystallization temperature becomes 180° C. in the case of y=0.1 and 190° C. in the case of y=0.2.

The recording layer 104 may further contain Sn. In that case, the recording layer 104 preferably contains a material expressed with the following formula (4):

$$[(SnTe)_z(GeTe)_{1-z}]_x[(M_2Te_3)_y(Bi_2Te_3)_{1-y}]_{100-x} \text{ (mol \%)} \tag{4}$$

wherein "M" represents at least one element selected from Al, Ga and In, and x, y and z satisfy $80 \leq x < 100$, $0 < y \leq 0.9$, $0 < z \leq 0.3$.

The recording layer containing SnTe, GeTe, $M_2Te_3$, and $Bi_2Te_3$ has a high crystallization speed and is excellent in stability of amorphous phase. SnTe is a material whose crystallinity is very strong such that it has a crystallization temperature below a room temperature in a form of thin film and it is crystal at the room temperature. Further, SnTe is a telluride whose valence and crystal structure are the same as those of GeTe and has a high melting point. In the system wherein $M_2Te_3$ substitutes for a part of $Bi_2Te_3$ by varying the value of "y" in the formula (3), SnTe serves to fine adjust the crystallization speed so that a desired crystallization speed matching to a predetermined linear velocity is obtained. The material wherein SnTe is added can be regarded as a material wherein a part of GeTe in the GeTe-$M_2Te_3$—$Bi_2Te_3$-based material is substituted, since SnTe and GeTe have the same valence and the same crystal structure. Therefore, the addition of SnTe does not generate phase separation due to repeated recording. The amount "z" of SnTe which substitutes for GeTe is preferably not more than 0.3 because, if the added amount of SnTe is too large, the proportion of GeTe is reduced to make the optical change of the material small. When SnTe is contained, more $M_2Te_3$ may be added. Therefore, in the case where GeTe—SnTe-$M_2Te_3$—$Bi_2Te_3$-based material is used for the recording layer of the DVD-RAM or the Blu-ray Disc, the value of "x" is preferably within the range as described above, a preferable range of "y" is not limited.

The thickness of the recording layer 104 is preferably in a range of 5 nm to 12 nm, and more preferably in a range of 6 nm to 9 nm. If the thickness of the recording layer is small, an optical reflectance Rc of the information recording medium 100 where the recording layer 104 is a crystal phase is reduced, while an optical reflectance Ra of the information recording medium 100 where the recording layer 104 is an amorphous phase is increased, whereby a reflectance ratio is small in the optical design. On the other hand, when the thickness is large, a heat capacitance is increased whereby recording sensitivity deteriorates.

Next, elements other than the recording layer is described. The substrate 101 is discal and transparent and its surface is smooth. As material for the substrate, a resin such as a polycarbonate, amorphous polyolefin or polymethylmethacrylate (PMMA), or glass can be employed. Considering moldability, price and mechanical strength, a polycarbonate resin is preferably used. In the illustrated embodiment, a substrate 101 with a thickness of 0.6 mm and a diameter of 120 mm is preferably used. A guide groove for guiding a laser beam may be formed in the surface of the substrate 101 where the dielectric layer, the recording layer and so on are formed. In the case where the guide groove is formed in the substrate, the surface which is located closer to the laser beam 111 is referred to as a "groove surface" for convenience, whereas the surface which is located away from the laser beam 111 is referred to as a "land surface" for convenience in this specification. For example, when the medium is used as the DVD-RAM, a difference in level between the groove surface and the land surface is preferably in a range of 40 nm to 60 nm. In the DVD-RAM, a distance between the groove and the land (the distance between the center of the groove surface and the center of the land surface) is about 0.615 μm. In the case of DVD-RAM, recording is conducted both on the groove surface and the land surface (that is, a land-groove recording mode is employed for the DVD-RAM).

The first dielectric layer 102 and the second dielectric layer 106 serve to adjust an optical path length so as to enhance the optical absorption efficiency of the recording layer, and serve to enlarge the difference between the reflectance of crystal phase and the reflectance of amorphous phase so as to enlarge a signal amplitude. Further, they also serve to protect the recording layer from moist. The first and the second dielectric layers 102 and 106 may be formed from one material selected from an oxide, a sulfide, a selenide, a nitride, a carbide and a fluoride or a mixture of a plurality of these materials.

More specifically, the oxides include, for example, $Al_2O_3$, $CeO_2$, $Cr_2O_3$, $Dy_2O_3$, $Ga_2O_3$, $Gd_2O_3$, $HfO_2$, $Ho_2O_3$, $In_2O_3$, $La_2O_3$, $Nb_2O_5$, $Nd_2O_3$, $Sc_2O_3$, $SiO_2$, $Sm_2O_3$, $SnO_2$, $Ta_2O_5$, $TiO_2$, $Y_2O_3$, $Yb_2O_3$, ZnO and $ZrO_2$. The sulfide is, for example, ZnS, and the selenide is, for example, ZnSe. The nitrides include, for example, AlN, BN, Cr—N, Ge—N, HfN, NbN, $Si_3N_4$, TaN, TiN, and VN, and ZrN. The carbides include, for example, $Al_4C_3$, $B_4C$, $CaC_2$, $Cr_3C_2$, HfC, $Mo_2C$, NbC, SiC, TaC, TiC, VC, $W_2C$, WC, and ZrC. The fluorides include, for example, $CeF_3$, $DyF_3$, $ErF_3$, $GdF_3$, $HoF_3$, $LaF_3$, $NdF_3$, $YF_3$, and $YbF_3$. The mixtures of these compound include, for example, $ZnS-SiO_2$, $ZnS-SiO_2-LaF_3$, $ZrO_2-SiO_2$, $ZrO_2-Cr_2O_3$, $ZrO_2-SiO_2-Cr_2O_3$, $ZrO_2-Ga_2O_3$, $ZrO_2-SiO_2-Ga_2O_3$, $ZrO_2-SiO_2-Cr_2O_3-LaF_3$, $ZrO_2-SiO_2-Ga_2O_3-LaF_3$, $ZrO_2-Cr_2O_3-LaF_3$, $ZrO_2-Ga_2O_3-LaF_3$, $ZrO_2-In_2O_3$, $ZrO_2-SiO_2-In_2O_3$, $ZrO_2-SiO_2-In_2O_3-LaF_3$, $ZrO_2-In_2O_3-LaF_3$, $SnO_2-Ga_2O_3$, $SnO_2-In_2O_3$, $SnO_2-SiC$, $SnO_2-Si_3N_4$, $SnO_2-Ga_2O_3-SiC$, $SnO_2-Ga_2O_3-Si_3N_4$, $SnO_2-Nb_2O_5$, $SnO_2-Ta_2O_5$, $CeO_2-Al_2O_3-SiO_2$, $ZrO_2-LaF_3$, $HfO_2-SiO_2$, $HfO_2-Cr_2O_3$, $HfO_2-SiO_2-Cr_2O_3$, $HfO_2-Ga_2O_3$, $HfO_2-SiO_2-Ga_2O_3$, $HfO_2-SiO_2-Cr_2O_3-LaF_3$, $HfO_2-SiO_2-Ga_2O_3-LaF_3$, $HfO_2-Cr_2O_3-LaF_3$, $HfO_2-Ga_2O_3-LaF_3$, $HfO_2-In_2O_3$, $HfO_2-SiO_2-In_2O_3$, $HfO_2-SiO_2-In_2O_3-LaF_3$, $HfO_2-In_2O_3-LaF_3$, and $HfO_2-SiO_2-SiC$.

Of these materials, $ZnS-SiO_2$ is preferably used since it is amorphous, has a low thermal conductivity, high transparency and a high refractive index, and exhibits a high film-forming speed during film formation and excellent mechanical characteristics and moisture resistance. $ZnS-SiO_2$ more preferably has a composition $(ZnS)_{80}(SiO_2)_{20}$ (mol %). Alternatively, the dielectric layer may be formed from a material which does not contain Zn and/or S. In that case, preferable materials constituting the dielectric layer include $ZrO_2-SiO_2-Cr_2O_3-LaF_3$, $ZrO_2-SiO_2-Ga_2O_3-LaF_3$, $HfO_2-SiO_2-Cr_2O_3-LaF_3$, $HfO_2-SiO_2-Ga_2O_3-LaF_3$, $SnO_2-Ga_2O_3-SiC$, $ZrO_2-SiO_2-In_2O_3-LaF_3$ and $HfO_2-SiO_2-In_2O_3-LaF_3$. These materials are transparent, and have a high refractive index, a low thermal conductivity, excellent mechanical characteristics and moist resistance. Further, an oxide of "M" which is contained in the recording layer, that is, $M_2O_3$ may be contained in the dielectric layer.

By changing each optical path length (that is, the product "nd" of the refractive index n of a dielectric layer and the film thickness d of a dielectric layer), the first dielectric layer 102 and the second dielectric layer 106 serve to adjust an optical absorptance Ac (%) of the recording layer 104 in a crystalline state and an optical absorptance Aa (%) of the recording layer 104 in an amorphous state, and to adjust the optical reflectance Rc (%) of the information recording medium 100 when the recording layer 104 is in a crystalline state and the optical reflectance Ra (%) of the information recording medium 100 when the recording layer 104 is in an amorphous state, and to adjust the phase difference $\Delta\Phi$ of the light of the information recording medium 100 between the portions where the recording layer 104 is in a crystalline state and an amorphous state. In order to improve signal quality by increasing the reproduced-signal amplitude of a recorded mark, it is desirable that a reflectance difference (|Rc−Ra|) or a reflectance ratio (Rc/Ra) is large. Further, it is desirable that Ac and Aa are also large so that the recording layer 104 may absorb a laser beam. The optical path length of each of the first dielectric layer 102 and the second dielectric layer 106 is determined so as to satisfy these conditions simultaneously. The optical path length which satisfies those conditions can be determined accurately, for example, by calculation based on a matrix method (for example, see "Wave Optics" by Hiroshi Kubota et al., Section 3, Iwanami Shinsho, 1971).

When setting the refractive index of a dielectric layer at n, the film thickness at d (nm), and the wavelength of the laser beam 111 at λ(nm), the optical path length "nd" is expressed with nd=aλ, wherein "a" is a positive number. In order to improve the signal quality by increasing the reproduced-signal amplitude of the recorded mark of the information recording medium 100, for example, it is preferable that Rc and Ra satisfy 15%≦Rc and Ra≦2%, respectively when the medium is used as the DVD-RAM. Moreover, in order to eliminate the mark distortion by overwriting, or to make it small, it is preferable that Ac and Aa satisfy 1.1≦Ac/Aa. The optical path length (aλ) of each of the first dielectric layer 102 and the second dielectric layer 106 can be determined accurately by calculation based on the matrix method so that these preferable conditions are satisfied simultaneously. From the obtained optical path length (aλ), λ and n, the preferable thickness d of each dielectric layer can be determined. In the medium of Embodiment 1, when a dielectric material with a refractive index of 1.8 to 2.5 is used, the thickness (d1) of the first dielectric layer 102 is preferably in a range of 100 nm to 180 nm, and more preferably in a range of 130 nm to 150 nm. Further, the thickness (d2) of the second dielectric layer 106 is preferably in a range of 20 nm to 60 nm, and more preferably in a range of 30 nm to 50 nm.

The first interface layer 103 and the second interface layer 105 are provided in order to prevent the material transfer caused between the first dielectric layer 102 and the recording layer 104 and between the second dielectric layer 106 and the recording layer 104 due to repeated recording. The material transfer here means the phenomenon that when the first and the second dielectric layers 102 and 106 are formed from, for example, $(ZnS)_{80}(SiO_2)_{20}$ (mol %), Zn and/or S in the dielectric layer diffuses into the recording layer 104 while the recording the layer 104 is irradiated with a laser beam 111 and information is repeatedly overwritten. Therefore, it is not preferable that the first and the second interface layers 103 and 105 are formed from a material containing Zn and/or S, and it is more preferable that the two interface layers are formed from a material which contains neither Zn nor S. Further, the interface layer is preferably formed from a material which has excellent adhesiveness to the recording layer 104 and high thermal durability such that it does not melt or decompose upon applying the laser beam 111 on the recording layer 104. Specifically, the interface layer may be formed from one material selected from an oxide, a nitride, a carbide and a fluoride, or a mixture of a plurality of these materials.

More specifically, the oxides include, for example, $Al_2O_3$, $CeO_2$, $Cr_2O_3$, $Dy_2O_3$, $Ga_2O_3$, $Gd_2O_3$, $HfO_2$, $Ho_2O_3$, $In_2O_3$, $La_2O_3$, MgO, $Nb_2O_5$, $Nd_2O_3$, $Sc_2O_3$, $SiO_2$, $Sm_2O_3$, $SnO_2$, $Ta_2O_5$, $TiO_2$, $Y_2O_3$, $Yb_2O_3$, and $ZrO_2$. The nitrides include, for example, AlN, BN, Ge—N, HfN, Si—N, Ti—N, VN, and ZrN. The carbides include, for example, C, $Al_4C_3$, $B_4C$, $CaC_2$, $Cr_3C_2$, HfC, $Mo_2C$, NbC, SiC, TaC, TiC, VC, $W_2C$, WC, and ZrC. The fluorides include, for example, $CeF_3$, $DyF_3$, $ErF_3$, $GdF_3$, $HoF_3$, $LaF_3$, $NdF_3$, $YF_3$, and $YbF_3$. The mixtures include, for example, $ZrO_2-Cr_2O_3$, $ZrO_2-SiO_2-Cr_2O_3$, $ZrO_2-Ga_2O_3$, $ZrO_2-SiO_2-Ga_2O_3$, $ZrO_2-SiO_2-Cr_2O_3-LaF_3$, $ZrO_2-SiO_2-Ga_2O_3-LaF_3$, $HfO_2-Cr_2O_3$, $HfO_2-SiO_2-Cr_2O_3$, $HfO_2-SiO_2-Cr_2O_3-LaF_3$, $ZrO_2-In_2O_3$, $ZrO_2-SiO_2-In_2O_3$, $ZrO_2-SiO_2-In_2O_3-LaF_3$, $HfO_2-Ga_2O_3$, $HfO_2-SiO_2-Ga_2O_3$, $HfO_2-SiO_2-Ga_2O_3-LaF_3$, $HfO_2-SiO_2-SiC$, Ge—Cr—N, and Si—Cr—N.

The thicknesses of the first interface layer 103 and the second interface layer 105 are preferably in a range of 1 nm to 10 nm and more preferably in a range of 2 nm to 7 nm. When the interface layer is thick, the recording and erasing performance is affected because of the change of the optical reflectance and the optical absorptance of the multilayered body which consists of the layers from the first dielectric layer 102 to the reflective layer 108 and is formed on the surface of the substrate 101.

When the first dielectric layer 102 and/or the second dielectric layer 106 is formed from a material containing neither Zn nor S, the first interface layer 103 and/or the second interface layer 105 may not be provided. Not providing the interface layer reduces the cost of the medium and the productivity is improved because the number of film forming steps can be reduced.

The optical compensation layer 107 adjusts the ratio Ac/Aa wherein Ac is an optical absorptance of the recording layer 104 in a crystalline state, and Aa is an optical absorptance of the recording layer 104 in an amorphous state, and serves to suppress distortion of marks upon overwriting. It is preferable to form the optical compensation layer 107 of a material which has a high refractive index and absorbs a light moderately. For example, the optical compensation layer 107 may be formed using a material whose refractive index n is in a range of 3 to 6, and whose extinction coefficient k is in a range of 1 to 4. Specifically, it is preferable to use material selected from amorphous Ge alloys, such as Ge—Cr and Ge—Mo, amorphous Si alloys, such as Si—Cr, Si—Mo and Si—W, tellurides such as SnTe and PbTe, and crystalline metal, such as Ti, Hf, Nb, Ta, Cr, Mo, and W and so on, semimetals, and semiconductor material. The film thickness of the optical compensation layer 107 is preferably in a range of 20 nm to 50 nm.

The reflective layer 108 optically serves to increase the light quantity absorbed by the recording layer 104, and thermally serves to rapidly diffuse the heat generated in the recording layer 104 to cool the recording layer quickly and to facilitate amorphization of the recording layer 104. The reflective layer 108 also serves to protect a multilayered film starting with the first dielectric layer 102 and ending with the reflective layer 108, from the operation environment. It is preferable that the material for the reflective layer 108 has a high thermal conductivity and a low optical absorptance at a wavelength of a laser beam that is employed for the medium. Specifically, the reflective layer 108 is formed from a material containing at least one element selected from Al, Au, Ag and Cu or an alloy thereof.

A material may be used which contains, in addition to one or more elements selected from Al, Au, Ag and Cu, another one or more elements for the purpose of improving the moisture resistance of the reflective layer 108 and/or the purpose of adjusting a thermal conductivity or optical characteristics (for example, an optical reflectance, an optical absorptance or a light transmittance) of the reflective layer 108. Specifically, at least one element selected from Mg, Ca, Sc, Y, La, Ti, Zr, Hf, V, Nb, Ta, Cr, Mo, W, Mn, Fe, Co, Ni, Pd, Pt, Zn, Ga, In, C, Si, Ge, Sn, Sb, Bi, Te, Ce, Nd, Sm, Gd, Tb, and Dy may be added. The concentration of added element is preferably not more than 3 atomic %. Materials wherein one or more elements selected from these elements are added may be, for example, alloy materials, such as Al—Cr, Al—Ti, Al—Ni, Au—Cr, Ag—Pd, Ag—Pd—Cu, Ag—Pd—Ti, Ag—Nd, Ag—Nd—Au, Ag—Nd—Pd, Ag—In, Ag—In—Sn, Ag—In—Ga, Ag—In—Cu, Ag—Ga, Ag—Ga—Cu, Ag—Ga—Sn, Ag—Cu, Ag—Cu—Ni, Ag—Cu—Ca, Ag—Cu—Gd, and Ag—Zn—Al. Any of these materials is an excellent material which has excellent corrosion resistance and quenching function. The similar purpose may be accomplished also by forming the reflective layer 108 of two or more layers. The thickness of the reflective layer 108 is adjusted depending on the composition of the recording layer 104, the linear velocity at which information is recorded on the medium, and preferably is in a range of 40 nm to 300 nm. When the thickness is below 40 nm, the heat in the recording layer is difficult to diffuse and therefore the recording layer is difficult to become amorphous. When the thickness is over 300 nm, the heat in the recording layer overdiffuses whereby the recoding sensitivity is deteriorated.

In the illustrated information recording medium 100, the adhesive layer 109 is provided in order to adhere the dummy substrate 110 to the reflective layer 108. The adhesive layer 109 may be formed using a highly heat-resistant and highly adhesive material, for example, a bonding resin such as an ultraviolet-curing resin. Specifically, the adhesive layer 109 may be formed from an acrylic resin-based material, or an epoxy resin-based material. Moreover, if necessary, before forming the adhesive layer 109, a protective layer which consists of an ultraviolet-curing resin and has a thickness of 1 µm to 20 µm may be provided on the surface of the reflective layer 108. The thickness of the adhesive layer 109 is preferably in a range of 15 µm to 40 µm, and more preferably in a range of 20 µm to 35 µm.

The dummy substrate 110 enhances the mechanical strength of the information recording medium 100 and protects the multilayered body which starts with the first dielectric layer 102 and ends with the reflective layer 108. The preferable material for the dummy substrate 110 is the same as that for the substrate 101. In the information recording medium 100 with the dummy substrate 110 bonded, it is preferable that the dummy substrate 110 and the substrate 101 are formed from substantially the same material and have the same thickness so as not to cause mechanical curvature and distortion.

The information recording medium 100 of Embodiment 1 is a single-sided structure disc which has one recording layer. The information recording medium of this invention may have two recording layers. For example, an information recording medium of a double-sided structure is obtained by bonding two laminated pieces in which the layers up to the reflective layer 108 are stacked in Embodiment 1 through the adhesive layer 109 with the reflective layers 108 facing each other. In this case, the bonding of two laminated pieces are carried out by forming the adhesive layer 109 from a slow-acting resin and applying heat and pressure. In the case where the protective layer is provided on the reflective layer 108, an information recording medium of the double-sided structure is obtained by bonding two layered pieces in which the layers up to the protective layer are formed, with the protective layers facing each other.

Next, the method for producing the information recording medium 100 of Embodiment 1 is described. The information recording medium 100 is produced by carrying out a process in which the substrate 101 where the guide groove (the groove surface and the land surface) is formed is set in a film-forming device, and then the first dielectric layer 102 is formed on the surface of the substrate 101 where the guide groove is formed (Process a), a process in which the first interface layer 103 is formed (Process b), a process in which the recording layer 104 is formed (Process c), a process in which the second interface layer 105 is formed (Process d), a process in which the second dielectric layer 106 is formed (Process e), a process in which the optical compensation layer 7 is formed (Process f), and a process in which the reflective layer 8 is formed (Process g) in this order, and further carrying out a process in which the adhesive layer 109 is formed on the surface of the reflective layer 108, and a process in which the dummy substrate 110 is bonded. In this specification including the following description, unless otherwise indicated, the "surface" of each layer means the surface (vertical to the thickness direction) which is exposed when each layer is formed.

Figure 5:
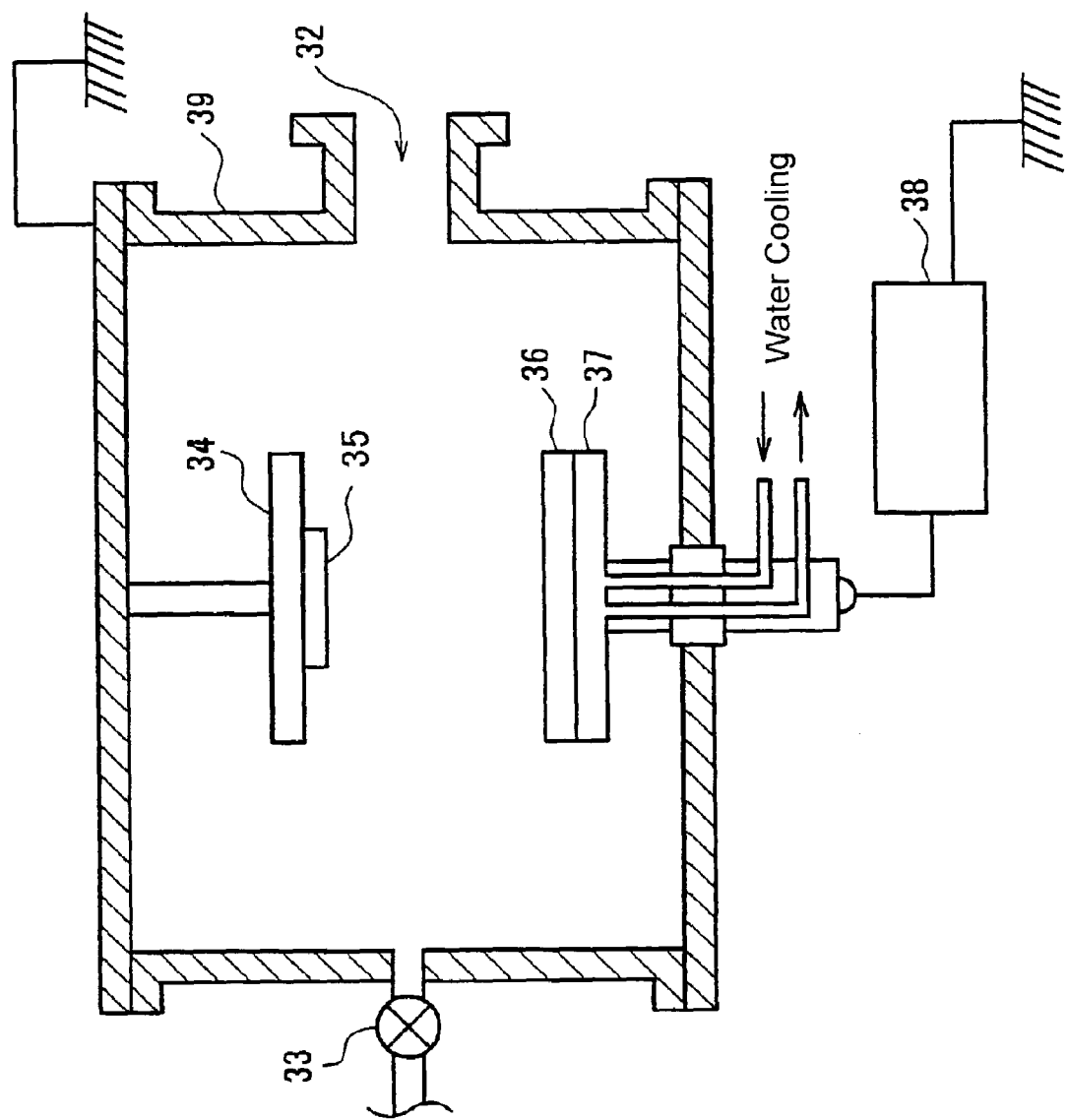
FIG. 5 is a schematic view of a sputtering (film-forming) apparatus used in a method for producing an information recording medium of the present invention.

First, Process a in which the first dielectric layer 102 is formed on the surface of the substrate 101 in which the guide groove is formed is carried out. Process a is carried out by sputtering. An apparatus shown in FIG. 5 is an example of a diode glow discharge-type sputtering apparatus. The inside of a sputtering chamber 39 is maintained at high vacuum. The vacuum is maintained with a vacuum pump (not shown) which is connected to an exhaust port 32. A sputtering gas (such as an Ar gas) is introduced at a constant flow rate from a sputtering gas inlet 33. A substrate 35 is attached to a substrate holder (anode) 34, a sputtering target (cathode) 36 is fixed to a target electrode 37, and the electrode 37 is connected to an electric power supply 38. The application of a high voltage between two electrodes generates glow discharge and accelerates, for example, Ar cations and collides the cations against the sputtering target 36 so that particles are emitted from the target. The emitted particles are deposited on the substrate 35 and a thin film is formed. The apparatus is classified into a direct current type and a high frequency type depending on a type of electric power supply which applies voltage to the cathode. In the case where the medium of Embodiment 1 is produced, the substrate 101 is attached as the substrate 35. This apparatus may be used for forming not only the dielectric layer, but also other layers including the recording layer, and may be used for producing a medium of another embodiment which is described below.

The sputtering for forming the dielectric layer may be carried out in a noble gas atmosphere or in a mixed gas atmosphere of a noble gas and an oxygen gas and/or a nitrogen gas, using a high-frequency electric power. A direct-current electric power supply may be used, if possible. The noble gas may be any one of an Ar gas, a Kr gas, and a Xe gas. A sputtering target used in a Process a may be one consisting of a material selected from an oxide, a sulfide, a selenide, a nitride, a carbide and a fluoride, or a mixture of a plurality of these materials. The material and composition of the sputtering target is selected so that the first dielectric layer 102 of a desired composition can be formed. The composition of the sputtering target and the composition of the obtained dielectric layer are not the same with some film forming devices. In that case, the composition of the sputtering target is optionally adjusted. Further, when the dielectric layer containing an oxide is formed, since oxygen defect may occur during the sputtering, a sputtering target wherein the oxygen defect is suppressed may be used, or the sputtering may be carried out in an atmosphere in which a small amount, such as 5 vol % or less, of oxygen gas is mixed with the noble gas.

For example, when a layer of $(ZnS)_{80}(SiO_2)_{20}$ (mol %) is formed as the first dielectric layer 102, a sputtering target of $(ZnS)_{80}(SiO_2)_{20}$ (mol %) may be used in Process a, and the sputtering may be carried out in an atmosphere in which 3 vol % oxygen gas is mixed with an Ar gas.

Next, Process b is carried out to form the first interface layer 103 on a surface of the first dielectric layer 102. Also Process b is carried out by sputtering. The sputtering may be carried out in a noble gas atmosphere or in a mixed gas atmosphere of a noble gas and an oxygen gas and/or a nitrogen gas, using a high-frequency electric power. A direct-current electric power supply may be used, if possible. The noble gas may be any one of an Ar gas, a Kr gas, and a Xe gas. A sputtering target used in Process b may be one consisting of a material selected from an oxide, a sulfide, a selenide, a nitride, a carbide and a fluoride, or a mixture of a plurality of these materials. The material and composition of the sputtering target is selected so that the first interface layer 103 of a desired composition can be formed. The composition of the sputtering target and the composition of the obtained interface layer are not the same with some film forming devices. In that case, the composition of the sputtering target is optionally adjusted. Further, when the interface layer containing an oxide is formed, since oxygen defect may occur during the sputtering, a sputtering target wherein the oxygen defect is suppressed may be used, or the sputtering may be carried out in an atmosphere in which a small amount, such as 5 vol % or less, of oxygen gas is mixed with the noble gas. Alternatively, the interface layer containing oxygen may be formed by a reactive sputtering using a sputtering target of a metal, a semi-metal, or a semiconductor material in an atmosphere in which a little more, such as 10% or more oxygen gas and/or nitrogen gas is mixed with the noble gas.

For example, when a layer of Ge—Cr—N is formed as the first interface layer 103, a reactive sputtering may be carried out in Process b using a sputtering target consisting of Ge—Cr in an atmosphere wherein 40% of nitrogen gas is mixed with an Ar gas. A layer of $ZrO_2$—$SiO_2$—$Cr_2O_3$ is formed as the first interface layer 103, the sputtering may be carried out in an atmosphere of an Ar gas using a sputtering target consisting of $ZrO_2$—$SiO_2$—$Cr_2O_3$ wherein oxygen deficiency is suppressed.

Next, Process c is carried out, wherein the recording layer 104 is formed on a surface of the first interface layer 103. Also Process c is carried out by sputtering. The sputtering may be carried out using a direct-current electric power supply in an atmosphere of noble gas, or a mixed gas atmosphere of a noble gas and an oxygen gas and/or a nitrogen gas. The noble gas may be any one of an Ar gas, a Kr gas, and a Xe gas. More specifically, the sputtering in Process c may be carried out in an Ar gas atmosphere or an atmosphere in which a 5% or less nitrogen gas is mixed with the an Ar gas.

The sputtering target used in Process c is produced by selecting appropriately the proportions of Ge, Bi, Te, M and the proportion of Sn if any so that a film of a desired composition is formed. The composition of the sputtering target and the composition of the obtained dielectric layer are not the same with some film forming devices. In that case, the composition of the sputtering target is optionally adjusted so that the recording layer 104 of a desired composition is obtained. There is a tendency that the proportions (that is, concentrations) of Ge, Bi, M and Sn in the formed recording layer is a little more than the proportions (that is, concentrations) of those elements in the sputtering target and the proportion of Te in the recording layer is a little smaller than the proportion of Te in the target. Therefore, in the composition of the target which is actually used, the proportions of Ge, Bi, M and Sn may be a little smaller and the proportion of Te may be a little more compared to those in the desired composition of the recording layer. By preparing the sputtering target in this manner and carrying out the sputtering, the recording layer 104 of the desired composition, that is the recording layer 104 containing a material expressed with the formula (1) or (2), or with the formula (3) or (4), can be obtained.

For example, when "M" is In, $x=89$ and $y=0.1$ in the formula (1), the composition of the recording layer 104 may be expressed with $Ge_{38.2}In_{0.9}Bi_{8.5}Te_{52.4}$ (atomic %). The composition of the sputtering target consisting of Ge—In—Bi—Te-based material is determined so as to obtain this composition. Further, when "M" is Ga, x=89, y=0.1 and Z=0.1, the composition of the recording layer 104 may be expressed with $Ge_{34.4}Sn_{3.8}Ga_{0.9}Bi_{8.5}Te_{52.4}$ (atomic %). The composition of the sputtering target consisting of Ge—Sn—Ga—Bi—Te-based material is determined so as to obtain this composition. In any case, a process for crystallizing the recording layer 104 (initialization process) may be optionally carried out after the medium has been produced since the recording layer 104 tends to be in an amorphous state after film formation.

The recording layer 104 may be formed by sputtering using a plurality of sputtering targets. For example, three types of sputtering targets which consist of GeTe, $M_2Te_3$ and $Bi_2Te_3$ respectively are attached in one sputtering chamber of the film-forming device, and they may be sputtered at the same time. In that case, a sputtering power provided to each sputtering target is adjusted so that the recording layer 104 is obtained which contains a material expressed with the formula (1). Alternatively, four types of sputtering targets which consist of GeTe, SnTe, $M_2Te_3$ and $Bi_2Te_3$ respectively may be employed to form the recording layer 104 containing a material expressed with the formula (2). Alternatively, a combination of sputtering targets which consist of Ge, Bi, Al and Te respectively, a combination of sputtering targets which consist of Ge, Bi, Te, and $In_2Te_3$ respectively, or a combination of Ge, Bi, Te and $Ga_2Te_3$ respectively may be used. When a combination of two or more sputtering targets is used and the recording layer containing In and/or Ga is formed, a target of tellurides of In and/or Ga is preferable used since In and Ga have low melting points. The target may not necessarily consist of compounds of stoichiometric composition. For example, a target consisting of a Ge—Te-based, a Sn—Te-based, a Bi—Te-based, an In—Te-based, a Ga—Te-based, or an Al—Te-based material may be used.

Next, Process d is carried out, wherein the second interface layer 105 is formed on a surface of the recording layer 104. Process d is carried out in the same manner as Process b. The second interface layer 105 may be formed using the sputtering target which consists of the same material as that of the first interface layer 103, or may be formed using the sputtering target which consists of a material different from that of the first interface layer 103.

Next, Process e is carried out, wherein the second dielectric layer 106 is formed on a surface of the second interface layer 105. Process e is carried out in the same manner as Process a. The second dielectric layer 106 may be formed using the sputtering target which consists of the same material as that of the first dielectric layer 102, or may be formed using the sputtering target which consists of a material different from that of the first dielectric layer 102.

Next, Process f is carried out, wherein the optical compensation layer 107 is formed on a surface of the second dielectric layer 106. In Process f, a direct-current electric power supply or a high-frequency electric power supply is used for the sputtering. Specifically, the sputtering is preferably carried out using a target consisting of a material selected from an amorphous Ge alloy, such as Ge—Cr and Ge—Mo, an amorphous Si alloy, such as Si—Cr, Si—Mo and Si—W, a telluride such as SnTe and PbTe, and a crystalline metal such as Ti, Hf, Nb, Ta, Cr, Mo and W, a semimetal, and a semiconductor material. The sputtering may be carried out in a noble gas atmosphere, or may be carried out in an Ar gas atmosphere. The composition of the sputtering target and the composition of the obtained optical compensation layer are not the same with some film forming devices. In that case, the composition of the sputtering target is optionally adjusted so that the optical compensation layer 107 of a desired composition is obtained.

Next, Process g is carried out, wherein the reflective layer 108 is formed on a surface of the optical compensation layer 107. Process g is carried out by sputtering. The sputtering is carried out using a direct-current electric power supply or a high-frequency electric power supply in an atmosphere of an Ar gas. A sputtering target which consists of Al, an Al alloy, Au, an Au alloy, Ag, an Ag alloy, Cu, or a Cu alloy may be used. For example, when a layer of an Ag—Pd—Cu alloy is formed as the reflective layer 108, a sputtering target of Ag—Pd—Cu may be used. The composition of the sputtering target and the composition of the obtained reflective layer are not the same with some film forming devices. In that case, the composition of the sputtering target is optionally adjusted so that the reflective layer 108 of a desired composition is obtained.

As described above, Processes a to g are all sputtering processes. Therefore, Processes a-g may be conducted successively by changing the target in order in one sputtering device. Alternatively, each of Processes a-g may be conducted using an independent sputtering device.

After forming the reflective layer 108, the substrate 101 on which the layers starting with the first dielectric layer 102 and ending with the reflective layer 108 are formed in order is taken out from the sputtering device. Then, an ultraviolet-curing resin is applied to the surface of the reflective layer 108, for example, by a spin coat method. The dummy substrate 110 is stuck to the applied ultraviolet-curing resin. An ultraviolet ray is applied from the dummy substrate 110 side to cure the resin, whereby the bonding process is finished.

After finishing the bonding process, an initialization process is carried out if necessary. The initialization process is a process in which the temperature of the recording layer 104 which is in an amorphous state is raised to a temperature equal to or higher than the crystallization temperature so as to crystallize the layer, for example, by application of a semiconductor laser. The initialization process may be carried out before the bonding process. In this manner, the information recording medium 100 of Embodiment 1 can be produced by implementing Processes a-e, the process of forming the adhesive layer, and the bonding process of the dummy substrate in order.

Embodiment 2

Figure 2:
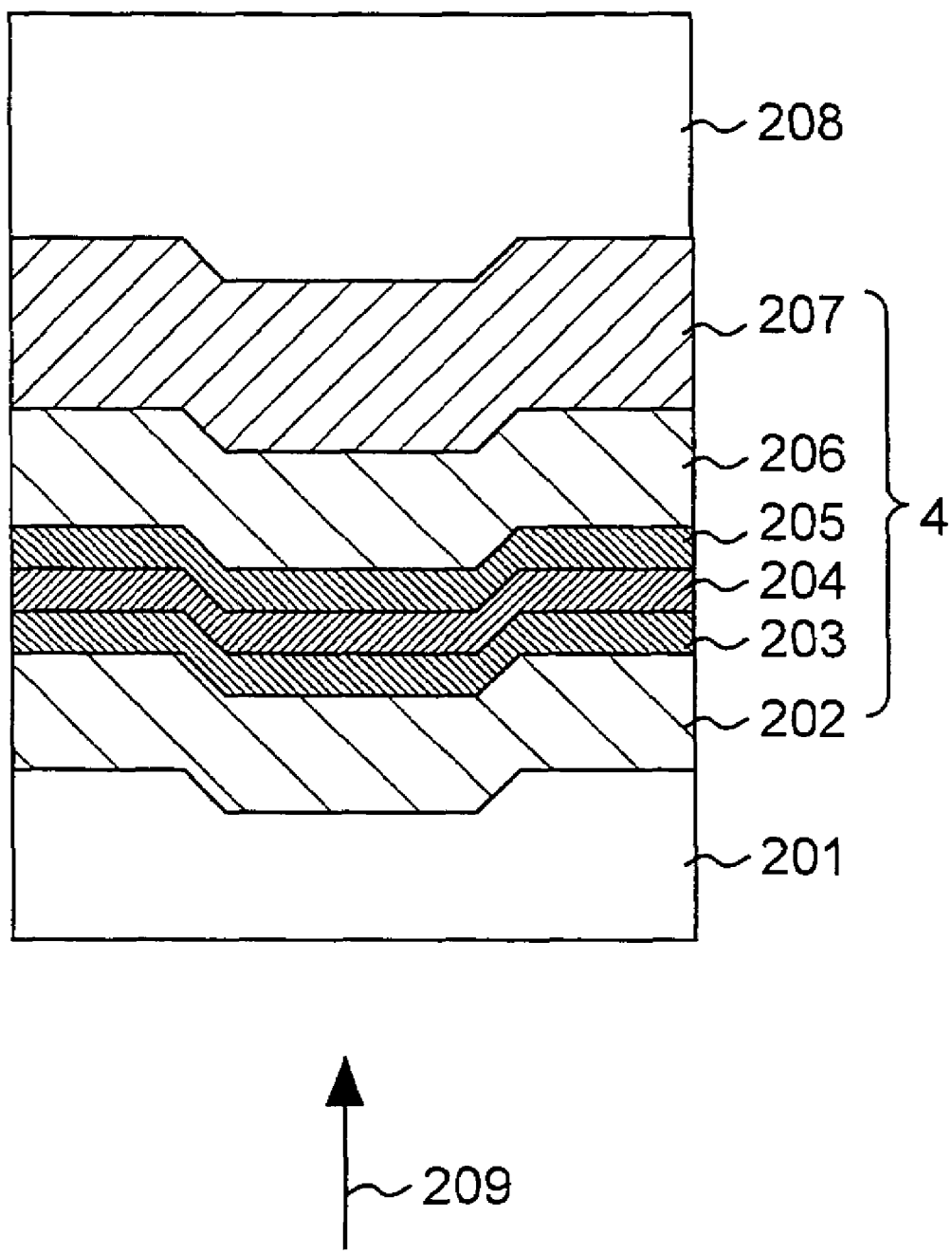
FIG. 2 is a fragmentary sectional view which shows another example of an information recording medium of the present invention.

As Embodiment 2 of the present invention, an example of the optical information recording medium on and from which information is recorded and reproduced by using a laser beam, is described. FIG. 2 shows a partial cross section of the optical information recording medium.

The information recording medium 200 shown in FIG. 2 has a construction wherein a reflective layer 207 is formed on one surface of a substrate 208, a second dielectric layer 206 is formed on a surface of the reflective layer 207, a second interface layer 205 is formed on a surface of the second dielectric layer 206, a recording layer 204 is formed on a surface of the second interface layer 205, a first interface layer 203 is formed on a surface of the recording layer 204, a first dielectric layer 202 is formed on a surface of the first interface layer 203 and a cover layer 201 is formed. The information recording medium of this construction can be used as a 25 GB Blu-ray Disc on and from which information is recorded and reproduced by a laser beam with a wavelength of about 405 nm in a bluish-violet region. The laser beam 209 is applied from the cover layer 201 side to the information recording medium 200 of this construction, whereby information is recorded and reproduced. Hereinafter, the recording layer 204 is firstly described and then the other elements are described.

The recording layer 204 has the same function as that of the recording layer 104 in Embodiment 1. Further, it is preferable that the material contained in the recording layer 204 is the material expressed with the formula (3) or (4) similarly to the recording layer 104 in Embodiment 1. The materials expressed with the formulae (3) and (4) can be expressed with the formulae (1) and (2) respectively, as described in connection with Embodiment 1.

As described above, this medium can be used as the Blu-ray Disc. Therefore, as described in connection with Embodiment 1, "x" in the formula (1) preferably satisfies $85 \leq x \leq 98$, and more preferably $91 < x \leq 98$, and "y" is preferably less than 0.5 when "x" is within this range. Also in the formula (2), "x" preferably satisfies $85 \leq x \leq 98$, and more preferably $91 < x \leq 98$.

The thickness of the recording layer 204 is preferably within a range of 5 nm to 15 nm, and more preferably within a range of 8 nm to 12 nm. The problems which occur when the thickness of the recording layer 204 is too thin or too thick are as described in connection with Embodiment 1.

Next, the elements other than the recording layer are described. The substrate 208 is formed from the material which is the same as that described in connection with Embodiment 1, and it is preferably formed from polycarbonate. In the illustrated embodiment, the substrate 208 having a thickness of about 1.1 mm and a diameter of 120 mm is preferably employed. A guide groove for guiding a laser beam may be formed on a surface where the reflective layer and the recording layer and so on are formed. In the case where the guide groove is formed, a surface which is closer to the laser beam 209 is referred to as the "groove surface" and a surface which is located far from the laser beam 209 is referred to as the "land surface" also in this embodiment. When the medium of this embodiment is used as the Blu-ray Disc, a difference in level between the groove surface and the land surface is preferably in a range of 10 nm to 30 nm. In the Blu-ray Disc, a distance between the groves (a distance between a center of the groove surface and a center of the groove surface) is about 0.32 μm. In the case of Blu-ray Disc, recording is conducted on only the groove surface. In other words, a groove recording mode is employed for the Blu-ray Disc.

The reflective layer 207 has the same function as that of the reflective layer 108 in Embodiment 1. The material suitable for the reflective layer 207 and the thickness of the reflective layer 207 are as described in connection with the reflective layer 108 in Embodiment 1.

The first dielectric layer 202 and the second dielectric layer 206 may be formed from the materials which are the same as those constituting the first dielectric layer 102 and the second dielectric layer 106 in Embodiment 1. In other words, the layers 202 and 206 may be formed from an oxide, a sulfide, a selenide, a nitride or a fluoride or a mixture thereof. The dielectric layer, however, is more preferably formed from a material which ensures high transparency with respect to a light in a short wavelength region since the information recording medium 200 is used for recording and reproducing information with a laser beam having a short wavelength of 405 nm. For this reason, the material constituting the dielectric layer preferably contains at least oxide.

The oxides constituting the first dielectric layer 202 and the second dielectric layer 206 include, for example, $Al_2O_3$, $CeO_2$, $Cr_2O_3$, $Ga_2O_3$, $HfO_2$, $In_2O_3$, $La_2O_3$, $MgO$, $SiO_2$, $SnO_2$, $Ta_2O_5$, $TiO_2$, $Y_2O_3$, $ZnO$ and $ZrO_2$. The sulfide is, for example, ZnS, and the selenide is, for example, ZnSe. As the nitrides, for example, AlN, BN, Ge—N, and $Si_3N_4$ are preferably employed. The fluorides include, for example, $CeF_3$, $DyF_3$, $ErF_3$, $GdF_3$, $HoF_3$, $LaF_3$, $NdF_3$, $YF_3$ and $YbF_3$. The mixtures include, for example, $ZnS$—$SiO_2$, $ZnS$—$SiO_2$—$LaF_3$, $ZrO_2$—$SiO_2$, $ZrO_2$—$Cr_2O_3$, $ZrO_2$—$SiO_2$—$Cr_2O_3$, $ZrO_2$—$Ga_2O_3$, $ZrO_2$—$SiO_2$—$Ga_2O_3$, $ZrO_2$—$SiO_2$—$Cr_2O_3$—$LaF_3$, $ZrO_2$—$SiO_2$—$Ga_2O_3$—$LaF_3$, $SnO_2$—$Ga_2O_3$, $SnO_2$—$In_2O_3$, $SnO_2$—$SiC$, $SnO_2$—$Si_3N_4$, $SnO_2$—$Ga_2O_3$—$SiC$, $SnO_2$—$Ga_2O_3$—$Si_3N_4$, $CeO_2$—$Al_2O_3$—$SiO_2$, $ZrO_2$—$LaF_3$, $HfO_2$—$SiO_2$, $HfO_2$—$Cr_2O_3$, $HfO_2$—$SiO_2$—$Cr_2O_3$, $HfO_2$—$SiO_2$—$SiC$, $ZrO_2$—$Cr_2O_3$—$LaF_3$, $ZrO_2$—$Ga_2O_3$—$LaF_3$, $ZrO_2$—$In_2O_3$, $ZrO_2$—$SiO_2$—$In_2O_3$, $ZrO_2$—$SiO_2$—$In_2O_3$—$LaF_3$, $ZrO_2$—$In_2O_3$—$LaF_3$, $HfO_2$—$Ga_2O_3$, $HfO_2$—$SiO_2$—$Ga_2O_3$, $HfO_2$—$SiO_2$—$Cr_2O_3$—$LaF_3$, $HfO_2$—$SiO_2$—$Ga_2O_3$—$LaF_3$, $HfO_2$—$Cr_2O_3$—$LaF_3$, $HfO_2$—$Ga_2O_3$—$LaF_3$, $HfO_2$—$In_2O_3$, $HfO_2$—$SiO_2$—$In_2O_3$, $HfO_2$—$SiO_2$—$In_2O_3$—$LaF_3$ and $HfO_2$—$In_2O_3$—$LaF_3$.

Of these materials, ZnS—$SiO_2$ is preferably used since it is amorphous and has low thermal conductivity, high transparency and a high refractive index, and shows a high film-forming speed upon forming a film, and excellent mechanical characteristics and moisture resistance. It is more preferable that ZnS—$SiO_2$ has a composition of $(ZnS)_{80}(SiO_2)_{20}$ (mol %). Further, the first and the second dielectric layers 202 and 206 may be formed from a material which does not contain Zn and/or S. In that case, the preferable materials for these dielectric layers include, $ZrO_2$—$SiO_2$—$Cr_2O_3$—$LaF_3$, $ZrO_2$—$SiO_2$—$Ga_2O_3$—$LaF_3$, $ZrO_2$—$SiO_2$—$In_2O_3$—$LaF_3$, $HfO_2$—$SiO_2$—$Cr_2O_3$—$LaF_3$, $HfO_2$—$SiO_2$—$Ga_2O_3$—$LaF_3$, $HfO_2$—$SiO_2$—$In_2O_3$—$LaF_3$, $ZrO_2$—$SiO_2$—$Cr_2O_3$, $ZrO_2$—$SiO_2$—$Ga_2O_3$, $ZrO_2$—$SiO_2$—$In_2O_3$, $HfO_2$—$SiO_2$—$Cr_2O_3$, $HfO_2$—$SiO_2$—$Ga_2O_3$, $HfO_2$—$SiO_2$—$In_2O_3$ and $SnO_2$—$Ga_2O_3$—$SiC$. These materials are transparent, and have a high refractive index and low thermal conductivity, and shows excellent mechanical characteristics and moisture resistance. Also in this embodiment, the dielectric layer may contain an oxide of "M" that is contained in the recording layer, that is, $M_2O_3$.

When the reflective layer 207 contains Ag or an Ag alloy, the second dielectric layer 206 is preferably formed from a material which dose not contain S, in order not to generate $Ag_2S$. When a material containing the sulfide is used for the second dielectric layer 206, a layer which does not contain the sulfide may be provided between the reflective layer 207 and the second dielectric layer 206.

The thicknesses of the first and the second dielectric layers 202 and 206 are determined from a preferred optical path length in the case of λ=405 nm. In order to improve the signal quality by increasing the reproduced-signal amplitude of the recorded mark on the information recording medium 200, the optical path length "nd" of each of the first and the second dielectric layers 202 and 206 can be accurately determined by calculation based on the matrix method so that, for example, Rc and Ra satisfy $15\% \leq Rc$ and $Ra \leq 5\%$, respectively. In the medium of Embodiment 2, when a dielectric material with a refractive index of 1.8 to 2.5 is used for the first and the second dielectric layers 202 and 206, the thickness of the first dielectric layer 202 is preferably within a range of 10 nm to 100 nm, and more preferably within a range of 30 nm to 70 nm. The thickness of the second dielectric layer 206 is preferably within a rage of 3 nm to 50 nm, and more preferably within a range of 5 nm to 40 nm.

The materials suitable for the first interface layer 203 and the second interface layer 205 are as described in connection with the first interface layer 103 and the second interface layer 205 in the medium of Embodiment 1. Similarly, the thickness is preferably within a range of 1 nm to 10 nm, and more preferably within a range of 2 nm to 7 nm. When the first dielectric layer 202 and/or the second dielectric layer 206 is formed from the material which contain neither Zn nor S, the first interface layer 203 and/or the second interface layer 205 may not be provided.

Next, the cover layer 201 is described. As a method for increasing a recording density of the information recording medium, there is a technique of increasing the numerical aperture NA of an objective lens so that the laser beam is narrowed using a laser beam having a short wavelength. In this case, since the focal position becomes shallow, the cover layer 201 which is positioned on the side to which the laser beam enters is designed to be thinner than the substrate 101 in Embodiment 1. This construction makes it possible to obtain a high-density recordable and large-capacity information recording medium 200.

The cover layer 201 is a smooth-surfaced plate or a smooth-surfaced sheet which is discal and transparent, similarly to the substrate 208. The thickness of the cover layer 201 is preferably within a range of 50 μm to 120 μm, and more preferably within a range of 80 μm to 110 μm. The cover layer 201 may consist of a disc-shaped sheet and an adhesive layer, or may consist of a single layer of an ultraviolet-curing resin such as an acrylic resin or an epoxy resin. Alternatively, the cover layer 201 may be provided on a protective layer that is formed on a surface of the first dielectric layer 202. Although the cover layer 201 may take any construction, the cover layer is preferably designed such that a total thickness (for example, a thickness of the sheet+a thickness of the adhesive layer+a thickness of the protective layer, or a thickness of the single layer of the ultraviolet-curing resin) is within a range of 50 μm to 120 μm. It is preferable that the sheet constituting the cover layer is formed from a resin such as a polycarbonate, an amorphous polyolefin, or PMMA, and particularly the polycarbonate. Further, it is preferable that the cover layer 201 optically has a small birefringence with respect to a light in a short wavelength region since the layer is positioned on the side of incident laser beam 209.

Next, a method for producing the information recording medium 200 of Embodiment 2 is described. Since the substrate 208 which is a support for forming each layer is positioned the opposite side of the incident laser beam, the information recording medium 200 is produced by forming the reflective layer 207 firstly on the substrate 208 and then the other layers in order reversely to the information recording medium 100. The information recording medium 200 is produced by carrying out a process in which the substrate 208 where the guide groove (the groove surface and the land surface) is formed is set in a film-forming device, and then the reflective layer 207 is formed on the surface of the substrate 208 where the guide groove is formed (Process h), a process in which the second dielectric layer 206 is formed (Process i), a process in which the second interface layer 205 is formed (Process j), a process in which the recording layer 204 is formed (Process k), a process in which the first interface layer 203 is formed (Process l), a process in which the first dielectric layer 202 is formed (Process m) in this order, and further carrying out a process in which the cover layer 201 is formed on a surface of the dielectric layer 202.

Firstly, Process h is carried out, wherein the reflective layer 207 is formed on the surface of the substrate 208 where the guide groove is formed. Process h is carried out in the same manner as Process g in Embodiment 1.

Next, Process i is carried out, wherein the second dielectric layer 206 is formed on the surface of the reflective layer 207. Process i is carried out in the same manner as Process a in Embodiment 1.

Next, Process j is carried out, wherein the second interface layer 205 is formed on the surface of the second dielectric layer 206. Process j is carried out in the same manner as Process b in Embodiment 1.

Next, Process k is carried out, wherein the recording layer 204 is formed on the surface of the second interface layer 205. Process k is carried out in the same manner as Process c in Embodiment 1. For example, when "M" is In and x=96 and y=0.3 in the formula (1), the composition of the Ge—Bi—Te—In-based material contained in the recording layer 204 can be expressed with $Ge_{45.3}Bi_{2.6}Te_{51.0}In_{1.1}$ (atomic %). The composition of a Ge—In—Bi—Te sputtering target is selected so that this composition is obtained. Further, when "M" is In, x=96, y=0.3 and z=0.1 in the formula (2), the composition of the Ge—Sn—Bi—Te—In-based material contained in the recording layer 204 can be expressed with $Ge_{40.8}Sn_{4.5}Bi_{2.6}Te_{51.0}In_{1.1}$ (atomic %). The composition of a Ge—Sn—Bi—Te—In sputtering target is selected so that this composition is obtained.

Next, Process l is carried out, wherein the first interface layer 203 is formed on the surface of the recording layer 204. Process l is carried out in the same manner as Process b in Embodiment 1.

Next, Process m is carried out, wherein the first dielectric layer 202 is formed on the surface of the first interface layer 203. Process m is carried out in the same manner as Process a in Embodiment 1.

As described above, Processes h to m are all sputtering processes. Therefore, Processes h-m may be conducted successively by changing the target in order in one sputtering device. Alternatively, each of Processes m-h may be conducted using an independent sputtering device.

Next, the process of forming the cover layer 201 is described. After forming the first dielectric layer 202, the substrate 208 on which the layers starting with the reflective layer 207 and ending with the first dielectric layer 202 are formed in order is taken out from the sputtering device. Then, an ultraviolet-curing resin is applied on the surface of the first dielectric layer 202, for example, by a spin coat method. A disc-shaped sheet is stuck to the applied ultraviolet-curing resin and an ultraviolet ray is applied from the sheet side to cure the resin, whereby the cover layer 201 is formed. For example, when the ultraviolet-curing resin is applied into a thickness of 10 μm and a sheet having a thickness of 90 μm is used, the cover layer 201 having a thickness of 100 μm is formed. Alternatively, the cover layer 201 may be formed by applying an ultraviolet-curing resin into a thickness of 100 μm on the surface of the first dielectric layer 202 through a spin coat method, and then applying ultraviolet rays to cure the resin. In this manner, the process of forming the cover layer is completed.

After finishing the process of forming the cover layer, an initialization process is carried out if necessary. The initialization process is carried out in the same manner as that in Embodiment 1. In this manner, the information recording medium 200 of Embodiment 2 can be produced by carrying out Processes h-m and the process of forming the cover layer in order.

Embodiment 3

Figure 3:
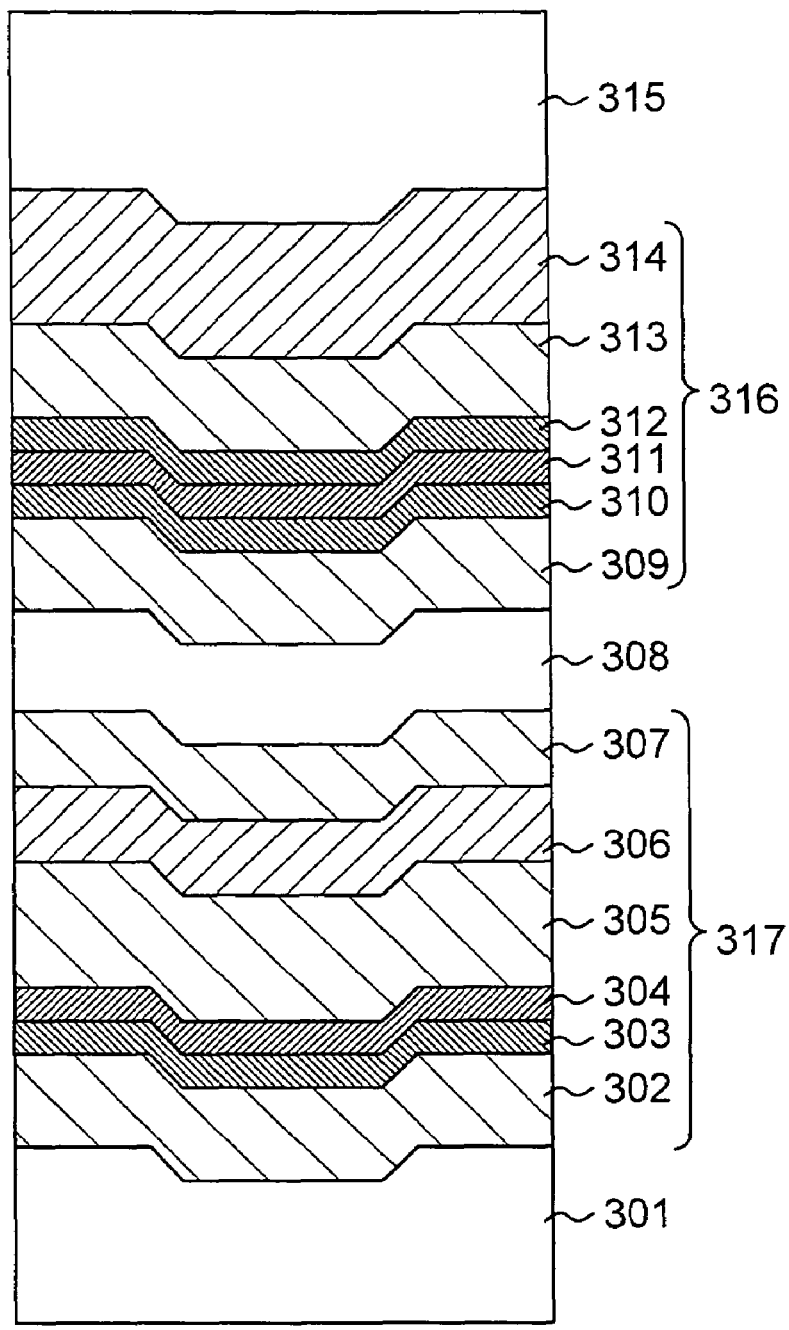
FIG. 3 is a fragmentary sectional view which shows further another example of an information recording medium of the present invention.
Figure 3:
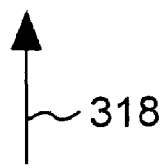

As Embodiment 3, an example of an optical information recording medium on and from which information is recorded and reproduced using a laser beam is described. FIG. 3 shows the partial cross section of the optical information recording medium.

The information recording medium 300 shown in FIG. 3 has a constitution in which a substrate 315, a second information layer 316, an intermediate layer 308, a first information layer 317 and a cover layer 301 are disposed in this order. In detail, the second information layer 316 is formed by stacking a second reflective layer 314, a fifth dielectric layer 313, a third interface layer 312, a second recording layer 311, a second interface layer 310 and a fourth dielectric layer 309 on one surface of the substrate 315 in this order. The intermediate layer 308 is formed on a surface of the fourth dielectric layer 309. The first information layer 317 is formed by stacking a third dielectric layer 307, a first reflective layer 306, a second dielectric layer 305, a first recording layer 304, a first interface layer 303 and a first dielectric layer 302 on a surface of the intermediate layer 308 in this order. Also in this embodiment, a laser beam 318 is applied from the cover layer 301 side. In the second information layer 316, information is recorded and reproduced with the laser beam 318 which passes through the first information layer 317. In the information recording medium 300, information can be recorded in each of the two recording layers. Therefore, by employing this constitution, the medium which has about double the capacity of Embodiment 2, can be obtained. Specifically, by employing this constitution, it is possible to obtain a 50 GB information recording medium on and from which information is recorded and reproduced by a laser beam with a wavelength of about 405 nm in a bluish-violet region.

Firstly, two recording layers are described. The second recording layer 311 has the same function as that of the recording layer 204 in Embodiment 2, and the material and the preferable thickness of the recording layer 311 are the same as those of the recording layer 204.

The first recording layer 304 has the same function as that of the recording layer 204 in Embodiment 2, and it is formed from the material similar to that of the recording layer 204. The thickness of the first recording layer 304 is preferably smaller than that of the second recording layer 311. This is because the first information layer 317 should be designed to have a high transmittance such that the laser beam 318 can reach the second information layer 316. Specifically, Ta and Tc preferably satisfy 45%≦(Ta+Tc)/2, wherein Tc (%) is a light transmittance of the first information layer 317 when the first recording layer 314 is in a crystal phase, and Ta (%) is a light transmittance of the first information layer 317 when the first recording layer 304 is in an amorphous phase. Specifically, the thickness of the recording layer 304 is preferably in a range of 3 nm to 9 nm, and more preferably in a range of 5 nm to 7 nm, in order to achieve such a light transmittance.

Next, elements other than the recording layer are described. The substrate 315 is similar to the substrate 208 in Embodiment 2. Therefore, the detailed description about the substrate 315 is omitted here.

The reflective layer 314 is similar to the reflective layer 108 in Embodiment 1. Therefore, the detailed description about the reflective layer 314 is omitted here.

The fifth dielectric layer 313 and the fourth dielectric layer 309 may be formed from the material similar to that of the second dielectric layer 206 and the first dielectric layer 202 in Embodiment 2. The signals recorded in the second information layer 316 is reproduced by reading a laser beam which passes through the first information layer 317 and is reflected by the second reflective layer 2. Therefore, a reflectance Rc of the second information layer preferably satisfies 18%≦Rc. In order to satisfy this, the thickness of the fourth dielectric layer 309 is preferably within a range of 20 nm to 100 nm, and more preferably within a range of 30 nm to 70 nm. The thickness of the fifth dielectric layer 313 is preferably within a range of 3 nm to 40 nm, and more preferably within a range of 5 nm to 30 nm.

The second interface layer 310 and the third interface layer 312 are similar to the first interface layer 103 and the second interface layer 105. Therefore, the detailed description about the second and the third interface layers are omitted here. When the fifth dielectric layer 313 and/or the fourth dielectric layer 309 is formed from a material which contains neither Zn nor S, the third interface layer 312 and/or the second interface layer 310 may not be provided.

The intermediate layer 308 is provided in order to make the focal position of the laser beam 318 in the first information layer 317 significantly separate from the focal position in the second information layer 316. In the intermediate layer 308, the guide groove is optionally formed for the first information layer 317. The intermediate layer 308 can be formed from an ultraviolet-curing resin. It is desirable that the intermediate layer 308 is transparent with respect to the light having a wavelength λ which is used for recording and reproducing information, so that the laser beam 318 can reach the second information layer 316 efficiently. The thickness of the intermediate layer 308 is preferably selected so that i) it is equal to or more than the focal depth determined by the numerical aperture of an objective lens and the laser beam wavelength; ii) a distance between the first recording layer 304 and the second recording layer 311 is within a range where the objective lens can concentrate light; and iii) the total thickness of the intermediate layer and the cover layer 301 is preferably set within a tolerance of substrate thickness acceptable to the objective lens to be used. Therefore, the thickness of the intermediate layer 308 is preferably in the range of 10 μm to 40 μm. If necessary, the intermediate layer 308 may be constituted by stacking a plurality of resin layers. Specifically, the intermediate layer 308 may have a two-layer structure consisting of a layer which protects the dielectric layer 309, and a layer which has a guide groove.

The third dielectric layer 307 serves to enhance the light transmittance of the first information layer 317. Therefore, the material for the third dielectric layer 307 is preferably transparent and has a high refractive index. For example, $TiO_2$ may be used as such a material. Alternatively, a material containing 90 mol % or more $TiO_2$ may be used. These material forms a layer having a large refractive index of about 2.7. The thickness of the third dielectric layer 307 is preferably within a range of 10 nm to 40 nm.

The first reflective layer 306 serves to diffuse the heat of the first recording layer 304 quickly. Further, as described above, since the first information layer 317 should have a high light transmittance, it is desirable that the optical absorption by the first reflective layer 306 is small. Therefore, the first reflective layer 306 is more limited in the material and the thickness, compared with the second reflective layer 314. The first reflective layer 306 is designed to be thinner, and the optical design therefor is preferably made so that the layer has a low extinction coefficient, and the thermal design therefor is preferably made so that the layer has a high thermal conductivity. Specifically, it is preferable that the first reflective layer 306 is made from Ag or an Ag alloy and is formed into a film whose thickness is in a range of 5 nm to 15 nm. When the film thickness is less than 5 nm, the function of diffusing the heat deteriorates, which makes it difficult to form marks in the first recording layer 304. When the film thickness is greater than 15 nm, the light transmittance of the first information layer 317 is below 45%.

The first dielectric layer 302 and the second dielectric layer 305 serve to adjust an optical path length "nd" so as to adjust Rc, Ra, Tc and Ta of the first information layer 317. For example, the optical path length "nd" of each of the first dielectric layer 302 and the second dielectric layer 305 may be accurately determined by calculation based on the matrix method so that Rc, Ra, Tc and Ta satisfy 45%≦(Ta+Tc)/2, 5%≦Rc and Ra≦1% are satisfied. For example, when the first and the second dielectric layers 302 and 305 are formed from a dielectric material having a refractive index of 1.8 to 2.5, the thickness of the first dielectric layer 302 is preferably within a range of 10 nm to 80 nm, and more preferably within a range of 20 nm to 60 nm. The thickness of the second dielectric layer 305 is preferably within a range of 3 nm to 40 nm, and more preferably within a range of 5 nm to 30 nm. The materials for these dielectric layers may be similar to those for the second and the first dielectric layers 206 and 202 in Embodiment 2. When the first dielectric layer 306 is, however, formed from Ag or an Ag alloy, the second dielectric layer 305 preferably does not contain S. The first and the second dielectric layers 302 and 305 preferably contain at least an oxide. The materials for the first and the second dielectric layers 302 and 305 include $ZrO_2$—$SiO_2$—$Cr_2O_3$—$LaF_3$, $ZrO_2$—$SiO_2$—$Ga_2O_3$—$LaF_3$, $HfO_2$—$SiO_2$—$Cr_2O_3$—$LaF_3$, $HfO_2$—$SiO_2$—$Ga_2O_3$—$LaF_3$, $ZrO_2$—$SiO_2$—$Cr_2O_3$, $ZrO_2$—$SiO_2$—$Ga_2O_3$, $HfO_2$—$SiO_2$—$Cr_2O_3$, $HfO_2$—$SiO_2$—$Ga_2O_3$, $ZrO_2$—$Cr_2O_3$, $ZrO_2$—$Ga_2O_3$, $HfO_2$—$Cr_2O_3$, $HfO_2$—$Ga_2O_3$, $SnO_2$—$Ga_2O_3$—$SiC$, $SnO_2$—$Ga_2O_3$, $Ga_2O_3$—$SiC$ and $SnO_2$—$SiC$. The first dielectric layer 302 may be formed using $ZnS$—$SiO_2$.

The first interface layer 303 is similar to the interface layer 103 in Embodiment 1. Therefore, the detailed description thereof is omitted here. When the first dielectric layer is formed from a material which contains neither Zn nor S, the first interface layer 303 may not be provided. Further, in the illustrated embodiment, an interface layer is not provided between the second dielectric layer 305 and the first recording layer 304. This is because the second dielectric layer 305 is preferably formed from a material which contains neither Zn nor S.

The cover layer 301 has the same function as that of the cover layer 201 in Embodiment 2 and is formed from the same material as that of the cover layer 201. The preferable film thickness of the cover layer 301 is within a range of 40 μm to 100 μm. The thickness of the cover layer 301 is set to that the distance from the surface of the cover layer 301 to the second recording layer 311 is within a range of 50 μm to 120 μm. For example, when the thickness of the intermediate layer 308 is 15 μm, the thickness of the cover layer 301 may be 85 μm. When the thickness of the intermediate layer 308 is 25 μm, the thickness of the cover layer 301 may be 75 μm. When the thickness of the intermediate layer 308 is 35 μm, the thickness of the cover layer 301 may be 65 μm.

The information recording medium of a constitution having two information layers each of which has a recording layer is described above. The information recording medium which has a plurality of recording layers is not limited to this constitution. The medium can also have a constitution including three or more information layers. Further, in a variation of the illustrated embodiment, for example, one of the two information layers may have one recording layer containing the Ge—Bi—Te-M-based material or the Ge—Sn—Bi—Te-M-based material which generates a reversible phase change, and the other may have one recording layer in which an irreversible phase change is generated. Moreover, in an information recording medium which has three information layers, one is made into the read-only information layer, another has a recording layer containing the Ge—Bi—Te-M-based material or the Ge—Sn—Bi—Te-M-based material which generates a reversible phase change, and the other has a recording layer in which an irreversible phase change is generated. As described above, there are many variation of the information recording mediums having two or more information layers. Also in any form, the recording layer can be obtained which has a high crystallization speed and shows excellent stability of an amorphous phase when a layer containing the material expressed with the formula (1) or (2), or the formula (3) or (4) is formed as recording layer wherein reversible phase change is generated. In other words, the information recording medium wherein at least one recording layer contains the particular material as described above shows high erasability and excellent archival characteristic when information is recorded at high linear velocity and at any linear speed selected from a wide range of linear velocities.

Next, a method for producing the information recording medium 300 of Embodiment 3 is described. The information recording medium 300 is produced by forming the second information layer 316, the intermediate layer 308, the first information layer 317 and the cover layer 301 on the substrate 315 as a support in this order.

Specifically, the information recording medium 300 is produced by carrying out a process in which the substrate 315 where a guide groove (the groove surface and the land surface) is formed is set in a film-forming device, and then the second reflective layer 314 is formed (Process n), a process in which the fifth dielectric layer 313 is formed (Process o), a process in which the third interface layer 312 is formed (Process p), a process in which the second recording layer 311 is formed (Process q), a process in which the second interface layer 310 is formed (Process r), and a process in which the fourth dielectric layer 309 is formed (Process s) in this order, and then carrying out a process in which the intermediate layer 308 is formed on the surface of the fourth dielectric layer 309, and further carrying out a process in which the third dielectric layer 307 is formed on the surface of the intermediate layer 308 (Process t), a process in which the first reflective layer 306 is formed (Process u), a process in which the second dielectric layer 305 is formed (Process v), a process in which the first recording layer 304 is formed (Process w), a process in which the first interface layer 303 is formed (Process x), and a process in which the first dielectric layer 302 is formed (Process y) in this order, and furthermore carrying out the process in which the cover layer 301 is formed on the surface of the first dielectric layer 302.

First, Process n is carried out for, wherein the second reflective layer 314 is formed on the surface of the substrate 315 where the guide groove is formed. Process n is carried out in the same manner as Process g in Embodiment 1. Next, Process o is carried out, wherein the fifth dielectric layer 313 is formed on the surface of the second reflective layer 314. Process o is carried out in the same manner as Process a in Embodiment 1. Next, Process p is carried out, wherein the third interface layer 312 is formed on the surface of the fifth dielectric layer 313. Process p is carried out in the same manner as Process b in Embodiment 1. Next, Process q is carried out, wherein the second recording layer 311 is formed on the surface of the third interface layer 312. Process q is carried out in the same manner as Process k in Embodiment 2 (that is, Process c in Embodiment 1). Next, Process r is carried out, wherein the second interface layer 301 is formed on the surface of the second recording layer 311. Process r is carried out in the same manner as Process b in Embodiment 1. Next, Process s is carried out, wherein the fourth dielectric layer 309 is formed on the surface of the second interface layer 310. Process s is carried out in the same manner as Process a in Embodiment 1.

The substrate 315 on which the second information layer 316 is formed according to Processes n to s is taken out from the sputtering device, and then the intermediate layer 308 is formed. The intermediate layer 308 is formed according to the following procedures. Firstly, an ultraviolet-curing resin is applied to the surface of the dielectric layer 309 by, for example, a spin coat method. Next, a polycarbonate substrate which has concavities and convexities which are complementary to the guide groove to be formed in the intermediate layer is stuck to the ultraviolet-curing resin with the concavo-convex surface in contact with the resin. After applying ultraviolet rays and curing the resin, the polycarbonate substrate with concavities and convexities is peeled. Thereby, the guide groove which is complementary to the concavities and convexities is formed in the ultraviolet-curing resin, and the intermediate layer 308 which has the guide groove to be formed is formed. The shape of the guide groove formed in the substrate 315 may be the same as or different from that formed in the intermediate layer 308. Alternatively, the intermediate layer 308 may be formed by forming a layer from an ultraviolet-curing resin which protects the dielectric layer 309, and then forming a layer having a guide groove thereon. In this case, the resultant intermediate layer has a two-layer structure. Alternatively, the intermediate layer is formed by stacking three or more layers.

The substrate 315 on which the layers up to the intermediate layer 308 are formed is again placed in a sputtering device, and then the first information layer 317 is formed on the surface of the intermediate layer 308. The processes for forming the first information layer 317 correspond to Processes t to y.

Process t is a process in which the third dielectric layer 307 is formed on the surface of the intermediate layer 308 where the guide groove is formed. In process t, the sputtering is conducted in a noble gas atmosphere or a mixed-gas atmosphere of noble gas and $O_2$ gas, using a high frequency electric power supply and a sputtering target containing a $TiO_2$-based material. Alternatively, when a $TiO_2$ sputtering target of oxygen deficiency type is employed, the sputtering may be carried out using a pulse-generating direct current electric power supply.

Next, Process u is carried out for, wherein the first reflective layer 306 is formed on the surface of the third dielectric layer 307. In Process u, the sputtering is carried out in a noble gas atmosphere, using, for example, a direct current electric power supply and a sputtering target of an alloy containing Ag.

Next, Process v is carried out, wherein the second dielectric layer 305 is formed on the surface of the first reflective layer 306. Process v is carried out in the same manner as Process a in Embodiment 1. Next, Process w is carried out, wherein the first recording layer 304 is formed on the surface of the second dielectric layer 305. Process w is carried out in the same manner as Process k in Embodiment 2. Next, Process x is carried out, wherein the first interface layer 303 is formed on the surface of the first recording layer 304. Process x is carried out in the same manner as Process b in Embodiment 1. Next, Process y is carried out, wherein the first dielectric layer 302 is formed on the surface of the first interface layer 303. Process y is carried out in the same manner as Process a in Embodiment 1. Thus, the first information layer 317 is formed by carrying out Processes t to y in this order.

The substrate 315 on which the layers up to the first information layer 317 are formed is taken out from the sputtering device. Then, the cover layer 301 is formed on the surface of the first dielectric layer 302 by the same technique as that described in connection with Embodiment 2. For example, an ultraviolet-curing resin which becomes an adhesive is formed into a thickness of 10 μm and a sheet having a thickness of 65 μm is stacked thereon, whereby the cover layer 301 having a thickness of 75 μm may be formed. Alternatively, the ultraviolet-curing resin of a 75 μm thickness is applied to the surface of the dielectric layer 302 by a spin coat method and then the resin is cured by applying ultraviolet rays, whereby the cover layer 301 is obtained. In this manner, the cover layer-forming process is finished.

After finishing the cover layer-forming process, the initialization processes of the second information layer 316 and the first information layer 317 are carried out, if necessary. The Initialization process for the second information layer 316 may be carried out before or after forming the intermediate layer 308, and the initialization process for the first information layer 317 may be carried out before or after forming the cover layer 301. Alternatively, the initialization process of the first and the second information layers 317 and 316 may be carried out before or after forming the cover layer 301. Thus, the information recording medium 300 of Embodiment 3 can be produced by carrying out Processes n to s, the intermediate layer-forming process, Processes t to y and the cover layer-forming process successively, and the initialization process if necessary.

Embodiment 4

Figure 4:
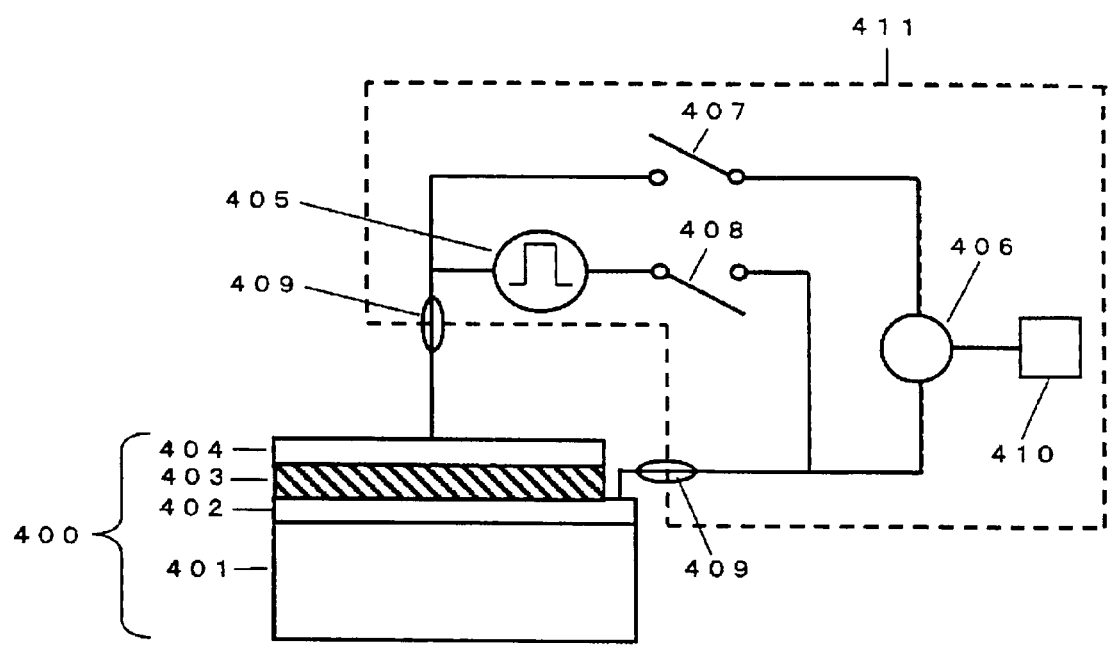
FIG. 4 show a fragmentary sectional view which shows yet another example of an information recording medium of the present invention and an example of a system wherein the medium is used.

As Embodiment 4, an example of the information recording medium on and from which information is recorded and reproduced by applying an electric energy, is described. FIG. 4 shows the partial cross section of the information recording medium 400 and a system wherein the medium is used. The information recording medium 400 is what is called a memory.

In the information recording medium 400, a lower electrode 402, a recording layer 403, and an upper electrode 404 are formed on a surface of a substrate 401 in this order. In this medium, the recording layer 403 is a layer in which the reversible phase change between a crystal phase and an amorphous phase is caused by the Joule heat generated by applying an electric energy, and the layer 403 contains the material expressed with the formula (1) or (2), or the formula (3) or (4).

As the substrate 401, for example, a semiconductor substrate, such as Si substrate, a polycarbonate substrate, or an insulating substrate such as an $SiO_2$ substrate and an $Al_2O_3$ substrate can be used. The lower electrode 402 and the upper electrode 404 are formed from a suitable electrically conductive material. The lower electrode 402 and the upper electrode 404 are formed by, for example, sputtering a metal such as Au, Ag, Pt, Al, Ti, W, Cr, or a mixture thereof. This information recording medium 400 is further explained together with a method for operating the same in the below-mentioned Examples.

Embodiment 5

Figure 6:
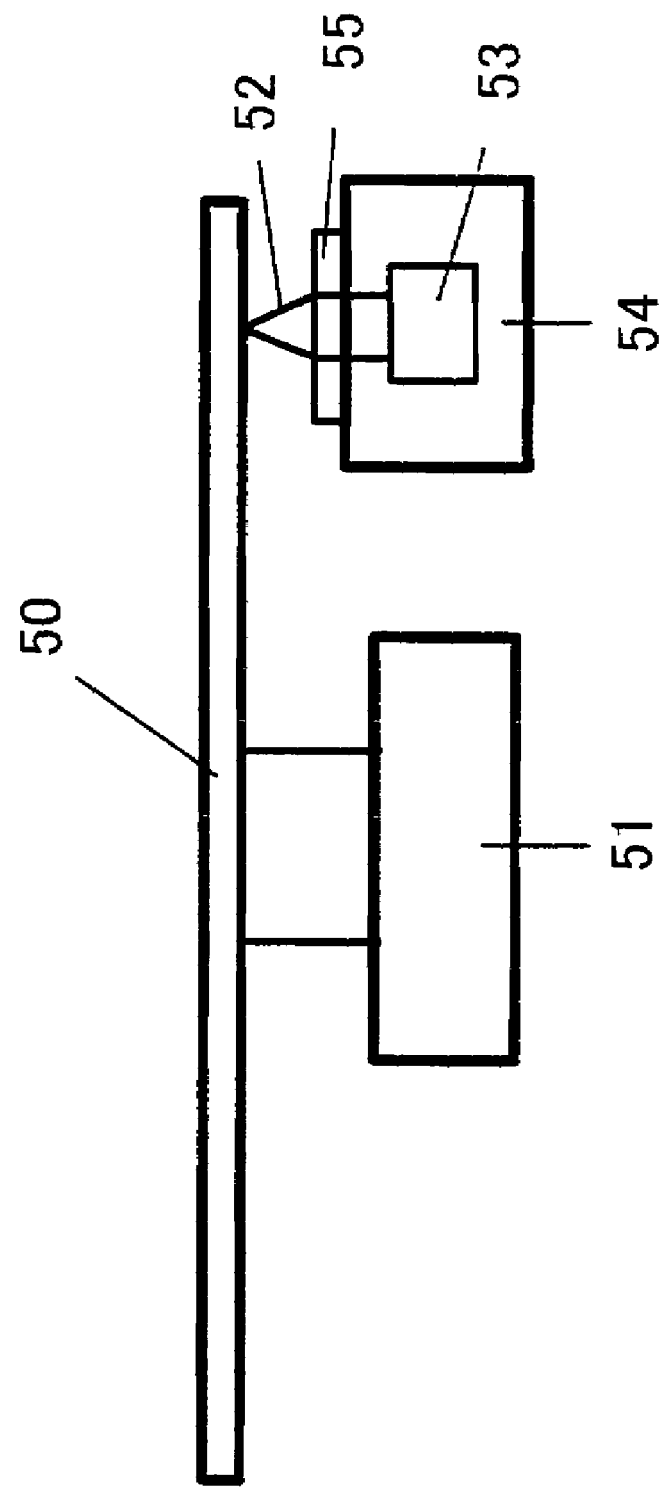
FIG. 6 is a schematic view of an example of a recording and reproduction apparatus for an information recording medium of the present invention.

As Embodiment 5, an example of an apparatus for recording information on and reproducing the recorded information from an information recording medium of the present invention is described. FIG. 6 shows an example of the recording and reproduction apparatus. The recording and reproduction apparatus are equipped with a spindle motor 51 which rotates the information recording medium 50, an optical head 54 provided with a semiconductor laser 53 which emits a laser beam 52, and an objective lens 55 which focuses the laser beam 52 on the recording layer of the information recording medium 50. The information recording medium 50 is, for example, the information recording medium 100, 200 or 300 as described above. The laser beam 52 corresponds to the laser beams 111, 209 and 308 shown in FIGS. 1 to 3.

EXAMPLES

Next, the present invention is described in detail with reference to the following examples.

Example 1

In Example 1, an information recording medium of DVD-RAM format was produced and subjected to a test. Specifically, an information recording medium 100 shown in FIG. 1 was produced, and recording/reproduction evaluation and reliability evaluation were made. In this example, three kinds of materials each of which is expressed with the formula (3) with different "M" were prepared as materials for the recording layer 104 and three kinds of information recording mediums (medium Nos. 100-1 to 100-3) were produced. Another medium 100 with a recording layer 104 formed from a material that did not contain. "M" (that is, $M_2Te_3$) (Comparative Example; medium No. 100-A) was also prepared for comparison. The recording/reproduction evaluation and the reliability evaluation were carried out at 5× speed and 16× speed. A production method and evaluation methods are described in the following.

Firstly, the production method of the information recording medium 100 is described. As a substrate 101, a polycarbonate substrate (having a diameter of 120 mm and a thickness of 0.6 mm) wherein a guide groove (with a depth of 50 nm and a distance between a groove and a land of 0.615 μm) was formed was prepared and attached inside a sputtering device as shown in FIG. 5.

A first dielectric layer 102 consisting of $(ZnS)_{80}(SiO_2)_{20}$ (mol %) was formed into a thickness of 138 nm on the surface of the substrate 101 where the guide groove was formed, by a sputtering method. The first interface layer 103 of $(ZrO_2)_{25}(SiO_2)_{25}(Cr_2O_3)_{50}$ (mol %) was formed into a thickness of 5 nm by a sputtering method.

Next, the recording layer 104 was stacked into a thickness of 7 nm by a sputtering method. The recording layer 104 was formed using a target formed from Ge—Bi—Te-M wherein the proportions of Ge, Bi, Te and "M" were adjusted so that the layer consisting essentially of a material expressed with $(GeTe)_{89}[(M_2Te_3)_{0.1}(Bi_2Te_3)_{0.9}]_{11}$ (mol %) was formed. In the medium No. 100-1, "M was Al. In the medium No. 100-2, "M" was Ga. In the medium 100-3, "M" was In. Whether or not the recording film of the above-described composition was formed was judged by whether or not an elementary composition of each of films having a thickness of 500 nm which films were formed on ten glass plates under the conditions of forming the recording layer, substantially corresponded with an elementary composition calculated from the formula $(GeTe)_{89}[(M_2Te_3)_{0.1}(Bi_2Te_3)_{0.9}]_{11}$ (mol %) (that is, $Ge_{38.2}Bi_{8.5}Te_{52.4}M_{0.9}$ (atomic %)). Further, the composition of the sputtering target was experimentally determined by adjusting the proportion of each element until the elementary composition of each of the films formed on ten glass plates as described above substantially corresponded with the elementary composition calculated from the formula $(GeTe)_{89}[(M_2Te_3)_{0.1}(Bi_2Te_3)_{0.9}]_{11}$ (mol %) (specifically, until a difference became within ±0.5% as to Ge and Te, and a difference became within ±0.2% as to Bi and "M", and a difference became within ±0.2% as to Sn if Sn is contained). The elementary composition of the films formed on the glass plate was determined by dissolving the film in an acid solvent and analyzing the solution by an ICP (Inductively Coupled Plasma) emission spectrometry. As the analysis apparatus, CIROS 120 manufactured by Rigaku Corporation was used. In the following examples, the confirmation that the recording layer of a desired composition was formed and the determination of the target composition were carried out according to this procedure.

Next, a second interface layer 105 of $(ZrO_2)_{25}(SiO_2)_{25}(Cr_2O_3)_{50}$ (mol %) was formed into a thickness of 5 nm, and then a second dielectric layer 106 of $(ZnS)_{80}(SiO_2)_{20}$ (mol %) was formed into a thickness of 35 nm. An optical compensation layer 107 of $Si_2Cr$ was formed into a thickness of 30 nm. Further, a reflective layer 108 of Ag—Pd—Cu was formed into a thickness of 80 nm.

The sputtering condition employed for forming each layer is described. The first dielectric layer 102 and the second dielectric layer 106 were formed by sputtering a sputtering target of $(ZnS)_{80}(SiO_2)_{20}$ (mol %) having a diameter of 100 mm and a thickness of 6 mm at a pressure of 0.13 Pa under an atmosphere of an Ar gas in which 3% $O_2$ gas is mixed, using a high frequency electric power supply with a power of 400 W. The first interface layer 103 and the second interface layer 105 were formed by sputtering a sputtering target of $(ZrO_2)_{25}(SiO_2)_{25}(Cr_2O_3)_{50}$ (mol %) having a diameter of 100 mm and a thickness of 6 mm at a pressure of 0.13 Pa under an Ar gas atmosphere, using a high frequency electric power supply with a power of 500 W. The recording layer 104 was formed by sputtering a sputtering target containing Ge, Te, Bi and M having a diameter of 100 mm and a thickness of 6 mm at a pressure of 0.13 Pa under an Ar gas atmosphere, using a direct current electric power supply with a power of 100 W. The optical compensation layer 107 was formed by sputtering a sputtering target containing Si and Cr having a diameter of 100 mm and a thickness of 6 mm at a pressure of 0.27 Pa under an Ar gas atmosphere, using a high frequency electric power supply with a power of 300 W. The reflective layer 108 was formed by sputtering a sputtering target of Ag—Pd—Cu having a diameter of 100 mm and a thickness of 6 mm at a pressure of 0.4 Pa under an Ar gas atmosphere, using a direct current electric power supply with a power of 200 W. The recording layer 104 in the medium of No. 100-A was formed by sputtering a sputtering target containing Ge, Bi and Te under the same condition.

As described above, the first dielectric layer 102, the first interface layer 103, the recording layer 104, the second interface layer 105, the second dielectric layer 106, the optical compensation layer 107 and the reflective layer 108 were formed on the substrate 101 in this order, and then an ultraviolet-curing resin was applied to the reflective layer 108 and a disc-shaped polycarbonate substrate, as a dummy substrate 110, having a diameter of 120 mm and a thickness of 0.6 mm was bonded to the applied ultraviolet-curing resin. The resin was cured by applying ultraviolet rays from the dummy substrate 110 side. Thus, an adhesive layer 109 of the cured resin was formed into a thickness of 30 μm, while the dummy substrate 110 was bonded to the multilayered body through the adhesive layer 109.

After bonding the dummy substrate 110, an initialization process was carried out. In the initialization process, a semiconductor laser with a wavelength of 810 nm was used and the recording layer 104 of the information recording medium 100 was crystallized in a substantially whole annular area ranging from a radius 22 mm to a radius 60 mm. In this manner, the initialization process was completed, and thereby the production of information recording mediums 100 of Nos. 100-1 to 100-3 and No. 100-A was finished. In all of the mediums, the specular reflectivities Rc and Ra were about 16% and about 2%, respectively.

Next, the recording/reproduction evaluation method is described. A recording and reproduction apparatus having a constitution as shown in FIG. 6 which had a spindle motor for rotating the information recording medium 100, an optical head equipped with a semiconductor laser emitting a laser beam 111, an objective lens for focusing the laser beam 111 on the recoding layer 104 of the information recording medium 100, was employed in order to record information on the medium 100. In the evaluation of the information recording medium 100, a semiconductor laser having a wavelength of 660 nm and an objective lens having a numerical aperture of 0.65 were used, information which was equivalent to a capacity of 4.7 GB was recorded. The number of revolutions of the information recording medium 100 were within a range of 9000 rev/min to 11000 rev/min, whereby information was recorded on the innermost of the disc at about 20 m/sec corresponding to 5× speed and information was recorded on the outermost of the disc at about 65 m/sec corresponding to 16× speed. The reproduction evaluation of the recorded signals was conducted by applying a 1 mW laser beam at about 8 m/sec corresponding to 2× speed. The reproduction evaluation may be carried out at a linear velocity higher than 2× speed and the reproduction power may be larger than 1 mW.

The recording/reproduction evaluation was conducted based on a jitter value (an indication for statistically evaluating how a recorded mark of a predetermined length is shifted from a predetermined position) and an erase ratio (an indication for evaluating a crystallization speed of the recording layer).

In order to establish a condition for determining the jitter value, a peak power (Pp) and a bias power (Pb) were determined according to the following procedure. The information recording medium 100 was irradiated with the laser beam 111 while modulating its power between a high power level and a low power level to record random signals having mark lengths within 0.42 μm (3T) to 1.96 μm (14T) ten times on the same groove surface of the recording layer 104 (groove recording). For this recording, a laser beam of non-multiple pulse was applied.

After recording, a jitter value between front ends and a jitter value between rear ends were measured with a time interval analyzed and a jitter-average value was calculated as the mean values of these jitters. Such jitter-average value was measured on each recording condition with the bias power being fixed while the peak power was varied. While the peak power was gradually increased, a power that was 1.3 times as large as a peak power at which the jitter-average value for the random signal became 13% was determined as Pp1 temporarily. Next, a jitter-average value was measured under each recording condition with the peak power being fixed at Pp1 while the bias power was varied. The mean value of upper and lower limits of bias powers at which the jitter-average value for the random signal became 13% or less was determined as Pb. Then, the jitter-average value was measured on each recording condition with the bias power being fixed at Pb while the peak power was varied by being gradually increased. A power that was 1.3 times as large as a peak power at which the jitter-average value for the random signal became 13% was determined Pp. Pp and Pb were determined for groove recording at 16× speed and 5× speed and land recording at 16× speed and 5× speed (that is, Pp and Pb were determined for four recording conditions). The results are shown in Table 1. When the recording was conducted under the condition of thus determined Pp and Pb, the jitter-average value was 8% to 9% for 5×- and 16×-speed recordings after overwriting, for example, ten times. Considering the upper limit of the laser power of the system, it is desirable to satisfy Pp≦30 mW and Pb≦13 mW even at 16× speed.

Next, a method for determining the erase ratio is described. A single signal of 3T and a single signal of 11T were alternately recorded 10 times in total while modulating the power between the above-described Pb and Pp. A signal of 3T was recorded as the eleventh signal and the amplitude of the 3T signal (unit: dBm) was measured using a spectrum analyzer. Next, a signal of 11T was recorded as the twelfth signal and a decrement of the 3T signal was measured. This measured decrement was defined as the erase ratio (unit: dB). As the decrement is larger, the crystallization speed of the recording layer is higher. The value of the erase ratio is preferably equal to or greater than 25 dB. The erase ratio is lower as the linear velocity is increased, and therefore the erase ratio was determined for groove recording and land recording at 16× speed.

Next, the reliability evaluation is described. The reliability evaluation was conducted for inspecting whether a recorded signal can be preserved even if it was placed under a high-temperature condition, and whether overwriting can be made after leaving the medium under a high-temperature condition. The evaluation was carried out using the recording and reproduction apparatus similar to one as described above. Specific evaluation procedures are as follows. First, random signals were multiple-track recorded on groove and land of each of the three kinds of information recording mediums 100 at 16× speed and 5× speed while modulating the power between the above-described Pp and pb, and a jitter "j" (%) was determined. These mediums were left in a thermostatic chamber with a temperature of 80° C. and a relative humidity of 20% for 100 hours and then they were taken out. After taking out the mediums, the recorded signals were reproduced and a jitter value "ja" (%) was determined (evaluation of archival characteristic). Further, signals were overwritten once on the recorded signals while modulating the power between Pp and Pb and a jitter value "jo" (%) was determined (evaluation of archival overwrite characteristic). The jitter value before leaving the medium in the thermostatic chamber was compared with the jitter value after leaving the medium in the thermostatic chamber, whereby the reliability was evaluated. As $\Delta$ja and $\Delta$jo are larger wherein $\Delta$ja=(ja−j)(%) and $\Delta$jo=(jo−j)(%), it can be said that the reliability is lower. The archival characteristic ($\Delta$ja) tends to be low for a signal recorded at a low times speed, and the archival overwrite characteristic ($\Delta$jo) tends to be low for a signal recorded at a high times speed. Therefore, in this example, $\Delta$ja at 5× speed and $\Delta$jo at 16× speed were evaluated by carrying out groove recording and land recording. As both of $\Delta$ja and $\Delta$jo are lower, the medium is more conveniently used in a wider range of linear velocities.

Table 1 show the erase ratio at 16× speed, the evaluation results for $\Delta$ja at 5× speed and $\Delta$jo at 16× speed and Pp and Pb at 16× speed and 5× speed as to each of the three kinds of information recording mediums and the information recording medium of comparative example. All evaluations were conducted for groove recording and land recording.

In the table, the meanings of "S", "C" and "A" are respectively as follows:

Erase ratio:
S equal to or greater than 30 dB;
A not less than 25 dB and less than 30 dB;
B not less than 20 dB and less than 25 dB; and
C less than 20 dB.
Δja and Δjo:
S less than 2%;
A not less than 2% and less than 3%;
B not less than 3% and less than 5%; and
C equal to or greater than 5%.

In any of evaluations, "C" means that it is difficult to use the medium at that linear velocity, and "B" to "S" mean that it is possible to use the medium at that linear velocity. "B" means "preferable" (good), "A" means "more preferable" (very good), and "S" means "still more preferable" (excellent).

TABLE 1

| Medium No. | Composition of recording layer (mol %) | Recording surface | Erase ratio | 16× Δja | 16× Δjo | 16× Pp (mW) | 16× Pb (mW) | 5× Pp (mW) | 5× Pb (mW) |
|---|---|---|---|---|---|---|---|---|---|
| 100-1 | (GeTe)$_{89}$[(Al$_2$Te$_3$)$_{0.1}$(Bi$_2$Te$_3$)$_{0.9}$]$_{11}$ | Groove | A | A | A | 27.0 | 10.5 | 15.8 | 7.6 |
|  |  | Land | A | A | A | 27.5 | 11.0 | 16.2 | 8.0 |
| 100-2 | (GeTe)$_{89}$[(Ga$_2$Te$_3$)$_{0.1}$(Bi$_2$Te$_3$)$_{0.9}$]$_{11}$ | Groove | A | A | A | 26.8 | 10.8 | 15.8 | 7.5 |
|  |  | Land | A | A | A | 27.3 | 11.3 | 16.2 | 7.9 |
| 100-3 | (GeTe)$_{89}$[(In$_2$Te$_3$)$_{0.1}$(Bi$_2$Te$_3$)$_{0.9}$]$_{11}$ | Groove | A | A | A | 27.0 | 10.8 | 15.8 | 7.6 |
|  |  | Land | A | A | A | 27.4 | 11.3 | 16.2 | 8.1 |
| 100-A | (GeTe)$_{89}$(Bi$_2$Te$_3$)$_{11}$ | Groove | S | C | S | 27.2 | 10.1 | 16.2 | 7.5 |
|  |  | Land | S | C | S | 27.5 | 10.6 | 16.5 | 7.8 |

As shown in Table 1, the mediums of Nos. 100-1 to 100-3 achieved "A" evaluation with respect to the erase ratio at 16× speed, the archival characteristic at 5× speed and the archival overwrite characteristic at 16× speed. Further, the values of Pp and Pb were good. On the other hand, as to the information recording medium of comparative example wherein the recording layer does not contain "M", the evaluation of the erase ratio at 16× speed and the archival overwrite characteristic at 16× speed were "S", but the archival characteristic at 5× speed was "C". In other words, the archival characteristic at low speed could not be ensured since the crystallization speed of the recording layer in this medium was too high. As shown in this example, high erasability at a high linear velocity can be ensured and high reliability can be ensured in a wide linear velocity range of 5× speed to 16× speed, by employing a material expressed with (GeTe)$_{89}$[(M$_2$Te$_3$)$_{0.1}$(Bi$_2$Te$_3$)$_{0.9}$]$_{11}$ (mol %) wherein "M" is Al, Ga or In in the recording layer 104.

Example 2

In Example 2, an information recording medium of DVD-RAM format was produced and subjected to a test. Specifically, an information recording medium 100 shown in FIG. 1 was produced, and recording/reproduction evaluation and reliability evaluation were made. In this example, six kinds of information recording mediums (medium Nos. 100-4 to 100-9) with different compositions of the recording layers 104 in these mediums were produced. Specifically, the recording layers 104 in these mediums were substantially consists of materials expressed with (GeTe)$_{89}$[(In$_2$Te$_3$)$_y$(Bi$_2$Te$_3$)$_{1-y}$]$_{11}$ (mol %) wherein "y" were 0.05, 0.1, 0.2, 0.3, 0.4 and 0.5 respectively. Further, for comparison, an information recording medium 100 having a recording layer 104 consisting of a material expressed with the formula (3) wherein "M" was In and "y" was 1 (medium No. 100-B), was prepared. Further, the medium corresponding to the medium No. 100-A which was evaluated in Example 1 was also evaluated. The recording/reproduction evaluation and the reliability evaluation were carried out at 5× speed, 6× speed, 12× speed and 16× speed. A production method and evaluation methods are described in the following.

Firstly, the production method of the information recording medium 100 is described. In Example 2, a substrate 101 was the same as the substrate 101 employed in Example 1. A first dielectric layer 102, a first interface layer 103, a second interface layer 105, a second dielectric layer 106, an optical compensation layer 107 and a reflective layer 108 were formed from the same materials as those for the corresponding layers of the medium in Example 1 into the same thickness as those of the corresponding layers of the medium in Example 1. Further, the sputtering conditions of each layer were the same as those employed in Example 1. The bonding process and the initialization process were carried out in the same manner as in Example 1.

The recording layer 104 was formed on a surface of the first interface layer 103 into a thickness of 7 nm. The recording layer 104 was formed adjusting the composition of a sputtering so that the recording layer of each medium consists substantially of a material expressed with (GeTe)$_{89}$[(In$_2$Te$_3$)$_y$(Bi$_2$Te$_3$)$_{1-y}$]$_{11}$ (mol %) with different "y." The sputtering conditions of the recording layer 104 were the same as those employed in Example 1.

In all the produced mediums, the specular reflectivities Rc and Ra were about 16% and about 2% respectively.

Next, the recording/reproduction evaluation method is described. Pp and Pb were determined for groove recording as well as land recording at 5× speed, 6× speed, 12× speed, and 16× speed with the same recording and reproduction apparatus as those employed in Example 1, according to the same procedures as those employed in Example 1. The erase ratio, the archival characteristic, and the archival overwrite characteristic were evaluated at the respective linear velocities based on Pp and Pb.

The evaluation results for the erase ratio, Δja and Δjo for groove recording at 5×, 6×, 12× and 16× speeds are shown in Table 2 with respect to the six kinds of information recording mediums and two kinds of information recording mediums for comparison.

The meanings of symbols shown in this table are as described in connection with Example 1. The indication "−", however, means that the erase ratio was poor and Pp and Pb could not be determined, and the archival characteristic and the archival overwrite characteristic could not be evaluated.

TABLE 2

| Medium No. | Composition of recording layer (mol %) | Erase ratio 5× | 6× | 12× | 16× | $\Delta$ja 5× | 6× | 12× | 16× | $\Delta$jo 5× | 6× | 12× | 16× |
|---|---|---|---|---|---|---|---|---|---|---|---|---|---|
| 100-4 | $(GeTe)_{89}[(In_2Te_3)_{0.05}(Bi_2Te_3)_{0.95}]_{11}$ | S | S | A | A | B | B | A | A | S | S | A | A |
| 100-5 | $(GeTe)_{89}[(In_2Te_3)_{0.1}(Bi_2Te_3)_{0.9}]_{11}$ | S | S | A | A | A | A | A | A | S | S | A | A |
| 100-6 | $(GeTe)_{89}[(In_2Te_3)_{0.2}(Bi_2Te_3)_{0.8}]_{11}$ | S | A | A | B | A | A | A | A | S | A | A | B |
| 100-7 | $(GeTe)_{89}[(In_2Te_3)_{0.3}(Bi_2Te_3)_{0.7}]_{11}$ | A | A | B | B | A | S | S | S | A | A | B | B |
| 100-8 | $(GeTe)_{89}[(In_2Te_3)_{0.4}(Bi_2Te_3)_{0.6}]_{11}$ | A | A | B | B | A | S | S | S | A | A | B | B |
| 100-9 | $(GeTe)_{89}[(In_2Te_3)_{0.5}(Bi_2Te_3)_{0.5}]_{11}$ | A | B | B | C | S | S | S | — | A | B | B | — |
| 100-B | $(GeTe)_{89}(In_2Te_3)_{11}$ | C | C | C | C | — | — | — | — | — | — | — | — |
| 100-A | $(GeTe)_{89}(Bi_2Te_3)_{11}$ | S | S | S | S | C | C | C | C | S | S | S | S |

As shown in Table 2, the mediums of Nos. 100-4 to 8 were able to be used at a speed between 5× speed and 16× speed. For the medium of No. 100-9, although the erase ratio was "C" at 16× speed, "B" or better evaluation was obtained at the other speeds and therefore it was able to be used at a speed between 5× speed and 12× speed. On the contrary, the erase ratios at speeds between 5× speed and 16× speed were "C" for the medium of No. 100-B having the recording layer of the composition wherein y=1. From these facts, it was found that when the ratio of $M_2Te_3$ was large, the crystallization speed of the recording layer became slow and the medium having such a recording layer could not be used at a speed equal to or faster than 5× speed. Further, as to the composition not containing $M_2Te_3$, $\Delta$ja was "C" evaluation at any speed between 5× speed and 16× speed. It was found that the crystallization speed of the recording layer of such composition was very fast and the medium having such a recording layer could not be used at a speed equal to or slower than 16× speed. The same results were obtained for land recording.

Further, overwrite cycle-ability was evaluated up to 100,000 cycles at a usable speed for the mediums of Nos. 100-4 to 100-9. As a result, a phase separation due to addition of $In_2Te_3$ did not occur. Furthermore, the jitter value between front ends and the jitter value between rear ends were 12% or less. These mediums were at a sufficient level for an image file and at a practicable level for a datafile.

It was confirmed that the medium having the recording layer containing a material expressed with the formula (3) wherein M=In and x=89 and 0<y≦0.5 could be used at a high linear velocity and in a wide range of linear velocities wherein the highest linear velocity is 2.4 times or more the lowest linear velocity. In other words, an excellent information recording medium with which high-speed recording may be conducted in CAV mode is obtained by using such a material.

Example 3

In Example 3, information recording mediums were produced and evaluated in the same manner as in Example 2 except that the recording layers 104 were formed as layers each of which consisted substantially of a material expressed with $(GeTe)_{89}[(Ga_2Te_3)_y(Bi_2Te_3)_{1-y}]_{11}$ (mol %). As a result, it was found that a favorable medium with which high-speed CAV recording was able to be conducted could be obtained by forming the recording layer from a material expressed with the formula (3) wherein M=Ga and x=89 and 0<y≦0.5, similarly to Example 2.

Example 4

In Example 4, an information recording mediums were produced and evaluated in the same manner as in Example 2 except that the recording layers 104 were formed as layers each of which consisted substantially of a material expressed with $(GeTe)_{89}[(Al_2Te_3)_y(Bi_2Te_3)_{1-y}]_{11}$ (mol %). As a result, it was found that a favorable medium with which high-speed CAV recording was able to be conducted could be obtained by forming the recording layer from a material expressed with the formula (3) wherein M=Al and x=89 and 0<y≦0.5.

Example 5

In Example 5, an information recording medium of Blu-ray Disc format was produced and subjected to a test. Specifically, an information recording medium 200 shown in FIG. 2 was produced, and recording/reproduction evaluation and reliability evaluation were made. In this example, eight kinds of information recording mediums (medium Nos. 200-1 to 200-8) with different compositions of the recording layers were produced. Specifically, the recording layers 204 substantially consisted of materials expressed with $(GeTe)_{97}[(In_2Te_3)_y(Bi_2Te_3)_{1-y}]_3$ (mol %) wherein "y" were 0.1, 0.2, 0.3, 0.4, 0.5, 0.6, 0.7 and 0.8 respectively. Further, for comparison, a medium 200 having a recording layer 204 consisting of a material not containing "M" (that is, $M_2Te_3$) and a medium 200 having a recording layer 204 consisting of a material not containing Bi (that is, $Bi_2Te_3$) were prepared (medium Nos. 200-A and 200-B). The recording/reproduction evaluation and the reliability evaluation were carried out at 1× speed, 2× speed, and 4× speed. A production method and evaluation methods are described in the following.

Firstly, the production method of the information recording medium 200 is described. As a substrate 208, a polycarbonate substrate (having a diameter of 120 mm and a thickness of 1.1 mm) wherein a guide groove (with a depth of 20 nm and a distance between a groove and a groove of 0.32 μm) was prepared and attached inside a sputtering device as shown in FIG. 5.

A reflective layer 207 was formed as a layer of Ag—Pd—Cu having a thickness of 80 nm on a surface of the substrate 208 where the guide groove was formed, by a sputtering method. A second dielectric layer 206 was formed as a layer consisting of $(ZrO_2)_{25}(SiO_2)_{25}(Ga_2O_3)_{50}$ (mol %) having a thickness of 20 nm, by a sputtering method. In this example, a recording layer 204 was stacked into a thickness of 11 nm on a surface of the second dielectric layer 206 by a sputtering method without forming a second interface layer 205. The recording layer 204 was formed adjusting the composition of a sputtering target so that the recording layers of the respective mediums have different ratios of $In_2Te_3$ (that is, "y" in the formula). Next, a first information layer 203 was formed as a layer of $(ZrO_2)_{25}(SiO_2)_{25}(Cr_2O_3)_{50}$ (mol %) having a thickness of 5 nm, and a first dielectric layer 202 was formed as a layer of $(ZnS)_{80}(SiO_2)_{20}$ (mol %) having a thickness of 60 nm. The mediums of No. 200-A and 200-B were produced so that the recording layers 204 were formed from $(GeTe)_{97}(Bi_2Te_3)_3$(mol %) and $(GeTe)_{97}(In_2Te_3)_3$(mol %), respectively.

The sputtering conditions employed for forming each layer is described. The sputtering conditions of the reflective layer 207 were the same as those of the reflective layer 108 in Example 1. The second dielectric layer 206 was formed by sputtering a sputtering target of $(ZrO_2)_{25}(SiO_2)_{25}(Ga_2O_3)_{50}$ having a diameter of 100 mm and a thickness of 6 mm at a pressure of 0.13 Pa under an Ar gas atmosphere, using a high frequency electric power supply with a power of 500 W.

The recording layer 204 was formed by sputtering a sputtering target containing Ge, Te, Bi and In having a diameter of 100 mm and a thickness of 6 mm at a pressure of 0.13 Pa under an Ar gas atmosphere, using a direct current electric power supply with a power of 100 W.

The sputtering conditions of the first interface layer 203 were the same as those of the first and the second interface layers 103 and 105 in Example 1. The sputtering conditions of the second dielectric layer 206 were the same as those of the first and the second dielectric layers 102 and 106.

The substrate 208 was picked out from the sputtering device, on which substrate the reflective layer 207, the second dielectric layer 206, the recording layer 204, the first interface layer 203 and the first dielectric layer 202 were formed in this order. Next, an acrylic resin which was an ultraviolet-curing resin was applied to a surface of the first dielectric layer 202 by a spin coat method. A disc-shaped sheet of an acrylic resin having a thickness of 90 μm was adhered to a surface of the applied resin, and then ultraviolet rays were applied from the sheet side to cure the resin, whereby a cover layer 201 was formed. The total of the thickness of the cover layer 201 was 100 μm by applying the ultraviolet-curing resin into a thickness of 10 μm by a spin coat method.

After completing the cover layer forming process, an initialization process was conducted. In the initialization process, a semiconductor laser with a wavelength of 810 nm was used and the recording layer 204 in a substantially whole annular area ranging from a radius 22 mm to a radius 60 mm of the information recording medium 200 was crystallized. In this manner, the initialization process was completed, and thereby the production of the information recording mediums 200 of Nos. 200-1 to 200-8 was finished. In all of the mediums, the specular reflectivities Rc and Ra were about 18% and about 3%, respectively.

Next, the recording/reproduction evaluation methods are described. A recording and reproduction apparatus having a constitution as shown in FIG. 6 which had a spindle motor for rotating the information recording medium 200, an optical head equipped with a semiconductor laser emitting a laser beam 209, and an objective lens for focusing the laser beam 209 on the recoding layer 204 of the information recording medium 200, was employed. In the evaluation of the information recording medium 200, a semiconductor laser having a wavelength of 405 nm and an objective lens having a numerical aperture of 0.85 were used, information which was equivalent to a capacity of 25 GB was recorded. Information was recorded while the number of revolutions of the information recording medium 200 were changed so that the linear velocities became 1× speed (4.92 m/sec, a data transfer rate: 36 Mbps), 2× speed (9.84 m/sec, 72 Mbps) and 4× speed (19.68 m/sec, 144 Mbps). The reproduction evaluation of the recorded signals was conducted by applying a 0.35 mW laser beam at 1× speed. The reproduction evaluation may be carried out at a linear velocity higher than 1× speed and the reproduction power may be larger than 0.35 mW. Jitter values were measured using a time interval analyzer for determining a jitter-average value (an average of a jitter between front ends and a jitter between rear ends). The jitter value in this example means a limit-equalized jitter value (LEQ value).

In order to determine a measurement condition for determining the jitter value, a peak power (Pp) and a bias power (Pb) were determined according to the following procedures. The information recording medium 200 was irradiated with the laser beam 209 while modulating its power between a high power-level peak power (mW) and a low power-level bias power (mW) to record random signals having mark lengths within a range of 2T (mark length 0.149 μm) to 8T (mark length 0.596 μm) ten times on the same groove surface of the recording layer 204. The jitter-average value was determined after recording.

The jitter-average was measured under each recording condition with the bias power being fixed while the peak power was varied, and the peak power at which the jitter-average value became a minimum value was determined as Pp1. Next, a jitter-average value was measured on each recording condition with the peak power being fixed at Pp1 while the bias power was varied, and the bias power at which the jitter-average value became a minimum value was determined as Pb. The bias power was fixed again at Pb and a jitter-average value was measured on each recording condition while the peak power was varied. The peak power at which the jitter-average value became a minimum value was determined as Pp. For example, Pp was 5 mW at 36 Mbps, 5.5 mW at 72 Mbps and 7.4 mW at 144 Mbps for the medium of No. 200-3, which values achieved system balance sufficiently. Further, the LEQ jitter values for the medium of No. 200-3 was 5.7% at 36 Mbps, 5.9% at 72 Mbps, and 7.5% at 144 Mbps, which achieved system balance sufficiently.

Next, a method for determining the erase ratio is described. A single signal of 2T and a single signal of 9T were alternately recorded 10 times in total, while modulating the power between the above-described Pp and Pb. A signal of 2T was recorded as the eleventh signal and the amplitude of the 2T signal (unit: dBm) was measured using a spectrum analyzer. Next, a signal of 9T was recorded as the twelfth signal and a decrement of the 2T signal was measured. This measured decrement was defined as the erase ratio (unit: dB). As the decrement is increased, the crystallization speed of the recording layer is higher. The value of the erase ratio is preferably equal to or greater than 25 dB.

Next, the reliability evaluation is described. The reliability evaluation was conducted for inspecting whether a recorded signal can be preserved even if it was placed under a high-temperature condition, and whether overwriting can be made after leaving the medium under a high-temperature condition. The evaluation was carried out using the recording and reproduction apparatus similar to one as described above. Specific evaluation procedures are as follows. First, random signals were multiple-track recorded on groove of each of the eight kinds of information recording mediums 200 at 1× speed, 2× speed and 4× speed while modulating the power between the above-described Pp and pb, and a jitter "j" (%) was determined. These mediums were left in a thermostatic chamber with a temperature of 80° C. and a relative humidity of 20% for 100 hours and then they were taken out. After taking out the mediums, the recorded signals were reproduced and a jitter value "ja" (%) was determined (evaluation of archival characteristic). Further, signals were overwritten once on the recorded signals while modulating the power between Pp and Pb and a jitter "jo" (%) was determined (evaluation of archival overwrite characteristic). The jitter value before leaving the medium in the thermostatic chamber was compared with the jitter value after leaving the medium in the thermostatic chamber, whereby the reliability was evaluated. As Δja and Δjo are larger wherein Δja=(ja−j)(%) and Δjo=(jo−j) (%), the reliability is lower. The archival characteristic (Δja) tends to be low for a signal recorded at a low times speed, and the archival overwrite characteristic (Δjo) tends to be low for a signal recorded at a high times speed. As both of Δja and Δjo are lower, the medium is more conveniently used in a wider range of linear velocities.

Table 3 show the erase ratio and the evaluation results for Δja and Δjo at 1× speed, 2× speed and 4× speed as to each of the eight kinds of information recording mediums and the information recording medium of comparative example. In the table, the meanings of "S", "C" and "A" are respectively as follows:

Erase ratio:
S equal to or greater than 30 dB;
A not less than 25 dB and less than 30 dB;
B not less than 20 dB and less than 25 dB; and
C less than 20 dB.
Δja and Δjo:
S less than 2%;
A not less than 2% and less than 3%;
B not less than 3% and less than 5%; and
C equal to or greater than 5%.

In any of evaluations, "C" means that it is difficult to use the medium at that linear velocity, and "B" to "S" mean that it is possible to use the medium at that linear velocity. "B" means "preferable" (good), "A" means "more preferable" (very good), and "S" means "still more preferable" (excellent).

mediums were at a sufficient level for an image file and at a practicable level for a datafile.

It was confirmed that the medium having the recording layer containing a material expressed with the formula (3) wherein M=In and x=97 and 0<y≦0.8 could be used in a range of linear velocities wherein the highest linear velocity is 2.4 times or more the lowest linear velocity. In other words, an excellent information recording medium with which high-speed CAV recording may be conducted under the Blu-ray Disc specification is obtained by using such a material.

Example 6

In Example 6, information recording mediums (medium Nos. 200-11 to 200-18) were produced and evaluated in the same manner as in Example 5 except that the recording layers 204 were formed as layers each of which consisted substantially of a material expressed with $(GeTe)_{97}[(Ga_2Te_3)_y(Bi_2Te_3)_{1-y}]_3$ (mol %). As a result, it was found that a favorable medium with which high-speed CAV recording was able to be conducted could be obtained by forming the recording layer from a material expressed with the formula (3) wherein M=Ga and x=97 and 0<y≦0.8, similarly to Example 5.

Example 7

In Example 7, information recording mediums (medium Nos. 200-21 to 200-28) were produced and evaluated in the same manner as in Example 5 except that the recording layers 204 were formed as layers each of which consisted substan-

TABLE 3

| Medium | | Erase ratio | | | Δja | | | Δjo | | |
|---|---|---|---|---|---|---|---|---|---|---|
| No. | Composition of recording layer (mol %) | 1× | 2× | 4× | 1× | 2× | 4× | 1× | 2× | 4× |
| 200-1 | $(GeTe)_{97}[(In_2Te_3)_{0.1}(Bi_2Te_3)_{0.9}]_3$ | S | S | S | B | B | B | S | S | S |
| 200-2 | $(GeTe)_{97}[(In_2Te_3)_{0.2}(Bi_2Te_3)_{0.8}]_3$ | S | S | S | B | B | A | S | S | S |
| 200-3 | $(GeTe)_{97}[(In_2Te_3)_{0.3}(Bi_2Te_3)_{0.7}]_3$ | S | S | A | B | A | A | S | S | A |
| 200-4 | $(GeTe)_{97}[(In_2Te_3)_{0.4}(Bi_2Te_3)_{0.6}]_3$ | S | A | A | A | A | A | S | A | A |
| 200-5 | $(GeTe)_{97}[(In_2Te_3)_{0.5}(Bi_2Te_3)_{0.5}]_3$ | A | A | A | A | A | S | A | A | A |
| 200-6 | $(GeTe)_{97}[(In_2Te_3)_{0.6}(Bi_2Te_3)_{0.4}]_3$ | A | A | B | A | S | S | A | A | B |
| 200-7 | $(GeTe)_{97}[(In_2Te_3)_{0.7}(Bi_2Te_3)_{0.3}]_3$ | A | B | B | S | S | S | A | B | B |
| 200-8 | $(GeTe)_{97}[(In_2Te_3)_{0.8}(Bi_2Te_3)_{0.2}]_3$ | B | B | B | S | S | S | B | B | B |
| 200-A | $(GeTe)_{97}(In_2Te_3)_3$ | C | C | C | — | — | — | — | — | — |
| 200-B | $(GeTe)_{97}(Bi_2Te_3)_3$ | S | S | S | C | C | C | S | S | S |

As shown in Table 3, the mediums of Nos. 200-1 to 200-8 was able to be used at a speed between 1× and 4×, since these mediums achieved "B" or better evaluation at any speed. On the other hand, Δja was "C" at a speed of from 1× speed to 4× speed for the medium of No. 200-B. It was found that the recording layer of this medium had a very high crystallization speed and the medium could not be used at a speed equal to or slower than 4× speed under the Blu-ray Disc specification. On the other hand, the erase ratio was "C" at a speed of from 1× speed to 4× speed for the medium of No. 200-A. In other words, it was found that the recording layer of this medium had a low crystallization speed and the medium could not be used at a speed equal to or higher than 1× speed under the Blu-ray Disc specification.

Overwrite cycle-ability was evaluated up to 10,000 cycles at a usable speed for the mediums of Nos. 200-1 to 200-8. As a result, a phase separation due to addition of $In_2Te_3$ did not occur. Furthermore, the jitter value between front ends and the jitter value between rear ends were 9% or less. These tially of $(GeTe)_{97}[(Al_2Te_3)_y(Bi_2Te_3)_{1-y}]_3$ (mol %). As a result, it was found that a favorable medium with which high-speed CAV recording was able to be conducted could be obtained by forming the recording layer from a material expressed with the formula (3) wherein M=Al and x=97 and 0<y≦0.8, similarly to Example 5.

Example 8

In Example 8, an information recording medium 300 of Blu-ray format having two information layers as shown in FIG. 3 was produced, and recording/reproduction evaluation and reliability evaluation were made. In this example, a first recording layer 304 substantially consisted of a material expressed with $(GeTe)_x[(In_2Te_3)_y(Bi_2Te_3)_{1-y}]_{100-x}$ (mol %) or $[(SnTe)_z(GeTe)_{1-z}]_x[(In_2Te_3)_y(Bi_2Te_3)_{1-y}]_{100-x}$ (mol %), and a second recording layer 311 substantially consisted of a material expressed with $(GeTe)_x[(In_2Te_3)_y(Bi_2Te_3)_{1-y}]_{100-x}$ (mol %). For comparison, a medium wherein the first recording layer 304 substantially consisted of a material expressed with (GeTe)$_{97}$(In$_2$Te$_3$)$_3$(mol %), and the second recording layer substantially consisted of a material substantially not containing "M" (that is, M$_2$Te$_3$) (medium No. 300-A). The recording/reproduction evaluation and the reliability evaluation were carried out at 1× speed, 2× speed and 4× speed similarly to Example 5. A production method and evaluation methods are described in the following.

Firstly, the production method of the information recording medium 300 is described. As a substrate 315, a substrate whose material and shape were the same as those of the substrate 208 in Example 5 was prepared and attached inside a sputtering device as shown in FIG. 5.

A second reflective layer 314 was formed as a layer of Ag—Pd—Cu having a thickness of 80 nm on a surface of the substrate 315 where the guide groove was formed, by a sputtering method. A fifth dielectric layer 313 was formed as a layer of (ZrO$_2$)$_{25}$(SiO$_2$)$_{25}$(Ga$_2$O$_3$)$_{50}$ (mol %) having a thickness of 17 nm by a sputtering method and a second recording layer 311 was stacked into a thickness of 11 nm by a sputtering method without forming the third interface layer 312. In the mediums of No. 300-1 to 300-3, the second recording layer 311 was formed as a layer consisting substantially of a material expressed with (GeTe)$_{97}$[(In$_2$Te$_3$)$_{0.3}$(Bi$_2$Te$_3$)$_{0.7}$]$_3$ (mol %). In the medium of No. 300-A which was a comparative example, the second recording layer 311 was formed as a layer consisting substantially of a material expressed with (GeTe)$_{97}$(Bi$_2$Te$_3$)$_3$ (mol %). Next, a second interface layer 310 was formed on the second recording layer 311 by a sputtering method as a layer consisting of (ZrO$_2$)$_{25}$(SiO$_2$)$_{25}$(Cr$_2$O$_3$)$_{50}$ (mol %) having a thickness of 5 nm. A fourth dielectric layer 309 was formed by a sputtering method as a layer consisting of (ZnS)$_{80}$(SiO$_2$)$_{20}$ (mol %) having a thickness of 60 nm. By these process, a second information layer 316 was formed.

Next, an intermediate layer 308 with a guide groove was formed into a thickness of 25 μm on a surface of the dielectric layer 309. A third dielectric layer 307 was formed by a sputtering method as a layer of TiO$_2$ having a thickness of 20 nm on a surface of the intermediate layer 308 where the guide groove was formed. A first reflective layer 306 was formed as a layer consisting of Ag—Pd—Cu having a thickness of 10 nm. A second dielectric layer 305 was formed by a sputtering method as a layer consisting of (ZrO$_2$)$_{25}$(SiO$_2$)$_{25}$(Ga$_2$O$_3$)$_{50}$ (mol %) having a thickness of 10 nm. A first recording layer 304 was formed into a thickness of 6 nm by a sputtering method.

The first recording layer 304 consisted substantially of a material expressed with (GeTe)$_{97}$[(In$_2$Te$_3$)$_{0.3}$(Bi$_2$Te$_3$)$_{0.7}$]$_3$ (mol %) in the medium of NO. 300-1; a material expressed with [(SnTe)$_{0.1}$(GeTe)$_{0.9}$]$_{97}$[(In$_2$Te$_3$)$_{0.5}$(Bi$_2$Te$_3$)$_{0.5}$]$_3$(mol %) in the medium of No. 300-2; a material expressed with [(SnTe)$_{0.3}$(GeTe)$_{0.7}$]$_{97}$[(In$_2$Te$_3$)$_{0.9}$(Bi$_2$Te$_3$)$_{0.1}$]$_3$(mol %) in the medium of No. 300-3. In the medium of No. 300-A as a comparative example, the first recording layer 304 consisted substantially of a material expressed with (GeTe)$_{97}$(In$_2$Te$_3$)$_3$ (mol %).

Next, a first interface layer 303 was formed as a layer consisting of (ZrO$_2$)$_{25}$(SiO$_2$)$_{25}$(Cr$_2$O$_3$)$_{50}$ (mol %) having a thickness of 5 nm on the first recording layer 304 and a first dielectric layer 302 was formed as a layer consisting of (ZnS)$_{80}$(SiO$_2$)$_{20}$(mol %) having a thickness of 40 nm. By these processes, a first information layer 317 was formed.

The sputtering and forming conditions of each layer is described. The sputtering conditions of the second reflective layer 314 were the same as those of the reflective layer 108 in Example 1. The sputtering conditions of the fifth dielectric layer 313 were the same as those of the second dielectric layer 206 in Example 5. The second recording layer 311 was formed by sputtering a sputtering target containing Ge, Te, Bi and In of a diameter of 100 mm and a thickness of 6 mm at a pressure of 0.13 Pa under an Ar gas atmosphere, using a direct current electric power supply with a power of 100 W.

The sputtering conditions of the second interface layer 310 were the same as those of the first and the second interface layers 103 and 105 in Example 1. The sputtering conditions of the second dielectric layer 309 were the same as those of the first dielectric layer 102 and the second dielectric layer 106 in Example 1.

The substrate 315 on which the second information layer 316 was formed in this manner was taken out from the sputtering device.

Next, the intermediate layer 308 was formed by the following procedures. Firstly, an acrylic resin which was an ultraviolet-curing resin was applied to a surface of the dielectric layer 309. Next, a polycarbonate substrate having on its surface concavities and convexities (a depth 20 nm, a distance between grooves 0.32 μm) which were complementary to a guide groove to be formed in the intermediate layer was placed and stuck on the applied ultraviolet-curing resin with the concavo-convex surface in contact with the resin. Then, ultraviolet rays were applied to cure the resin followed by removal of the polycarbonate substrate having concavities and convexities. Thereby, the intermediate layer 308 of the cured resin was formed, wherein the guide groove similar in shape to that in the substrate 315 was formed in the surface.

Next, the substrate 315 on which the layers up to the intermediate layer 308 was formed was placed again in the sputtering device and a first information layer 317 was formed on a surface of the intermediate layer 308.

Firstly, a third dielectric layer 307 was formed on the intermediate layer 308. The third dielectric layer 307 was formed by sputtering a TiO$_2$ sputtering target having a diameter of 100 mm and a thickness of 6 mm at a pressure of 0.13 Pa under a mixed gas atmosphere containing an Ar gas and 3% oxygen gas using a high frequency electric power supply with a power of 400 W. Next, the first reflective layer 306 was formed under the same conditions as those of the second reflective layer 314. The sputtering conditions of the second dielectric layer 305 were the same as those of the fifth dielectric layer 313. The first recording layer 304 was formed by sputtering a sputtering target containing Ge, Te, In and Bi of a diameter of 100 mm and a thickness of 6 mm at a pressure of 0.13 Pa under an Ar gas atmosphere, using a direct current electric power supply with a power of 50 W. Or the first recording layer 304 was formed by sputtering a sputtering target containing Ge, Sn, Te, In and Bi of a diameter of 100 mm and a thickness of 6 mm at a pressure of 0.13 Pa under an Ar gas atmosphere, using a direct current electric power supply with a power of 50 W. Here, since the thickness of the first recording layer 304 was small, the power during the formation thereof was reduced in order to ensure the film thickness accuracy. The sputtering conditions of the first interface layer 303 were the same as those of the first and the second interface layers 103 and 105 in Example 1. The sputtering conditions of the first dielectric layer 302 were the same as those of the first dielectric layer 102 and the second dielectric layer 106 in Example 1.

The substrate 315 with the first information layer formed on the intermediate layer 308 was taken out from the sputtering device.

Next, an ultraviolet-curing resin was applied to a surface of the first dielectric layer 302 by a spin coat method. A disc-shaped sheet was adhered to a surface of the applied ultraviolet-curing resin and ultraviolet rays were applied to the sheet side to cure the resin, and thereby the cover layer 301 was formed. The thickness of the ultraviolet-curing resin was 10 µm, the thickness of the sheet was 65 µm, and therefore the total thickness of the cover layer 301 was 75 µm.

After finishing the process for forming the cover layer, an initialization process was carried out. In the initialization process, a semiconductor laser with a wavelength of 810 nm was used and the second recording layer 311 was firstly initialized and then the first recording layer 304 was initialized. In any of the recording layers, a substantially whole annular area ranging from a radius 22 mm to a radius 60 mm was crystallized. Thereby, the initialization process was completed and the production of the mediums of Nos. 300-1 to 300-3 and 300-A was completed. In all of the mediums, the specular reflectivities Rc and Ra for both of the first information recording layer 317 and the second information layer 316 were about 6% and about 1%, respectively. It should be noted that the reflectivity of the second information layer 316 was measured with a laser beam which passed through the first information layer 317. Further, the light transmittances Tc and Ta of the first information layer 317 were about 51% and about 52%, respectively. The measurement of light transmittance of each information layer was conducted forming each information layer directly on the substrate 315.

Next, the recording/reproduction evaluation method is described. A recording and reproduction apparatus having a constitution as shown in FIG. 6 was used in order to record information on the information recording medium 300, similarly to Example 5. In the evaluation of the information recording medium 300, a laser beam 318 having a wavelength of 405 nm and an objective lens having a numerical aperture of 0.85 were used, and information equivalent to a capacity of 25 GB was recorded on each of the first and the second information layers 317 and 316. Information was recorded on the information recording medium 300 at 1× speed, 2× speed and 4× speed similarly to Example 5. The reproduction evaluation of the recorded signals was conducted by applying a 0.7 mW laser beam at 1× speed. The reproduction evaluation may be carried out at a linear velocity higher than 1× speed and the reproduction power may be larger than 0.7 mW. The LEQ jitter value was determined by a time interval analyzer.

A peak power (Pp) and a bias power (Pb) were determined according to the same procedures as those in Example 5, in order to establish conditions for determining the jitter value. For the medium of No. 300-1, Pp of both of the first information layer 317 and the second information layer 316 was about 10 mW at 1× speed (36 Mbps), about 11 mW at 2× speed (72 Mbps), and about 14 mW at 4× speed (144 Mbps) and these values achieved system balance sufficiently. Further, for the medium of No. 300-1, the LEQ values obtained at 1× speed (36 Mbps) were 7% for the first information layer 317 and 5.7% for the second information layer, and the values at 2× speed (72 Mbps) were 7.5% for the first information layer, and 6% for the second information layer, and the values at 4× speed (144 Mbps) were 8% for the first information layer, and 6.5% for the second information layer, and these values achieved system balance sufficiently.

The determinations of erase ratio and the reliability evaluation were carried out in the same manner as in Example 5.

The erase ratios and the evaluation results of $\Delta$ja and $\Delta$jo at 1×, 2× and 4× speeds are shown in Table 4, with respect to three kinds of information recording mediums and the information recording medium for comparison. The meanings of "S", "C" and "A" in the table are as described in connection with Example 5. The indication "–", however, means that the erase ratio was poor and Pp and Pb could not be determined, and the archival characteristic and the archival overwrite characteristic could not be evaluated.

TABLE 4

| Medium No. | Information layer | Composition of second recording layer (mol %) Composition of first recording layer (mol %) | Erase ratio | | | $\Delta$ja | | | $\Delta$jo | | |
|---|---|---|---|---|---|---|---|---|---|---|---|
| | | | 1× | 2× | 4× | 1× | 2× | 4× | 1× | 2× | 4× |
| 300-1 | Second | $(GeTe)_{97}[(In_2Te_3)_{0.3}(Bi_2Te_3)_{0.7}]_3$ | S | S | A | A | A | S | S | A | A |
| | First | $(GeTe)_{97}[(In_2Te_3)_{0.3}(Bi_2Te_3)_{0.7}]_3$ | S | S | A | A | A | S | S | A | A |
| 300-2 | Second | $(GeTe)_{97}[(In_2Te_3)_{0.3}(Bi_2Te_3)_{0.7}]_3$ | S | S | A | A | A | S | S | A | A |
| | First | $[(SnTe)_{0.1}(GeTe)_{0.9}]_{97}[(In_2Te_3)_{0.5}(Bi_2Te_3)_{0.5}]_3$ | S | S | A | A | A | S | S | A | A |
| 300-3 | Second | $(GeTe)_{97}[(In_2Te_3)_{0.3}(Bi_2Te_3)_{0.7}]_3$ | S | S | A | A | A | S | S | A | A |
| | First | $[(SnTe)_{0.3}(GeTe)_{0.7}]_{97}[(In_2Te_3)_{0.9}(Bi_2Te_3)_{0.1}]_3$ | S | S | A | A | A | S | S | A | A |
| 300-A | Second | $(GeTe)_{97}(Bi_2Te_3)_3$ | S | S | S | C | C | C | S | S | S |
| | First | $(GeTe)_{97}(In_2Te_3)_3$ | C | C | C | — | — | — | — | — | — |

As shown in Table 4, the mediums of Nos. 300-1 to 300-3 can be used at least at a speed between 1× and 4×, since these mediums achieved "S" or "A" evaluation at any speed. The erase ratio, $\Delta$ja and $\Delta$jo for the mediums of Nos. 300-2 and 300-3 wherein the first recording layer 304 contained Sn were made substantially the same as those of the medium of No. 300-1 by adjusting the values of "z" and "y" in the formula (4). From these results, it was found that "z" is preferably equal to or less than 0.3, and "y" is preferably equal to or less than 0.9 when "z" is within this range.

On the contrary, the erase ratios at 1× to 4× speeds of the first information layer were "C" and $\Delta$ja at 1× to 4× speeds of the second information layer were "C", for the medium of No. 300-A (comparative example). This is because the crystallization speed of $(GeTe)_{97}(In_2Te_3)_3$ (mol %) constituting the first recording layer is insufficient and the crystallization speed of $(GeTe)_{97}(Bi_2Te_3)_3$ (mol %) constituting the second recording layer was too high.

Overwrite cycle-ability was evaluated up to 10,000 cycles for the mediums of Nos. 300-1 to 300-3. As a result, a phase separation due to addition of $In_2Te_3$ did not occur. Furthermore, the jitter value between front ends and the jitter value between rear ends were 9% or less. These mediums were at a sufficient level for an image file and at a practicable level for a datafile.

It was confirmed that the information recording medium 300 having two information layers wherein the recording layers were formed from a material expressed with the formula (3) or (4) could be used in a wide range of linear velocities wherein the highest linear velocity is 2.4 times or more the lowest linear velocity. In other words, the present invention gives an excellent information recording medium with which high-speed CAV recording may be conducted under the two-layer Blu-ray Disc specification.

Example 9

In Example 9, three kinds of mediums (medium Nos. 300-4, 5 and 6) were produced using a material containing Ga instead of In as "M", and the recording/reproduction evaluation and the reliability evaluation were carried out in the same manner as in Example 8. In the medium of No. 300-4, the first recording layer 304 and the second recording layer 311 both were formed as a layer consisting substantially of a material expressed with $(GeTe)_{97}[(Ga_2Te_3)_{0.3}(Bi_2Te_3)_{0.7}]_3$ (mol %). In the medium of No. 300-5, the first recording layer 304 was formed as a layer consisting substantially of a material expressed with $[(SnTe)_{0.1}(GeTe)_{0.9}]_{97}[(Ga_2Te_3)_{0.5}(Bi_2Te_3)_{0.5}]_3$ (mol %) and the second recording layer 311 was formed as a layer consisting substantially of a material expressed with $(GeTe)_{97}[(Ga_2Te_3)_{0.3}(Bi_2Te_3)_{0.7}]_3$ (mol %). In the medium of No. 300-6, the first recording layer 304 was formed as a layer consisting substantially of a material expressed with $[(SnTe)_{0.3}(GeTe)_{0.7}]_{97}[(Ga_2Te_3)_{0.9}(Bi_2Te_3)_{0.1}]_3$ (mol %) and the second recording layer 311 was formed as a layer substantially consisting of $(GeTe)_{97}[(Ga_2Te_3)_{0.3}(Bi_2Te_3)_{0.7}]_3$ (mol %).

As a result, it was found that when Ga was used as "M", it was possible to obtain an excellent information recording medium of two-layer Blu-ray Disc form with which CAV recording may be conducted in a range of linear velocities wherein the highest linear velocity is 2.4 times or more the lowest linear velocity, similarly to Example 8.

Example 10

In Example 10, three kinds of mediums (medium Nos. 300-7, 8 and 9) were produced using a material containing Al instead of In as "M", and the recording/reproduction evaluation and the reliability evaluation were carried out in the same manner as in Example 8. In the medium of No. 300-7, the first recording layer 304 and the second recording layer 311 both were formed as a layer consisting substantially of a material expressed with $(GeTe)_{97}[(Al_2Te_3)_{0.3}(Bi_2Te_3)_{0.7}]_3$ (mol %). In the medium of No. 300-8, the first recording layer 304 was formed as a layer consisting substantially of a material expressed with $[(SnTe)_{0.1}(GeTe)_{0.9}]_{97}[(Al_2Te_3)_{0.5}(Bi_2Te_3)_{0.5}]_3$ (mol %) and the second recording layer 311 was formed as a layer consisting substantially of $(GeTe)_{97}[(Al_2Te_3)_{0.3}(Bi_2Te_3)_{0.7}]_3$ (mol %). In the medium of No. 300-9, the first recording layer 304 was formed as a layer consisting substantially of $[(SnTe)_{0.3}(GeTe)_{0.7}]_{97}[(Al_2Te_3)_{0.9}(Bi_2Te_3)_{0.1}]_3$ (mol %) and the second recording layer 311 was formed as a layer consisting substantially of $(GeTe)_{97}[(Al_2Te_3)_{0.3}(Bi_2Te_3)_{0.7}]_3$ (mol %).

As a result, it was found that when Al was used as "M", it was possible to obtain an excellent information recording medium of two-layer Blu-ray Disc form with which CAV recording may be conducted in a wide range of linear velocities wherein the highest linear velocity is 2.4 times or more the lowest linear velocity, similarly to Example 8.

Example 11

In Example 11, a medium of Blu-ray Disc format was produced and subjected to test, in essentially the same manner as in Example 5. Specifically, the information recording medium 200 shown in FIG. 2 was produced, and the recording and reproduction evaluation and the reliability evaluation were conducted. In this example, five kinds of information recording mediums having different compositions of the recording layer 204 (medium No. 200-31 to 200-35). Specifically, the recording layers 204 in these mediums consisted substantially of materials expressed with $(GeTe)_x[(In_2Te_3)_{0.3}(Bi_2Te_3)_{0.7}]_{100-x}$ (mol %), wherein x were 85, 88, 91, 94 and 98, respectively. Further, for comparison, a medium 200 having a recording layer 204 consisting of a material not containing "M" (that is, $M_2Te_3$) and a medium 200 having a recording layer 204 consisting of a material not containing Bi (that is, $Bi_2Te_3$) were prepared (medium Nos. 200-C and 200-D). The recording/reproduction evaluation and the reliability evaluation were carried out at 1× speed, 2× speed, and 4× speed. The production method and the evaluation method are described in the following.

Firstly, the production method of the information recording medium 200 is described. The substrate 208 similar to that used in Example 5 was prepared and attached inside a sputtering device as shown in FIG. 5. A reflective layer 207 was formed as a layer of Ag—Pd—Cu having a thickness of 80 nm on a surface of the substrate 208 where the guide groove was formed, by a sputtering method. Next, a second dielectric layer 206 consisting of $(ZrO_2)_{25}(SiO_2)_{25}(In_2O_3)_{50}$ (mol %) was formed into a thickness of 20 nm by a sputtering method. Also in this example, the recording layer 204 was stacked into a thickness of 11 nm on a surface of the second dielectric layer 206 by a sputtering method without forming the second interface layer 205. The recording layer 204 was formed adjusting the composition of a sputtering target so that the recording layers of the respective mediums have different ratios of GeTe (that is, "x" in the formula). The first interface layer 203 and the first dielectric layer 202 were formed into the same thicknesses of those layers of the medium produced in Example 5, using the same material as those used in Example 5. The mediums of No. 200-C and 200-D were produced so that the recording layers 204 were formed from materials expressed with $(GeTe)_{93}(Bi_2Te_3)_7$ (mol %) and $(GeTe)_{93}(In_2Te_3)_7$ (mol %), respectively.

The sputtering conditions employed for forming each layer are described. The reflective layer 207 was formed by sputtering a sputtering target of Ag—Ga—Cu of a diameter of 100 mm and a thickness of 6 mm at a pressure of 0.4 Pa under an Ar gas atmosphere, using a direct current electric power supply with a power of 200 W. The second dielectric layer 206 was formed by sputtering a sputtering target of $(ZrO_2)_{25}(SiO_2)_{25}(In_2O_3)_{50}$ having a diameter of 100 mm and a thickness of 6 mm at a pressure of 0.13 Pa under an Ar gas atmosphere, using a high frequency electric power supply with a power of 500 W. The recording layer 204 was formed by sputtering a sputtering target containing Ge, Te, Bi and In having a diameter of 100 mm and a thickness of 6 mm at a pressure of 0.13 Pa under an Ar gas atmosphere, using a direct current electric power supply with a power of 100 W. The sputtering conditions of the first interface layer 203 and the first dielectric layer 202 were the same as those in Example 5.

The substrate 208 was taken out from the sputtering device, on which substrate the reflective layer 207, the second dielectric layer 206, the recording layer 204, the first interface layer 203 and the first dielectric layer 202 were formed in this order. Next, an acrylic resin which was an ultraviolet-curing resin was applied to a surface of the first dielectric layer 202 by a spin coat method, and then ultraviolet rays were applied from the resin side to cure the resin, whereby a cover layer 201 having a thickness of 97 μm was formed. Further, an acrylic resin which was an ultraviolet-curing resin was applied to the surface of the cover layer 201 by a spin coat method and then ultraviolet rays were applied from the resin side to cure the resin, whereby a hard-coat layer having a thickness of 3 μm was formed. The hard-coat layer served to protect the medium from damage and against fingerprint. In this example, the cover layer 201 and the hard-coat layer were formed to have a thickness of 100 μm in total. The cover layer forming process was completed in this manner.

After finishing the cover layer forming process, the initialization process was conducted under the same conditions as those in Example 5. In this manner, the initialization process was completed, and thereby the production of information recording mediums 200 of Nos. 200-31 to 200-35 and 200-C and 200-D was finished. In all of the mediums, the specular reflectivities Rc and Ra were about 18% and about 3%, respectively.

The recording/reproduction evaluation method, the method for determining the erase ratio and the reliability evaluation method were the same as those in Example 5. For the medium of No. 200-33, Pp was 5.1 mW at 1× speed (36 Mbps), 5.5 mW at 2× speed (72 Mbps), and 7.5 mW at 4× speed (144 Mbps), and these values achieved system balance sufficiently. Further, the LEQ jitters were 5.6% at 1× speed, 5.8% at 2× speed (72 Mbps) and 6.5% at 4× speed (144 Mbps) and these values achieved system balance sufficiently.

The erase ratios and the evaluation results Δja and Δjo at 1×, 2×, and 4× speeds are shown in Table 5, with respect to five kinds of information recording mediums and the two information recording mediums for comparison. The meaning of "S", "C" and "A" are as described in connection with Example 5.

TABLE 5

| Medium No. | Composition of recording layer (mol %) | Erase ratio | | | Δja | | | Δjo | | |
|---|---|---|---|---|---|---|---|---|---|---|
| | | 1× | 2× | 4× | 1× | 2× | 4× | 1× | 2× | 4× |
| 200-31 | $(GeTe)_{85}[(In_2Te_3)_{0.3}(Bi_2Te_3)_{0.7}]_{15}$ | S | S | S | B | B | B | S | S | S |
| 200-32 | $(GeTe)_{88}[(In_2Te_3)_{0.3}(Bi_2Te_3)_{0.7}]_{12}$ | S | S | A | B | B | A | S | S | A |
| 200-33 | $(GeTe)_{91}[(In_2Te_3)_{0.3}(Bi_2Te_3)_{0.7}]_{9}$ | A | A | A | A | A | A | A | A | A |
| 200-34 | $(GeTe)_{94}[(In_2Te_3)_{0.3}(Bi_2Te_3)_{0.7}]_{6}$ | A | A | A | A | A | A | A | A | A |
| 200-35 | $(GeTe)_{98}[(In_2Te_3)_{0.3}(Bi_2Te_3)_{0.7}]_{2}$ | A | A | B | A | A | S | A | A | B |
| 200-C | $(GeTe)_{93}(In_2Te_3)_7$ | C | C | C | — | — | — | — | — | — |
| 200-D | $(GeTe)_{93}(Bi_2Te_3)_7$ | S | S | S | C | C | C | S | S | S |

As shown in Table 5, the mediums of Nos. 200-31 to 200-35 can be used at a speed between 1× and 4×, since these mediums achieved "B" or better evaluation at any speed. As described above, it was confirmed that even when the materials for the reflective layer 207 and the dielectric layer 206 were changed, the medium having the recording layer 204 formed from a material expressed with $(GeTe)_x[(In_2Te_3)_y(Bi_2Te_3)_{1-y}]_{100-x}$ (mol %) wherein $85 \leq x \leq 98$ could be used in a wide range of linear velocities wherein the highest linear velocity is 2.4 times or more the lowest linear velocity.

Further, overwrite cycle-ability was evaluated up to 10,000 cycles for the mediums of Nos. 200-31 to 200-35. As a result, a phase separation due to addition of $In_2Te_3$ did not occur in the mediums Nos. 200-31 to 200-35. Furthermore, the jitter value between front ends and the jitter value between rear ends were 9% or less. These mediums were at a sufficient level for an image file and at a practicable level for a datafile.

Example 12

In Example 12, five kinds of mediums (medium Nos. 200-41 to 200-45) were produced, which had the recording layers 204 consisting substantially of materials expressed with $(GeTe)_x[(Ga_2Te_3)_{0.3}(Bi_2Te_3)_{0.7}]_{100-x}$ (mol %) which contained Ga instead of In as "M", and the evaluations were carried out in the same manner as in Example 11. As a result, it was confirmed that when the recording layer was formed from a material expressed with the above-mentioned formula (3) wherein "M" was Ga and $85 \leq x \leq 98$, it was possible to obtain a favorable medium with which CAV recording may be conducted, similarly to Example 11.

Example 13

In Example 13, five kinds of mediums (medium Nos. 200-51 to 200-55) were produced, which had the recording layers 204 consisting substantially of materials expressed with $(GeTe)_x[(Al_2Te_3)_{0.3}(Bi_2Te_3)_{0.7}]_{100-x}$ (mol %) which contained Al instead of In as "M", and the evaluations were carried out in the same manner as in Example 11. As a result, it was confirmed that when the recording layer was formed from a material expressed with the above-mentioned formula (3) wherein "M was Al and $85 \leq x \leq 98$, it was possible to obtain a favorable medium with which CAV recording may be conducted, similarly to Example 11.

Example 14

In Example 14, an information recording medium of Blu-ray Disc form was produced and subjected to test in substantially the same manner as in Example 8. Specifically, three kinds of information recording mediums 300 having two information layers as shown in FIG. 3 were produced (medium Nos. 300-11 to 300-13), and recording/reproduction evaluation and reliability evaluation were made. In this example, the first recording layer 304 was formed as a layer consisting substantially of a material expressed with $(GeTe)_x[(In_2Te_3)_y(Bi_2Te_3)_{1-y}]_{100-x}$ (mol %) or $[(SnTe)_z(GeTe)_{1-z}]_x[(In_2Te_3)_y(Bi_2Te_3)_{1-y}]_{100-x}$ (mol %), and the second recording layer 311 was formed as a layer consisting of a material expressed with $(GeTe)_x[(In_2Te_3)_y(Bi_2Te_3)_{1-y}]_{100-x}$ (mol %). Further, for comparison, a medium 300 was prepared wherein the first recording layer 304 was formed as a layer consisting of a material expressed with $(GeTe)_{93}(Bi_2Te_3)_7$ (mol %) and the second recording layer 311 was formed as a layer consisting of a material expressed with $(GeTe)_{93}(In_2Te_3)_7$ (mol %) (medium No. 300-B). The recording/reproduction evaluation and the reliability evaluation were carried out at 1×, 2×, and 4× similarly to Example 8. A production method and evaluation methods are described in the following.

Firstly, the production method of the information recording medium 300 is described. The substrate 315 similar to that employed in Example 8 was prepared and attached inside the sputtering device. The reflective layer 314 was formed as a layer of Ag—Ga—Cu having a thickness of 80 nm by sputtering on a surface of the substrate 315 where a guide groove was formed. Next, the fifth dielectric layer 313 was formed as a layer of $(ZrO_2)_{25}(SiO_2)_{25}(In_2O_3)_{50}$ (mol %) having a thickness of 17 nm by a sputtering method. Also in this example, the second recording layer 311 was formed into a thickness of 11 nm on the fifth dielectric layer 313 without forming the third interface layer 312. The second recording layer 311 consisting substantially of $(GeTe)_{93}[(In_2Te_3)_{0.5}(Bi_2Te_3)_{0.5}]_7$ (mol %) was formed. In the medium of No. 300-B as a comparative example, the second recording layer 311 was formed as a layer consisting of a material expressed with $(GeTe)_{93}(In_2Te_3)_7$ (mol %). The second interface layer 310 and the fourth dielectric layer 309 were formed into the same thicknesses of those in the medium produced in Example 8, using the same materials as those used in Example 8. By these processes, a second information layer 316 was formed.

Next, the intermediate layer 308 with a guide groove was formed into a thickness of 25 μm on a surface of the fourth dielectric layer 309. The third dielectric layer 307 was formed by a sputtering method as a layer of $TiO_2$ having a thickness of 20 nm on a surface of the intermediate layer 308 where the guide groove was formed. The first reflective layer 306 was formed by a sputtering method as a layer consisting of Ag—Ga—Cu having a thickness of 10 nm. The second dielectric layer 305 was formed by sputtering as a layer consisting of $(ZrO_2)_{25}(SiO_2)_{25}(In_2O_3)_{50}$ (mol %) having a thickness of 10 nm. The first recording layer 304 was formed into a thickness of 6 nm.

The first recording layer 304 consisted substantially of a material expressed with $(GeTe)_{93}[(In_2Te_3)_{0.5}(Bi_2Te_3)_{0.5}]_7$ (mol %) in the medium of No. 300-11; a material expressed with $[(SnTe)_{0.1}(GeTe)_{0.9}]_{93}[(In_2Te_3)_{0.5}(Bi_2Te_3)_{0.5}]_7$ (mol %) in the medium of No. 300-12; a material expressed with $[(SnTe)_{0.3}(GeTe)_{0.7}]_{93}[(In_2Te_3)_{0.9}(Bi_2Te_3)_{0.1}]_7$ (mol %) in the medium of No. 300-13. In the medium of No. 300-B as a comparative example, the first recording layer 304 consisted substantially of a material expressed with $(GeTe)_{93}(Bi_2Te_3)_7$ (mol %).

Next, the first interface layer 303 was formed as a layer of $(ZrO_2)_{25}(SiO_2)_{25}(Cr_2O_3)_{50}$ (mol %) having a thickness of 5 nm on the first recording layer 304 and the first dielectric layer 302 was formed as a layer consisting of $(ZnS)_{80}(SiO_2)_{20}$ (mol %) having a thickness of 40 nm, similarly to Example 8. By these processes, the first information layer 317 was formed.

The sputtering and forming conditions of each layer are described. The sputtering conditions of the second reflective layer 314 were the same as those of the reflective layer 207 in Example 11. The sputtering conditions of the fifth dielectric layer 313 were the same as those of the second dielectric layer 206 in Example 11. The sputtering conditions of the second recording layer 311 were the same as those of the second recording layer 311 in Example 8. The sputtering conditions of the second interface layer 310 were the same as those of the first and the second interface layers 103 and 105 in Example 1. The sputtering conditions of the second dielectric layer 309 were the same as those of the first dielectric layer 102 and the second dielectric layer 106 in Example 1.

The substrate 315 on which the second information layer 316 was formed in this manner was taken out from the sputtering device.

Next, the intermediate layer 308 was formed according to the same procedures as those employed in Example 8. The substrate 315 on which the layers up to the intermediate layer 308 was formed was placed again in the sputtering device and a first information layer 317 was formed on a surface of the intermediate layer 308.

Firstly, the third dielectric layer 307 was formed on the intermediate layer 308. The sputtering conditions of the third dielectric layer 307 were the same as those of the third dielectric layer 307 in Example 8. Next, the second reflective layer 306 was formed under the same sputtering conditions as those of the second reflective layer 207 in Example 11. The sputtering conditions of the second dielectric layer 305 were the same as those of the fifth dielectric layer 313 in this example. The first recording layer 304 was formed under the same sputtering conditions as those of the recording layer 304 in Example 8. The first interface layer 303 was formed under the same sputtering conditions as those of the first and the second interface layers 103 and 105 in Example 1. The first dielectric layer 302 was formed under the same sputtering conditions as those of the first dielectric layer 102 and the second dielectric layer 106 in Example 1.

The substrate 315 with the first information layer on the intermediate layer 308 was taken out from the sputtering device. Next, an acrylic resin which was an ultraviolet-curing resin was applied to a surface of the first dielectric layer 302 by a spin coat method, and then ultraviolet rays were applied from the resin side to cure the resin, whereby a cover layer 301 having a thickness of 72 μm was formed. Further, an acrylic resin which was an ultraviolet-curing resin was applied to a surface of the cover layer 301 by a spin coat method and then ultraviolet rays were applied from the resin side to cure the resin, whereby a hard-coat layer having a thickness of 3 μm was formed. In this example, the cover layer 301 and the hard-coat layer were formed to have a thickness of 75 μm in total. The cover layer forming process was completed in this manner.

After finishing the cover layer forming process, the initialization process was conducted under the same conditions as those in Example 8. The initialization process was completed, and thereby the production of the information recording mediums 300 of Nos. 300-11 to 300-13 and 300-B was completed. In all of the mediums, the specular reflectivities Rc and Ra for both of the first information layer 317 and the second information layer 316 were about 6% and about 1%, respectively. It should be noted that the reflectivity of the second information layer 316 was measured with a laser beam which passed through the first information layer 317 similarly to Example 8. Further, the light transmittances Tc and Ta of the first information layer 317 were about 51% and about 52%, respectively. The measurement of light transmittance of each information layer was conducted forming each information layer directly on the substrate 315, similarly to Example 8.

The recording/reproduction evaluation method, the method for determining the erase ratio and the reliability evaluation method were the same as those in Example 8. For the medium of No. 300-11, Pp of both of the first information layer 317 and the second information layer 316 was about 10 mW at 1× speed (36 Mbps), about 11 mW at 2× speed (72 Mbps), and about 14 mW at 4× speed (144 Mbps) and these values achieved system balance sufficiently. Further, the LEQ jitters at 1× speed (36 Mbps) were 7.1% for the first information layer 317 and 5.8% for the second information layer, and the LEQ jitters at 2× speed (72 Mbps) were 7.4% for the first information layer, and 5.9% for the second information layer, and the LEQ jitters at 4× speed (144 Mbps) were 8.0% for the first information layer, and 6.5% for the second information layer, and these values achieved system balance sufficiently.

The erase ratios and the evaluation results of Δja and Δjo at 1×, 2×, 4× speeds are shown in Table 6, with respect to three kinds of information recording mediums and the information recording medium for comparison. The meanings of "S", "C"

and "A" in the table are as described in connection with Example 5. The indication "–", however, means that the erase ratio was poor and Pp and Pb could not be determined, and the archival characteristic and the archival overwrite characteristic could not be evaluated.

layer 304 was formed as a layer consisting substantially of a material expressed with $[(SnTe)_{0.3}(GeTe)_{0.7}]_{93}$ $[(Ga_2Te_3)_{0.9}(Bi_2Te_3)_{0.1}]_7$ (mol %) and the second recording layer 311 was formed as a layer consisting substantially of a material expressed with $(GeTe)_{93}[(Ga_2Te_3)_{0.5}(Bi_2Te_3)_{0.5}]_7$ (mol %).

TABLE 6

| Medium No. | Information layer | Composition of the second recording layer (mol %) Composition of the first recording layer (mol %) | Erase ratio | | | Δja | | | Δjo | | |
|---|---|---|---|---|---|---|---|---|---|---|---|
| | | | 1× | 2× | 4× | 1× | 2× | 4× | 1× | 2× | 4× |
| 300-11 | Second | $(GeTe)_{93}[(In_2Te_3)_{0.5}(Bi_2Te_3)_{0.5}]_7$ | S | S | A | A | A | S | S | A | A |
| | First | $(GeTe)_{93}[(In_2Te_3)_{0.5}(Bi_2Te_3)_{0.5}]_7$ | S | S | A | A | A | S | S | A | A |
| 300-12 | Second | $(GeTe)_{93}[(In_2Te_3)_{0.5}(Bi_2Te_3)_{0.5}]_7$ | S | S | A | A | A | S | S | A | A |
| | First | $[(SnTe)_{0.1}(GeTe)_{0.9}]_{93}[(In_2Te_3)_{0.5}(Bi_2Te_3)_{0.5}]_7$ | S | S | A | A | A | S | S | A | A |
| 300-13 | Second | $(GeTe)_{93}[(In_2Te_3)_{0.5}(Bi_2Te_3)_{0.5}]_7$ | S | S | A | A | A | S | S | A | A |
| | First | $[(SnTe)_{0.3}(GeTe)_{0.7}]_{93}[(In_2Te_3)_{0.9}(Bi_2Te_3)_{0.1}]_7$ | S | S | S | A | A | S | S | A | A |
| 300-B | Second | $(GeTe)_{93}(In_2Te_3)_7$ | C | C | C | — | — | — | — | — | — |
| | First | $(GeTe)_{93}(Bi_2Te_3)_7$ | S | S | S | C | C | C | S | S | S |

As shown in Table 6, the mediums of Nos. 300-11 to 300-13 can be used at least at a speed between 1× and 4×, since these mediums achieved "S" or "A" at any speed. The erase ratio, Δja and Δjo for the mediums of Nos. 300-12 and 300-13 wherein the first recording layer 304 contained Sn were made substantially the same as those of the medium of No. 300-11 by adjusting the values of "z" and "y" in the formula (4). From these results, it was found that "z" is preferably equal to or less than 0.3, and "y" is preferably equal to or less than 0.9 when "z" is within this range. On the contrary, the evaluations of the medium of No. 300-B were "C" at any speed similarly to the medium of No. 300-A, and the medium was not practical.

Overwrite cycle-ability was evaluated up to 10,000 cycles for the mediums of Nos. 300-11 to 300-13. As a result, a phase separation due to addition of $In_2Te_3$ did not occur. Furthermore, the jitter value between front ends and the jitter value between rear ends were 9% or less. These mediums were at a sufficient level for an image file and at a practicable level for a datafile.

From this, it was confirmed that when the materials for the second reflective layer 314, the first reflective layer 306, the fifth dielectric layer 313 and the second dielectric layer 305 were changed, the medium wherein the recording layers were formed from a material expressed with the formula (3) or (4) could be used at least at a speed between 1× and 4×.

Example 15

In Example 15, three kinds of mediums (medium Nos. 300-14, 15 and 16) were produced using a material containing Ga instead of In as "M", and the recording/reproduction evaluation and the reliability evaluation were carried out in the same manner as in Example 14. In the medium of No. 300-14, the first recording layer 304 and the second recording layer 311 both were formed as a layer consisting substantially of a material expressed with $(GeTe)_{93}[(Ga_2Te_3)_{0.5}(Bi_2Te_3)_{0.5}]_7$ (mol %). In the medium of No. 300-15, the first recording layer 304 was formed as a layer consisting substantially of a material expressed with $[(SnTe)_{0.1}(GeTe)_{0.9}]_{93}[(Ga_2Te_3)_{0.5}(Bi_2Te_3)_{0.5}]_7$ (mol %) and the second recording layer 311 was formed as a layer consisting substantially of a material expressed with $(GeTe)_{93}[(Ga_2Te_3)_{0.5}(Bi_2Te_3)_{0.5}]_7$ (mol %). In the medium of No. 300-16, the first recording layer 304 was formed as a layer consisting substantially of a material expressed with $[(SnTe)_{0.3}(GeTe)_{0.7}]_{93}[(Ga_2Te_3)_{0.9}(Bi_2Te_3)_{0.1}]_7$ (mol %) and the second recording layer 311 was formed as a layer consisting substantially of a material expressed with $(GeTe)_{93}[(Ga_2Te_3)_{0.5}(Bi_2Te_3)_{0.5}]_7$ (mol %).

As a result, it was found that when Ga was used as "M", it was possible to obtain an excellent information recording medium of two-layer Blu-ray Disc form with which CAV recording may be conducted in a range of linear velocities wherein the highest linear velocity is 2.4 times or more the lowest linear velocity, similarly to Example 14.

Example 16

In Example 16, three kinds of mediums (medium Nos. 300-17, 18 and 19) were produced using a material containing Al instead of In as "M", and the recording/reproduction evaluation and the reliability evaluation were carried out in the same manner as in Example 14. In the medium of No. 300-17, the first recording layer 304 and the second recording layer 311 both were formed as a layer consisting substantially of a material expressed with $(GeTe)_{93}[(Al_2Te_3)_{0.5}(Bi_2Te_3)_{0.5}]_7$ (mol %). In the medium of No. 300-18, the first recording layer 304 was formed as a layer consisting substantially of a material expressed with $[(SnTe)_{0.1}(GeTe)_{0.9}]_{93}[(Al_2Te_3)_{0.5}(Bi_2Te_3)_{0.5}]_7$ (mol %) and the second recording layer 311 was formed as a layer consisting substantially of a material expressed with $(GeTe)_{93}[(Al_2Te_3)_{0.5}(Bi_2Te_3)_{0.5}]_7$ (mol %). In the medium of No. 300-19, the first recording layer 304 was formed as a layer consisting substantially of a material expressed with $[(SnTe)_{0.3}(GeTe)_{0.7}]_{93}[(Al_2Te_3)_{0.9}(Bi_2Te_3)_{0.1}]_7$ (mol %) and the second recording layer 311 was formed as a layer consisting substantially of a material expressed with $(GeTe)_{93}[(Al_2Te_3)_{0.5}(Bi_2Te_3)_{0.5}]_7$ (mol %).

As a result, it was found that when Al was used as "M", it was possible to obtain an excellent information recording medium of two-layer Blu-ray Disc form with which CAV recording may be conducted in a range of linear velocities wherein the highest linear velocity is 2.4 times or more the lowest linear velocity, similarly to Example 14.

Example 17

In Example 17, a recording film which was judged as being formed from a material expressed with $Ge_{40.0}Bi_{5.6}Te_{52.0}In_{2.4}$ (atomic %) by the ICP emission spectrometry which was reduced to $(GeTe)_{91}[(In_2Te_3)_{0.3}(Bi_2Te_3)_{0.7}]_9$ (mol %) by calculation was analyzed by an X-ray microanalysis. The analysis method according to the ICP emission spectrometry was described above in connection with Example 1. The composition analysis by the X-ray microanalysis was carried out using JXA8900R manufactured by JEOL. Ltd.

Specifically, a film was formed under the same conditions as those employed for forming a film which was judged as having a composition of $Ge_{40.2}Bi_{5.5}Te_{52.0}In_{2.3}$ (atomic %) with respect to Ge, Bi, Te and In by the ICP emission spectrometry, and the composition of the film was analyzed by the X-ray microanalysis. As a result, this film was judged as having a composition of $Ge_{40.4}Bi_{5.5}Te_{51.9}In_{2.2}$ (atomic %) with respect to these four elements. There is not substantial difference between the results obtained by two analysis methods, and it was found that any of these methods may be employed as the method for analyzing the composition of the recording layer of the information recording medium of the present invention.

Here, the ICP emission spectrometry and the X-ray microanalysis were employed for elemental quantitative analysis. There are other analysis methods such as Auger electron spectroscopy and secondary ion mass spectroscopy. The similar quantitative analysis may be made by any of these methods.

Example 18

In Example 18, the same measurement as that in Example 17 was made with respect to a film which was judged, by the ICP emission spectrometry, as being formed from a material expressed with $Ge_{32.4}Sn_{13.9}Bi_{1.5}Te_{50.7}Al_{1.5}$ (atomic % which was reduced to $[(SnTe)_{0.3}(GeTe)_{0.7}]_{97}[(Al_2Te_3)_{0.5}(Bi_2Te_3)_{0.5}]_3$ (mol %). Specifically, a film was formed under the same conditions as those employed for forming a film which was judged as having a composition of $Ge_{32.6}Sn_{14.0}Bi_{1.4}Te_{50.6}Al_{1.4}$ (atomic %) with respect to Ge, Sn, Bi, Te and Al by the ICP emission spectrometry, and the composition of the film was analyzed by the X-ray microanalysis. As a result, this film was judged as having a composition of $Ge_{32.4}Sn_{13.8}Bi_{1.5}Te_{50.8}Al_{1.5}$ (atomic %) with respect to these five elements. Therefore, it was found that any of the ICP emission spectrometry and the X-ray microanalysis may also be employed as the method for analyzing the composition of the recording layer containing Sn.

Example 19

In Example 19, an information recording medium 100-2(2) which was substantially the same as the information recording medium 100-2 was produced, and the composition analysis of the recording layer 104 was made. The recording layer 104 was formed using a sputtering target for forming a film consisting of a material expressed with $(GeTe)_{89}[(Ga_2Te_3)_{0.1}(Bi_2Te_3)_{0.9}]_{11}$ (mol %) which was reduced to $Ge_{38.2}Bi_{8.5}Te_{52.4}Ga_{0.9}$ (atomic %), and the film thickness was 7 nm. The sample for composition analysis was prepared according to the following procedures. A test piece was prepared by processing the information recording medium 100-2(2) by means of by focused ion beam (FIB) milling to slice a section. Next, the test piece was observed by a transmission electron microscope, while elements detected by applying an electron beam to the section were analyzed. The analysis was conducted using 4000EX manufactured by JEOL. Ltd. as the transmission electron microscope and HF-2200 manufactured by Hitachi, Ltd. for elemental analysis. As a result, the elemental composition obtained as to the portion of the recording layer was $Ge_{38}Bi_9Te_{52}Ga_1$ (atomic %). From this result, it was found that the composition analysis of the recording layer may be carried out by the method wherein the recording layer is analyzed using the transmission electron microscope after the information recording medium has been fabricated. As a method for analyzing the composition of a recording layer in an information recording medium, there is a method wherein a blade of a cutter is inserted into an end section of the information recording medium to peel off a substrate 101 and a dummy substrate 110 to expose the recording layer 104 or another layer followed by measurement by Auger electron spectroscopy or secondary ion mass spectroscopy. When this method is used and the recording layer is not exposed, the composition of the recording layer may be determined from elemental composition of a depth range corresponding to the recording layer by measuring the change of elemental composition along a depth direction from a surface sequentially.

Example 20

In FIG. 4, an information recording medium on which information was recorded by electric means and a system for recording information on the medium are shown. In Example 20, an experiment was conducted wherein information was recorded, by applying an electric energy, on the information recording medium 400 shown in FIG. 4 in which medium the recording layer according to the present invention was used. The information recording medium 400 is what is called a memory.

The information recording medium 400 of this example was produced as follows. Firstly, a Si substrate 401 having a length of 5 mm, a width of 5 mm, and a thickness of 1 mm of which surface was subjected to a nitriding treatment was prepared. On this substrate 401, a lower electrode 402 of Au with a thickness of 0.1 μm was formed in an area of 1 mm×1 mm. On the lower electrode 402, a recording layer 403 consisting substantially of a material expressed with $(GeTe)_{89}[(In_2Te_3)_{0.1}(Bi_2Te_3)_{0.9}]_{11}$ (mol %) with a thickness of 0.1 μm was formed in an area of 1 mm×1 mm, and a upper electrode 404 of Au with a thickness of 0.1 μm was formed in an area of 0.6 mm×0.6 mm.

Each of the lower electrode 402, the recording layer 403 and the upper electrode 404 was formed by a sputtering method. These sputterings were carried out attaching the substrate 401 to the film-forming device. Firstly, the lower electrode 402 was formed by DC sputtering with a power of 200 W, using an Au sputtering target (a diameter 100 mm, a thickness 6 mm), under an Ar gas atmosphere at a pressure of 0.13 Pa. Next, the recording layer 403 was formed on the lower electrode 402 by DC sputtering with a power of 100 W using a sputtering target containing Ge, In, Bi and Te (a diameter 100 mm, a thickness 6 mm) under an Ar gas atmosphere at a pressure of 0.13 Pa. Next, the upper electrode 404 was formed by DC sputtering with a power of 200 W using an Au sputtering target (a diameter 100 mm, a thickness 6 mm) under an Ar gas atmosphere at a pressure of 0.13 Pa.

It was confirmed that reversible phase change occurred in the recording layer 403 by applying an electric energy to the information recording medium 400 thus produced, using the system shown in FIG. 4. As shown in FIG. 4, two parts 409 for application were bonded to the lower electrode 402 and the upper electrode 404 respectively with a lead wire of Au. Thus, an electrically recording/reproducing device 411 was connected to the information recording medium (memory) 400 through these application parts 409. Between the application parts 409 which were respectively connected to the lower electrode 402 and the upper electrode 404 in the electrically recording/reproducing device 411, a pulse producing part 405 was connected through a switch 408, and a resistance measuring device 406 was also connected through a switch 407. The resistance measuring device 406 was connected to a judgment part 410 which judged whether a resistance value measured by the resistance measuring device 406 was high or low. A current pulse was flowed between the upper electrode 404 and the lower electrode 402 via the application parts 409 by means of the pulse producing part 405, while a resistance value between the lower electrode 402 and the upper electrode 404 was measured by the resistance measuring device 406. Thus, the judgment part 410 judged whether the measured resistance value was high or low. Such resistance value changes because of the phase change of the recording layer 403.

In the case of this example, the melting point of the recording layer 403 was 600° C., the crystallization temperature thereof was 180° C., and the crystallization time thereof was 50 ns. The resistance value between the lower electrode 402 and the upper electrode 404 was 1000Ω when the recording layer 403 was in the state of amorphous phase, and was 20Ω when it was in the state of crystalline phase. A current pulse of 20 mA and 60 ns was applied between the lower electrodes 402 and the upper electrode 404 when the recording layer 403 was in the state of amorphous phase (i.e. in the level of high resistance). As a result, the resistance value between the lower electrode 402 and the upper electrode 404 dropped and the recording layer 403 changed into the crystalline phase from the amorphous phase. Further, a current pulse of 200 mA and 20 ns was applied between the lower electrode 402 and the upper electrode 404 when the recording layer 403 was in the state of crystalline phase (i.e. in the level of low resistance). As a result, the resistance value between the lower electrode 402 and the upper electrode 404 rose and the recording layer 403 changed into the amorphous phase from the crystalline phase. That is, it was confirmed that a reversible phase change occurred. Further, a high-speed transfer in 100 ns or shorter time was able to be realized, whereby a high-speed memory was obtained.

From these results, it was found that the phase of the film consisting substantially of a material expressed with $(GeTe)_{89}[(In_2Te_3)_{0.1}(Bi_2Te_3)_{0.9}]_{11}$ (mol %) could be changed by applying electric energy. Therefore, it was confirmed that the information recording medium 400 having this film as the recording layer 403 had a function of realizing high-speed recording and erasing of information by application of electric energy.

In this example, the recording layer 403 was formed as a layer consisting substantially of $(GeTe)_{89}[(In_2Te_3)_{0.1}(Bi_2Te_3)_{0.9}]_{11}$ (mol %). It was confirmed that when a similar memory was fabricated by forming a layer of $(GeTe)_{89}[(Ga_2Te_3)_{0.1}(Bi_2Te_3)_{0.9}]_{11}$ (mol %) or $(GeTe)_{89}[(Al_2Te_3)_{0.1}(Bi_2Te_3)_{0.9}]_{11}$ (mol %) as the recording layer, a high-speed reversible phase change occurred similarly. Further, it is possible to increase a memory capacity and to improve accessing function and switching function by connecting a plurality of information recording mediums 400.

As demonstrated thereinbefore through various examples of information recording mediums of this invention, the present invention can be applied to any of an information recording medium on which information is recorded with an optical means and an information recording medium on which information is recorded with an electric means. In other words, it is possible to obtain an information recording medium having high erasability and excellent archival characteristic at a high linear velocity and in a wide range of linear velocities which medium has not been realized, by forming the recording layer from a Ge—Te—Bi-M-based material wherein $Me_2Te_3$ is added to GeTe—$Bi_2Te_3$-based material or a Ge—Sn—Te—Bi-M-based material wherein Sn—Te is further added to Ge—Te—Bi-M-based material.

INDUSTRIAL APPLICABILITY

The information recording medium of the present invention has a recording layer which shows excellent characteristics and is useful as a DVD-RAM disc, a DVD-RW disc, a DVD+RW disc, and an rewritable Blu-ray Disc as a large-capacity optical information recording medium. Further, the information recording medium of the present invention is useful as a electric high-speed switching device as an electrical information recording medium.

The invention claimed is:

1. An information recording medium comprising a recording layer which can generate a reversible phase change, wherein the recording layer comprises a Ge—Bi—Te-M-based material which comprises Ge, Bi, Te and an element "M" and is expressed with a following formula (1):

$$Ge_aBi_bTe_dM_{100-a-b-d} \text{(atomic \%)} \quad (1)$$

wherein "M" represents at least one element selected from the group consisting of Ga and In; and
wherein "a", "b" and "d" satisfy 25≦a≦60, 0<b≦18, 35≦d≦55, and 82≦a+b+d<100,
wherein the Ge—Bi—Te-M-based material is expressed with a following formula (3):

$$(GeTe)_x[(M_2Te_3)_y(Bi_2Te_3)_{1-y}]_{100-x} \text{(mol \%)} \quad (3)$$

wherein "M" represents at least one element selected from the group consisting of Ga and In; and
wherein "x" and "y" satisfy 80≦x<100 and 0<y≦0.9.

2. An information recording medium comprising a recording layer which can generate a reversible phase change, wherein the recording layer comprises a Ge—Sn—Bi—Te-M-based material which comprises Ge, Sn, Bi, Te and an element "M" and is expressed with a following formula (2):

$$Ge_aSn_fBi_bTe_dM_{100-a-b-d-f} \text{(atomic \%)} \quad (2)$$

wherein "M" represents at least one element selected from the group consisting of Ga and In; and
wherein "a", "b", "d" and "f" satisfy 25≦a≦60, 0<b≦18, 35≦d≦55, 0<f≦15, 82≦a+b+d<100, and 82<a+b+d+f<100,
wherein the Ge—Sn—Bi—Te-M-based material is expressed with a following formula (4):

$$[(SnTe)_z(GeTe)_{1-z}]_x[(M_2Te_3)_y(Bi_2Te_3)_{1-y}]_{100-x} \text{(mol \%)} \quad (4)$$

wherein "M" represents at least one element selected from the group consisting of Ga and In; and
wherein "x", "y" and "z" satisfy 80≦x<100, 0<y≦0.9 and 0<z≦0.3.

3. The information recording medium according to claim 1, wherein "x" and "y" satisfy 80≦x≦91 and y≦0.5 in the formula (3).

4. The information recording medium according to claim 1, wherein "x" and "y" satisfy 85≦x≦98 and y≦0.8 in the formula (3).

5. The information recording medium according to claim 2, wherein "x" satisfies 80≦x≦91 in the formula (4).

6. The information recording medium according to claim 2, wherein "x" satisfies 85≦x≦98 in the formula (4).

7. The information recording medium according to claim 1, which comprises two or more information layers, wherein at least one of the information layers has the recording layer comprising the Ge—Bi—Te-M-based material.

8. The information recording medium according to claim 2, which comprises two or more information layers, wherein at least one of the information layers has the recording layer comprising the Ge—Sn—Bi—Te-M-based material.

9. The information recording medium according to claim 1, which comprises at least a substrate, a first dielectric layer, the recording layer comprising the Ge—Bi—Te-M-based material, a second dielectric layer, an optical compensation layer and a reflective layer, wherein these layers are formed in this order on one surface of the substrate.

10. The information recording medium according to claim 2, which comprises at least a substrate, a first dielectric layer, the recording layer comprising the Ge—Sn—Bi—Te-M-based material, a second dielectric layer, an optical compensation layer and a reflective layer, wherein these layers are formed in this order on one surface of the substrate.

11. The information recording medium according to claim 1, which comprises at least a substrate, a reflective layer, a second dielectric layer, the recording layer comprising the Ge—Bi—Te-M-based material, and a first dielectric layer, wherein these layers are formed in this order on one surface of the substrate.

12. The information recording medium according to claim 2, which comprises at least a substrate, a reflective layer, a second dielectric layer, the recording layer comprising the Ge—Sn—Bi—Te-M-based material, and a first dielectric layer, wherein these layers are formed in this order on one surface of the substrate.

13. The information recording medium according to claim 9, wherein a film thickness of the first dielectric layer is not less than 100 nm and not greater than 180 nm, and a film thickness of the second dielectric layer is not less than 20 nm and not greater than 60 nm.

14. The information recording medium according to claim 10, wherein a film thickness of the first dielectric layer is not less than 100 nm and not greater than 180 nm, and a film thickness of the second dielectric layer is not less than 20 nm and not greater than 60 nm.

15. The information recording medium according to claim 11, wherein a film thickness of the first dielectric layer is not less than 10 nm and not greater than 100 nm, and a film thickness of the second dielectric layer is not less than 3 nm and not greater than 50 nm.

16. The information recording medium according to claim 12, wherein a film thickness of the first dielectric layer is not less than 10 nm and not greater than 100 nm, and a film thickness of the second dielectric layer is not less than 3 nm and not greater than 50 nm.

17. The information recording medium according to claim 9, on and from which information is recorded and reproduced with a laser beam having a wavelength of 650 nm to 670 nm.

18. The information recording medium according to claim 10, on and from which information is recorded and reproduced with a laser beam having a wavelength of 650 nm to 670 nm.

19. The information recording medium according to claim 11, on and from which information is recorded and reproduced with a laser beam having a wavelength of 650 nm to 670 nm.

20. The information recording medium according to claim 12, on and from which information is recorded and reproduced with a laser beam having a wavelength of 650 nm to 670 nm.

21. The information recording medium according to claim 9, on and from which information is recorded and reproduced with a laser beam having a wavelength of 395 nm to 415 nm.

22. The information recording medium according to claim 10, on and from which information is recorded and reproduced with a laser beam having a wavelength of 395 nm to 415 nm.

23. The information recording medium according to claim 11, on and from which information is recorded and reproduced with a laser beam having a wavelength of 395 nm to 415 nm.

24. The information recording medium according to claim 12, on and from which information is recorded and reproduced with a laser beam having a wavelength of 395 nm to 415 nm.

25. A method for producing an information recording medium, the method comprising:
   forming a recording layer by sputtering using a sputtering target containing Ge, Bi, Te, and an element "M", so as to form the recording layer comprising a Ge—Bi—Te-M-based material,
   wherein the Ge—Bi—Te-M-based material is expressed with a following formula (3):

$$(GeTe)_x[(M_2Te_3)_y(Bi_2Te_3)_{1-y}]_{100-x} \text{ (mol \%)} \quad (3)$$

wherein "M" represents at least one element selected from the group consisting of Ga and In; and
   wherein "x" and "y" satisfy $80 \leq x < 100$ and $0 < y \leq 0.9$.

26. The method for producing an information recording medium according to claim 25, wherein the sputtering target further comprises Sn and the sputtering is carried out so as to form the recording layer comprising a Ge—Sn—Bi—Te-M-based material,
   wherein the Ge—Sn—Bi—Te-M-based material is expressed with a following formula (4):

$$[(SnTe)_z(GeTe)_{1-z}]_x[(M_2Te_3)_y(Bi_2Te_3)_{1-y}]_{100-x} \text{ (mol \%)} \quad (4)$$

wherein "M" represents at least one element selected from the group consisting of Ga and In; and
   wherein "x", "y" and "z" satisfy $80 \leq x < 100$, $0 < y \leq 0.9$ and $0 < z \leq 0.3$.

27. A recording and reproduction apparatus for an information recording medium comprising a spindle motor which rotates the information recording medium having a recording layer, an optical head provided with a semiconductor laser which emits a laser beam, and an objective lens which focus the laser beam on the recording layer, wherein the recording layer comprises a Ge—Bi—Te-M-based material,
   wherein the Ge—Bi—Te-M-based material is expressed with a following formula (3):

$$(GeTe)_x[(M_2Te_3)_y(Bi_2Te_3)_{1-y}]_{100-x} \text{ (mol \%)} \quad (3)$$

wherein "M" represents at least one element selected from the group consisting of Ga and In; and
   wherein "x" and "y" satisfy $80 \leq x < 100$ and $0 < y \leq 0.9$.

28. The recording and reproduction apparatus for an information recording medium according to claim 27, wherein the recording layer comprises a Ge—Sn—Bi—Te-M-based material which further comprises Sn and is expressed with a following formula (4):

$$[(SnTe)_z(GeTe)_{1-z}]_x[(M_2Te_3)_y(Bi_2Te_3)_{1-y}]_{100-x} \text{ (mol \%)} \quad (4)$$

wherein "M" represents at least one element selected from the group consisting of Ga and In; and
   wherein "x", "y" and "z" satisfy $80 \leq x < 100$, $0 < y \leq 0.9$ and $0 < z \leq 0.3$.

29. The recording and reproduction apparatus for an information recording medium according to claim 27, wherein a wavelength of the laser beam is from 650 nm to 670 nm.

30. The recording and reproduction apparatus for an information recording medium according to claim 27, wherein a wavelength of the laser beam is from 395 nm to 415 nm.

* * * * *